United States Patent [19]

Saito et al.

[11] Patent Number: 5,439,533

[45] Date of Patent: Aug. 8, 1995

[54] PHOTOVOLTAIC DEVICE, METHOD OF PRODUCING THE SAME AND GENERATING SYSTEM USING THE SAME

[75] Inventors: Keishi Saito; Jinsho Matsuyama; Toshimitsu Kariya; Koichi Matsuda; Yuzo Koda; Naoto Okada, all of Nagahama, Japan

[73] Assignee: Canon Kabushiki Kaisha, Tokyo, Japan

[21] Appl. No.: 337,195

[22] Filed: Nov. 7, 1994

Related U.S. Application Data

[63] Continuation of Ser. No. 83,284, Jun. 29, 1993, abandoned.

[30] Foreign Application Priority Data

Jun. 30, 1992 [JP] Japan ................... 4-196048

[51] Int. Cl.⁶ .................. H01L 31/075; H01L 31/18
[52] U.S. Cl. ................... 136/258; 136/255; 136/293; 437/4; 437/108; 437/109; 257/458; 320/2; 320/5; 320/9
[58] Field of Search .............. 136/255, 258 AM, 293; 437/4, 108–109; 320/2, 5, 9; 257/458

[56] References Cited

U.S. PATENT DOCUMENTS

| | | | |
|---|---|---|---|
| 4,471,155 | 9/1984 | Mohr et al. | 136/258 |
| 4,782,376 | 11/1988 | Catalano | 136/258 |
| 4,816,082 | 3/1989 | Guha et al. | 136/249 |
| 5,002,617 | 3/1991 | Kanai et al. | 136/258 |
| 5,002,618 | 3/1991 | Kanai et al. | 136/258 |
| 5,006,180 | 4/1991 | Kanai et al. | 136/258 |
| 5,007,971 | 4/1991 | Kanai et al. | 136/258 |
| 5,204,272 | 4/1993 | Guha et al. | 437/4 |
| 5,252,142 | 10/1993 | Matsuyama et al. | 136/255 |
| 5,256,576 | 10/1993 | Guha et al. | 437/4 |
| 5,279,681 | 1/1994 | Matsuda et al. | 136/255 |

OTHER PUBLICATIONS

Bragagnolo et al., "Optimum Deposition Conditions for a-(Si, Ge): H Using a Triode-Configured RF Glow Discharge System," Nineteenth IEEE Photovoltaic Specialists Conference-1987, pp. 878-883 (1987).

Yoshida et al., "Efficiency Improvement in Amorphous-SiGe:H Solar Cells and Its Application to Tandem Type Solar Cells," Nineteenth IEEE Photovoltaic Specialists Conference-1987, pp. 1101-1106 (1987).

Hiroe et al., "Stability and Terrestrial Application of a-Si Tandem Type Solar Cells," Nineteenth IEEE Photovoltaic Specialists Conference-1987, pp. 1111-1116 (1987).

Guha et al., "A Novel Design for Amorphous Silicon Alloy Solar Cells," Twentieth IEEE Photovoltaic Specialists Conference-1988, pp. 79-84 (1988).

Sato et al., "Preparation of High Quality a-SiGe:H Films and Its Application to the High Efficiency Triple-Junction Amorphous Solar Cells," Twentieth IEEE Photovoltaic Specialists Conference-1988, pp. 73-78 (1988).

Pawlikiewicz et al., "Numerical Modeling of Multijunction Amorphous Silicon Based P-I-N Solar Cells," Twentieth IEEE Photovoltaic Specialists Conference-1988, pp. 251-255 (1988).

*Primary Examiner*—Aaron Weisstuch
*Attorney, Agent, or Firm*—Fitzpatrick, Cella, Harper & Scinto

[57] ABSTRACT

An object of the present invention is to provide a photovoltaic device and a method of producing the photovoltaic device which can prevent recombination of photoexcited carriers and which permits increases in the open circuit voltage and the carrier range. The photovoltaic device of the present invention has a laminate structure composed of at least a p-type layer of a silicon non-single crystal semiconductor, a photoactive layer having a plurality of i-type layers, and an n-type layer. The photoactive layer has a laminate structure composed of a first i-type layer deposited on the side of the n-type layer by a microwave plasma CVD process, and a second i-type layer deposited on the side of said the p-type layer by an RF plasma CVD process. The first i-type layer deposited by the microwave plasma CVD process contains at least silicon and carbon atoms, and has a minimum band gap between the center thereof and the p-type layer, and the second i-type layer deposited by the RF plasma CVD process contains at least silicon atoms and has a thickness of 30 nm or less.

44 Claims, 16 Drawing Sheets

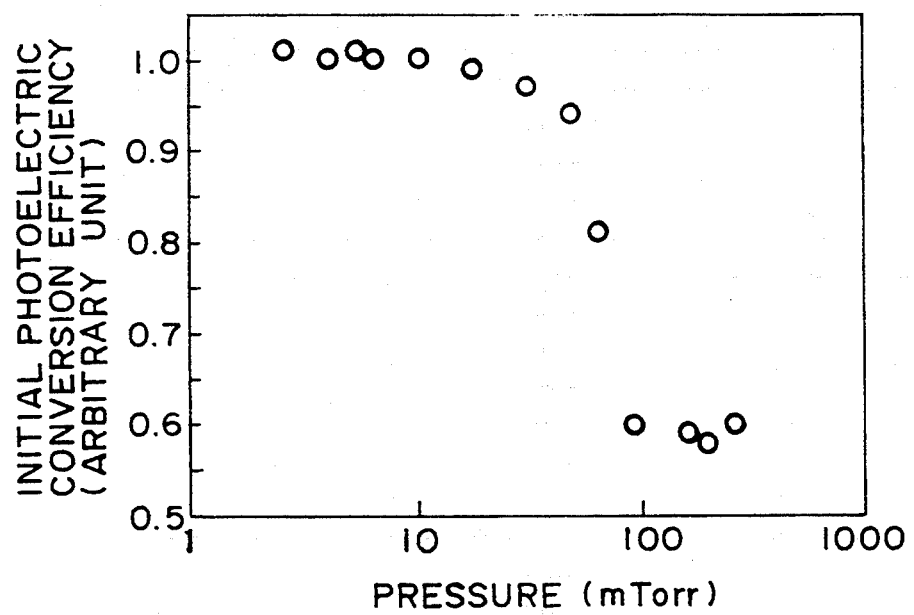
F I G. 11

PHOTOVOLTAIC DEVICE, METHOD OF PRODUCING THE SAME AND GENERATING SYSTEM USING THE SAME

This application is a continuation-in-part of application Ser. No. 08/083,284, filed Jun. 29, 1993, now abandoned.

BACKGROUND OF THE INVENTION

1. Field of the Invention

The present invention relates to a pin-type photovoltaic device comprising a silicon non-single crystal semiconductor material, a method of producing the devices, and a generating system using the same. Particularly, the present invention relates to a pin-type photovoltaic device in which the band gap in an i-type layer is changed, and a method of depositing the photovoltaic device by a microwave plasma CVD process. The present invention also relates to a generating system using the photovoltaic device.

2. Related Background Art

Conventional pin-structure photovoltaic devices each comprising a silicon non-single crystal semiconductor material include a photovoltaic device comprising, an i-layer which contains silicon atoms and carbon or germanium atoms, and in which the band gap is changed. Examples of proposals for such a photovoltaic device include the following:

(1) "Optimum deposition conditions for a-(Si,Ge):H using a triode-configurated rf glow discharge system", J. A. Bragangnolo, P. Littlefield, A. Mastrovito and G. Storti, Conf. Rec. 19th IEEE photovoltaic Specialists Conference, 1987, pp. 878–883;

(2) "Efficiency improvement in amorphous-SiGe:H solar cells and its application to tandem type solar cells", S. Yoshida, S. Yamanaka, M. Konagai and K. Takahashi, Conf. Rec. 19th IEEE Photovoltaic Specialists Conference, 1987, pp. 1101–1106;

(3) "Stability and terrestrial application of a-Si tandem type solar cells", A. Hiroe, H. Yamagishi, H. Nishio, M. Kondo, and Y. Tawada, Conf. Rec. 19th IEEE Photovoltaic Specialists Conference, 1987, pp. 1111–1116;

(4) "Preparation of high quality a-SiGe:H films and its application to the high efficiency triple-junction amorphous solar cells", K. Sato, K. Kawabata, S. Terazono, H. Sasaki, M. Deguchi, T. Itagaki, H. Morikawa, M. Aiga and K. Fujikawa, Conf. Rec. 20th IEEE Photovoltaic Specialists Conference, 1988, pp. 73–78;

(5) U.S. Pat. No. 4,816,082;

(6) U.S. Pat. No. 4,471,155; and (7) U.S. Pat. No. 4,782,376.

Examples of theoretical research on the characteristics of a photovoltaic device in which the band gap changes include the following:

(8) "A novel design for amorphous silicon alloy solar cells", S. Guha, J. Yang, A. Pawlikiewicz, T. Glatfelter, R. Ross, and S. R. Ovshinsky, Conf. Rec. 20th IEEE Photovoltaic Specialists Conference, 1988, pp. 79–84; and (9) "Numerical modeling of multijunction, amorphous silicon based P-I-N solar cells", A. H. Pawlikiewicz and S. Guha, Conf. Rec. 20th IEEE Photovoltaic Specialists Conference, 1988, pp. 251–255.

In such conventional photovoltaic devices of the prior art, a layer in which the band gap changes is inserted into the p/i and n/i interfaces in order to prevent the recombination of photo-excited carriers in the vicinity of each of the interfaces, and increase the open-circuit voltage and the hole carrier range.

With respect to a conventional photovoltaic device which contains silicon and carbon atoms and in which the band gap changes, it is necessary to improve the practical performance and reliability, and further prevent the recombination of photo-excited carriers. It is also necessary to increase the open-circuit voltage and the hole carrier range.

The conventional photovoltaic device also has the problem that the conversion efficiency deteriorates when weak light is applied thereto.

The conventional photovoltaic device further has the problem that since there is a strain in the i-type layer strained, the photoelectric conversion efficiency deteriorates when the layer is annealed under vibration or the like.

SUMMARY OF THE INVENTION

Accordingly, an object of the present invention is to provide a photovoltaic device which can solve the above problems. Particularly, an object of the present invention is to-provide a photovoltaic device in which the recombination of photo-excited carriers is prevented, and in which the open-circuit voltage and the hole carrier range are increased.

Another object of the present invention is to provide a photovoltaic device in which the conversion efficiency when weak light is applied thereto is improved.

A further object of the present invention is to provide a photovoltaic device which the photoelectric conversion efficiency is prevented from easily deteriorating by annealing under vibration for a long time.

A still further object of *the present invention is to provide a photovoltaic device in which the photoelectric conversion efficiency is prevented from easily changing with a temperature change.

A further object of the present invention is to provide a method of producing a photovoltaic device which permits the achievement of the above objects.

A further object of the present invention is to provide a generating system utilizing the photovoltaic device which permits the achievement of the above objects.

The inventors have performed investigations for solving the above problems of conventional devices and for achieving the above listed objects. As a result, it was found that a photovoltaic device which permits achievement of the above objects comprises a p-type semiconductor region, a high-resistance semiconductor region, and an n-type semiconductor region. In the photovoltaic device, the high-resistance semiconductor region contains silicon and carbon atoms on the side of the n-type semiconductor region, and has a first high-resistance region having a minimum energy band gap between the center thereof and the p-type region, and a second high-resistance semiconductor region containing silicon atoms and having a thickness of 30 nm or less. Alternatively, a photovoltaic device of the prevent invention comprises a laminate of at least a p-type layer of a silicon non-single crystal semiconductor, a photoconductive layer comprising a plurality of i-type layers, and an n-type layer. In the photovoltaic device, the photoconductive layer has a laminate structure comprising at least an i-type layer deposited on the side of the n-type layer by a microwave plasma CVD process, and an i-type layer deposited on side of the p-type layer by an RF plasma CVD process, the i-type layer deposited by the microwave plasma CVD process containing at least silicon and carbon atoms and having a minimum band gap at a position between the center thereof and the p-type layer, and an i-type layer deposited by the RF plasma CVD process containing at least silicon atoms and having a thickness of 30 nm or less.

In a preferred form of the photovoltaic device of the present invention, the i-type layer deposited by the microwave plasma CVD process has a maximum band gap at a position near at least one of the p-type layer and the n-type layer, and the region having a maximum band gap has a thickness of 30 nm or less.

In another preferred form of the photovoltaic device of the present invention, the i-type layer deposited by the microwave plasma CVD process and/or the i-type layer deposited by the RF plasma CVD process simultaneously contains a valence electron controlling agent serving as a donor and a valence electron controlling agent serving as an acceptor, and the valence electron controlling agent as the donor is an element in Group III in Periodic Table, and the valence electron controlling agent as the acceptor is an element in Group V in the Periodic Table.

In still another preferred form, the valence electron controlling agents are distributed in the i-type layer deposited by the microwave plasma CVD process and/or the i-type layer deposited by the RF plasma CVD process.

In a further preferred form, the hydrogen content of the i-type layer deposited by the microwave plasma CVD process changes in accordance with the content of silicon atoms.

In a still further preferred form, the i-type layer deposited by the microwave plasma CVD process and/or the i-type layer deposited by the RF plasma CVD process contains oxygen and/or nitrogen atoms.

In a further preferred form, at least one of the p-type layer and the n-type layer has a laminate structure comprising a layer consisting of, as a main component, an element in Group III in the Periodic Table and/or an element in Group V, and a layer consisting of a silicon atom as a main component and a valence electron controlling agent.

The present invention further provides a method of producing a photovoltaic device comprising a laminate of at least a p-type layer of a silicon non-single-crystal semiconductor, a photoconductive layer comprising a plurality of i-type layers, and an n-type layer. The method comprises depositing an i-type layer of the photoconductive layer on the n-type layer side by a microwave plasma CVD process in which microwave energy lower than that required for 100% decomposition of raw material gases containing at least silicon-containing gas and carbon-containing gas, and RF energy higher than the microwave energy are simultaneously applied to the raw material gases so that the minimum band gap is at a position between the center of the i-type layer and the p-type layer, and depositing an i-type layer of the photoconductive layer to a thickness of 30 nm or less on the side of the p-type layer by the RF plasma CVD process using a raw material gas containing at least silicon-containing gas at a deposition rate of 2 nm/sec or less.

In a preferred form of the method of producing a photovoltaic device of the present invention, the silicon-containing gas and carbon-containing gas are mixed at a distance of 5 m or less from a deposition chamber and used for deposition by the microwave plasma CVD process.

The present invention further provides a generating system comprising at least a photovoltaic device of the present invention, a storage battery for storing electric power supplied from the photovoltaic device and/or for supplying electric power to an external load, and a control system for monitoring the voltage and/or current of the photovoltaic device and controlling electric power supplied to the storage battery and/or the external load from the photovoltaic device.

BRIEF DESCRIPTION OF THE DRAWINGS

FIG. 11 is a graph showing the dependency of the initial photoelectric conversion efficiency on pressure;

DETAILED DESCRIPTION OF THE PREFERRED EMBODIMENTS

The operation and construction of the present invention are described in detail below with reference to the drawings.

Figure 1:
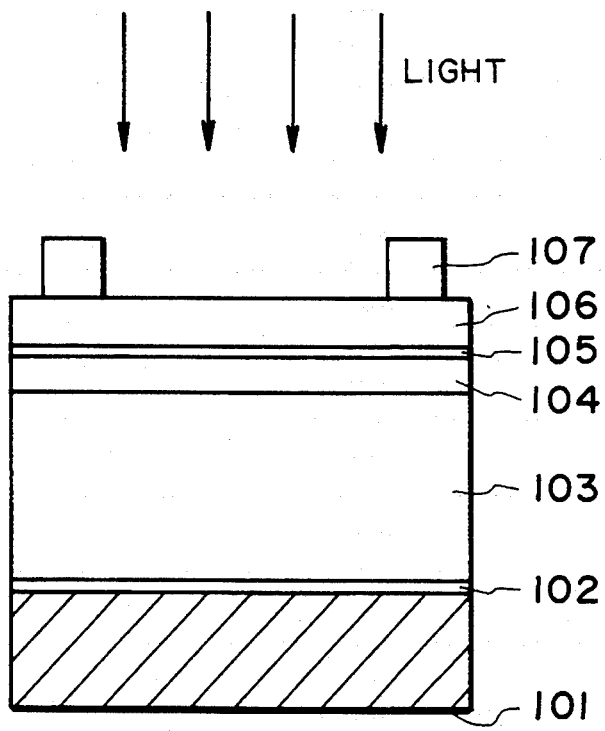
FIG. 1 is a schematic sectional view illustrating the layer structure of a photovoltaic device of the present invention.

FIG. 1 is a schematic sectional view illustrating an example of a photovoltaic device of the present invention. In FIG. 1, a photovoltaic device of the present invention comprises a photoconductive layer having a photoconductive substrate 101 (which may have a reflecting layer or a light reflecting layer and a reflection increasing layer), an n-type silicon non-single crystal semiconductor layer 102, a substantially i-type non-single crystal semiconductor layer 103 deposited by the microwave plasma CVD process and containing at least silicon and carbon atoms, and an i-type layer 104 (referred to as "i-type Si layer" hereinafter) deposited by the RF plasma CVD process and containing at least silicon atoms, a p-type silicon non-single crystal semiconductor layer 105, a transparent electrode 106, and a collecting electrode 107.

In the i-type layer 103 deposited by the microwave plasma CVD process, a minimum band gap thereof is at a position near the p-type layer side, and a portion on the p-type layer side has a conduction band with a large electric field so that electrons can efficiently be separated from holes, thereby decreasing the recombination of electrons and holes in the vicinity of the interface betweeen the i-type layer 103 deposited by the microwave plasma CVD process and the i-type layer (i-type Si layer) 104 deposited by the RF plasma CVD process. In addition, since the electric field of the valence band increases in the direction from the i-type layer deposited by the microwave plasma CVD process to the n-type layer, it is possible to decrease the recombination of photo-excited electrons and holes in the vicinity of the interface between the n-type layer and the i-type layer deposited by the microwave plasma CVD process.

When a valence electron controlling agent as a donor and a valence electron controlling agent as an acceptor are simultaneously added to the i-type layer deposited by the microwave plasma CVD process, the carrier range of electrons and holes can be lengthened. Particularly, the carrier range of electrons and holes can effectively be lengthened by adding a relatively large amount of valence electron controlling agent to a portion with the minimum band gap. As a result, the high electric field in the vicinity of the interface between the i-type Si layer 104 and the i-type layer 103 deposited by the microwave plasma CVD process, and the high electric field in the vicinity of the interface between the n-type layer 102 and the i-type layer 103 deposited by the microwave plasma CVD process can be more effectively utilized, thereby significantly improving the collection efficiency of photo-excited electrons and holes in the i-type layer 103 deposited by the microwave plasma CVD process.

In the vicinity of the-interface between the i-type layer 104 (i-type Si layer) deposited by the RF plasma CVD process and the i-type layer 103 deposited by the microwave plasma CVD process, and in the vicinity of the interface between the n-type layer 102 and the i-type layer 103 deposited by the microwave plasma CVD process, the dark current (reverse bias) caused by hopping conduction through the defect level is decreased by compensating for the defect level (i.e., D−, D+) by the valence electron controlling agent. Particularly, when the valence electron controlling agent is contained in the vicinity of each of the interfaces in an amount larger than that in the i-type layer 103 deposited by the microwave plasma CVD process, the internal stress such as strain or the like caused by an abrupt change in the component elements, which is characteristic of the vicinity of each of the interfaces, can be decreased, thereby decreasing the defect level in the vicinity of each of the interfaces. This permits increases in the open-circuit voltage and fill factor of the photovoltaic device.

In addition, since the valence electron controlling agent serving as a donor and the valence electron controlling agent serving as an acceptor are simultaneously contained in the i-type layer 103 deposited by the microwave plasma CVD process, the resistance to photo-deterioration is improved. Although the details of the mechanism of photo-deterioration are unknown, it is thought that the dangling bonds produced by irradiation of light serve as the centers of recombination of carriers, thereby deteriorating the characteristics of the photovoltaic device. In the present invention, both the valence electron controlling agent as a donor and the valence electron controlling agent as an acceptor are contained in the i-type layer 103 deposited by the microwave plasma CVD process, and both controlling agents are not 100% activated. As a result, if dangling bonds are produced by irradiation of light, they are compensated for by reaction with the unactivated valence electron controlling agents.

Particularly, even when weak light is applied to the photovoltaic device, since the defect level is compensated for by the valence electron controlling agents, the probability of trapping of photo-excited electrons and holes is decreased, and sufficient electromotive force is produced because only a small dark current flows when a reverse bias is applied. Even when weak light is applied to the photovoltaic device, an excellent photoelectric conversion efficiency is thus exhibited.

Further, the photoelectric conversion efficiency of the photovoltaic device of the present invention does not easily deteriorate even when it is annealed under vibration for a long time. Although the details of the mechanism of deterioration in the photoelectric conversion efficiency are unknown, the possible mechanism of deterioration in the photoelectric conversion efficiency of a conventional photovoltaic device is as follows:

In the formation of a photovoltaic device, the component elements are changed in order to continuously change the band gap. As a result, strain is accumulated in the photovoltaic device, and many weak bonds are thus produced in the photovoltaic device. The weak bonds in the i-type non-single crystal semiconductor deposited by the microwave plasma CVD process are broken by vibration to form dangling bonds. This results in deterioration of the photoelectric conversion efficiency. On the other hand, in the present invention, since the valence electron controlling agent as the donor and the valence electron controlling agent as the acceptor are simultaneously added, local flexibility is increased, thereby preventing the photoelectric conversion efficiency of the photovoltaic element from deteriorating by annealing under vibration for a long time.

Further, since the i-type layer (i-type Si layer) formed to a thickness of 30 nm or less a deposition rate of 2 nm/sec or less by the RF CVD process is inserted between the p-type layer and the i-type layer deposited by the microwave plasma CVD process, the photoelectric conversion efficiency of the photovoltaic device can further be improved. Particularly, the photoelectric conversion efficiency of the photovoltaic device of the present invention is not easily changed even when the element is used in an environment with large temperature changes.

The i-type non-single crystal semiconductor layer (i-type Si layer) is deposited by the RF plasma CVD process at a deposition rate of 2 nm/sec or less with low power which hardly causes gas phase reaction. As a result, the deposited layer has a high packing density, and when the i-type Si layer 104 and the i-type layer 103 deposited by the microwave plasma CVD process are laminated, the number of interfacial states between the i-type layers is low. Particularly, when the deposition rate of the layer deposited by the microwave plasma CVD process is 5 nm/sec or more, since a portion of the i-type layer near the surface thereof is not sufficiency relaxed after the microwave plasma is stopped, the surface state is very high. However, when a layer is formed by the RF plasma CVD process at a low deposition rate on the surface of the i-type layer 103 deposited by the microwave plasma CVD process, the surface states of the film deposited by the microwave plasma CVD process can be decreased due to the diffusion of hydrogen atoms, which is caused by annealing at the same time as the formation of the layer by the RF plasma CVD process.

In addition, when the valence electron controlling agent is contained in the vicinity of the interface between the p-type layer and the i-type Si layer in an amount larger than that in the i-type Si layer, the internal stress such as strain or the like caused by abrupt changes in the component elements, which is characteristic of the vicinity of the interface, can be decreased, thereby decreasing the defect level of the vicinity of the interface. This permits increases in the open-circuit voltage and the fill factor of the photovoltaic device.

Further, the resistance to photo-deterioration is increased by simultaneously adding the valence electron controlling agent as the donor and the valence electron controlling agent as the acceptor to the i-type Si layer. Although the details the mechanism of photo-deterioration are unknown, it is thought that the mechanism is the same as that if the i-type layer 103 deposited by the microwave plasma CVD process.

In addition, when weak light is applied to the photovoltaic device, the probability of trapping of photo-excited electrons and holes is decreased due to compensation of the defect levels by the valence electron controlling agents, and sufficient electromotive force can be produced because only a small dark current flows when a reverse bias is applied. As a result, the photovoltaic device exhibits an excellent photoelectric conversion efficiency when weak light is applied thereto.

Further, when the photovoltaic device is annealed under vibration for a long time, the photoelectric conversion efficiency is hardly decreased.

Figure 2A:
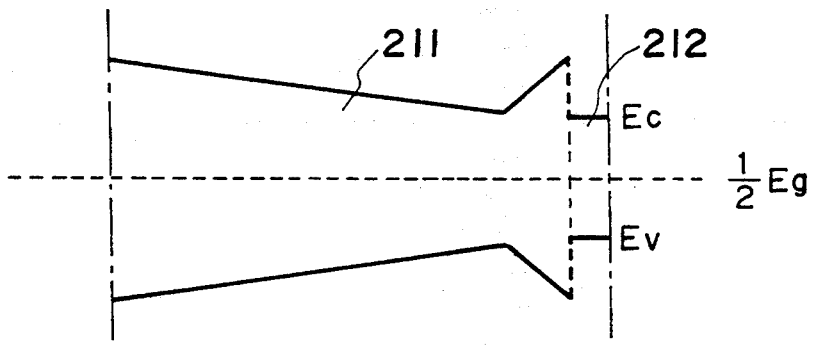
FIGS. 2A and 2B are views respectively showing examples of the band of a photoconductive layer in photovoltaic devices of the present invention.

FIG. 2A is a schematic view showing changes in the band gap of a photovoltaic device according to the present invention. This figure shows changes in the band gap of an i-type layer with a reference line drawn at ½ (Eg/2) of the band gap. In the figure, the n-type layer (not shown) side is on the left, and the p-type layer (not shown) side is on the right. The example shown in FIG. 2A has an i-type layer (i-type Si layer) 212 deposited by the RF plasma CVD process on the p-type layer side. The minimum band gap is present in the i-type layer 211 deposited by the microwave plasma CVD process on the p-type layer side, and the maximum band gap is present on both the p-type layer side and the n-type layer side.

Figure 2B:
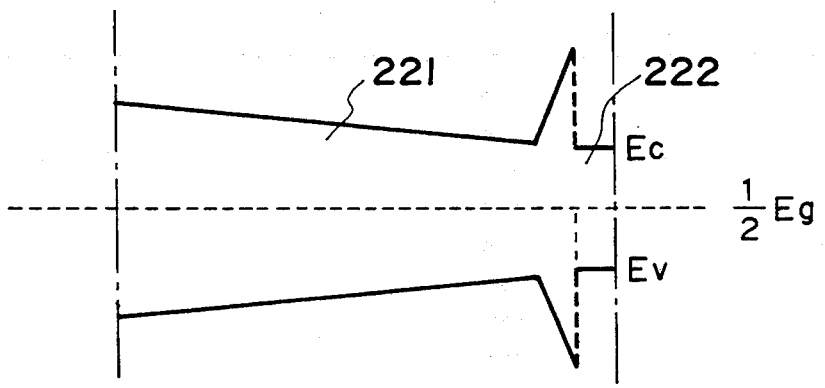

FIG. 2B is a schematic view explaining changes in the band gap. Like in FIG. 2A, in FIG. 2B, an i-type Si layer 222 is shown on the p-type layer side, the minimum band gap is present in an i-type layer 221 deposited by the microwave plasma CVD process on the p-type layer (not shown) side, and the maximum gap is present on the p-type layer side.

Figure 3A:
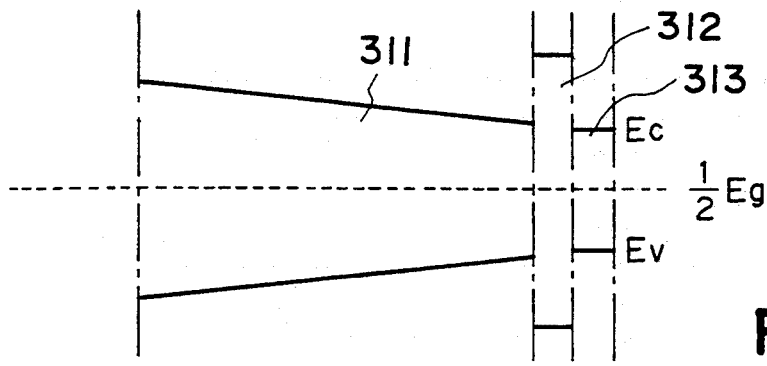
FIGS. 3A to 3G are views respectively showing examples of the band of a photoconductive layer in photovoltaic devices of the present invention.
Figure 3B:
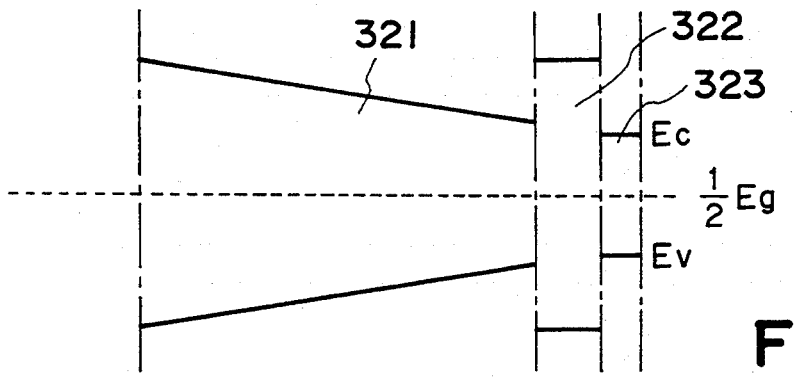
Figure 3C:
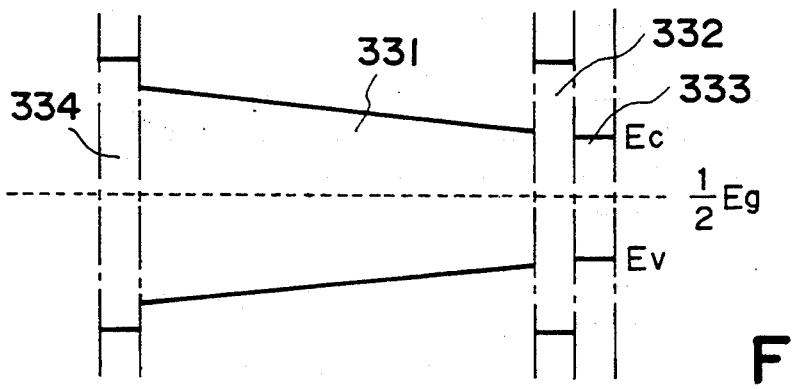

In each of the examples of photovoltaic elements shown in FIGS. 3A to 3C, an i-type layer (i-type Si layer) deposited by the RF plasma CVD process is present on the p-type layer side, and the band gap in the i-type layer deposited by the microwave plasma CVD process decreases in the direction to the i-type Si layer. Each of the figures shows changes in the band gap with a reference line drawn at Eg/2, an n-type layer (not shown) and a p-type layer (not shown) are present on the left and right, respectively, of each figure.

FIG. 3A shows an example in which an i-type layer 312 with a constant band gap and an i-type Si layer 313 with a constant band gap, both of which are deposited by the microwave plasma CVD process, are present on the side of a p-type layer, and the band gap decreases in the direction from the n-type layer side to the i-type layer 312 in an i-type layer 311 deposited by the microwave plasma CVD process. The minimum band gap is present at the interface between the i-type layer 312 and the i-type layer 311, and the bands in the i-type layer 311 and the i-type layer 312 are discontinuously connected to each other. When the regions with a constant band gap are provided, as described above, the dark current of the photovoltaic device, which is caused by hopping conduction through the defect levels when a reverse bias is applied, can be decreased as much as possible. As a result, the open-circuit voltage of the photovoltaic device is increased.

The thickness of the i-type Si layer 313 with a constant band gap is a very important factor, and is preferably within the range of 1 to 30 nm. When the thickness of the i-type Si layer 313 with a constant band gap is less than 1 nm, the dark current caused by hopping conduction through the defect levels cannot be decreased, and thus an increase in the open-circuit voltage of the photovoltaic element cannot be expected. With a thickness of more than 30 nm, since photo-excited holes are easily accumulated in the vicinity of the interface between the i-type layer 312 with a constant band gap and the i-type layer 311 with band gap changes, the efficiency of collection of photo-excited carriers is decreased. Namely, short circuit photocurrent is decreased.

FIG. 3B shows an example in which an i-type layer 321 with band gap changes, which is deposited by the microwave plasma CVD process, is provided on the p-type layer side, and the band gap on the n-layer side of the i-type layer 321 with band gap changes which is deposited by the microwave plasma CVD process, is the same as that of the i-type layer 322.

FIG. 3C shows an example in which an i-type layer 332 with a constant band gap deposited by the microwave plasma CVD process, an i-type Si layer 333 with a constant band gap, and an i-type layer 331 with band gap changes in the direction from the n-type layer side to the p-type layer side, which is deposited by the microwave plasma CVD process, are provided on the p-type layer side, and an i-type layer 334 with a constant band gap deposited by the microwave plasma CVD process is provided on the n-type layer Side. A region with a constant band gap is provided between the p-type layer and the i-type layer 331 and between the n-type layer and the i-type layer 331 so that when a reverse bias is applied to the photovoltaic device, the dark current can further be decreased, thereby increasing the open-circuit voltage of the photovoltaic device.

FIGS. 3D to 3G show examples in which the minimum band gap is present in the i-type layer deposited by the microwave plasma CVD process. In the band shown in each of the drawings, a reference line is drawn at ½ (Eg/2) of the band gap, and an n-type layer (not shown) and a p-type layer (not shown) are on the left and right, respectively.

Figure 3D:
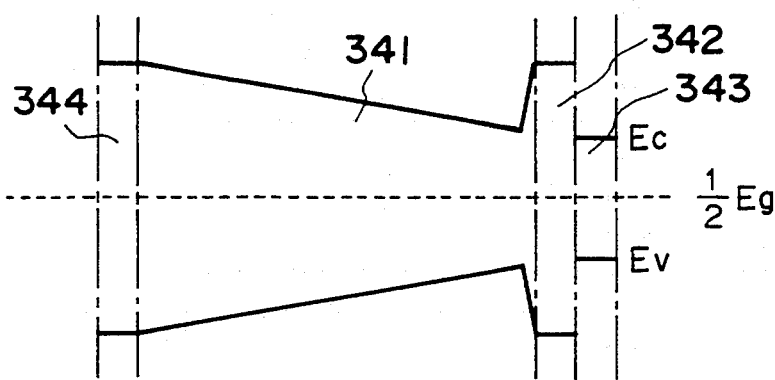

The photoconductive layer of the photovoltaic element shown in FIG. 3D comprises an i-type Si layer 343 with a uniform band gap on the p-type layer side, an i-type layer 342 with a uniform band gap deposited by the microwave plasma CVD process, an i-type layer 341 continuously connected to the i-type layer 342, having a minimum band gap therein, and formed by the microwave plasma CVD process, and an i-type layer 344 with a uniform band gap continuously connected to the i-type layer 341, and formed by the microwave plasma CVD process. The continuous band gap causes the electrons and holes photo-excited in a region of the i-type layer in which the band gap changes to be efficiently collected by the n-type layer and the p-type layer, respectively. Particularly, when the thickness of each of the i-type layers 342, 343 and 344 with a constant band gap is as small as 5 nm or less, the region of the i-type layer 342 in which the band gap abruptly changes permits a decrease in the dark current when a reverse bias is applied to the photovoltaic device, thereby increasing the open-circuit voltage of the photovoltaic device.

Figure 3E:
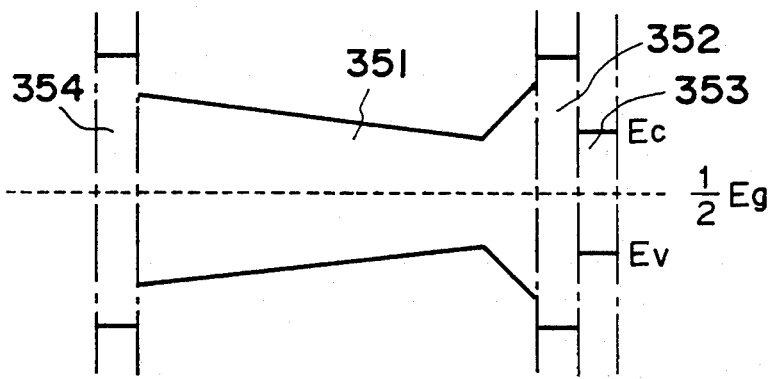

The photoconductive layer shown in FIG. 3E comprises an i-type layer 351 with band gap changes which is deposited by the microwave plasma CVD process, an i-type layer 352 with a constant band gap which is deposited by the microwave plasma CVD process, and an i-type layer 353 with a constant band gap which is discontinuously and relatively gently connected to the layer 352 and which contacts a p-type layer. However, since the region with a constant band gap is gently connected to the region with band gap changes in the direction in which the band gap increases, the carriers photo-excited in the region with band gap changes are efficiently injected into the region with a constant band gap. As a result, the collection efficiency of the photo-excited carriers is increased.

Whether the region with a constant band gap is continuously or discontinuously connected to the region with band gap changes depends upon the region with a constant band gap, the region with rapid band gap changes and the thicknesses thereof. When the thickness of the region with a constant band gap is as small as 5 nm or less, and when the thickness of the region with abrupt band gap changes is 10 nm or less, the photoelectric conversion efficiency of a photovoltaic device in which the region with a constant band gap is continuously connected to the region with band gap changes is greater than that of a device in which both regions are discontinuously connected. On the other hand, when the thickness of the region with a constant band gap is as large as 5 nm or more, and when the thickness of the region with band gap changes is 10 to 30 nm, the photoelectric conversion efficiency of a photovoltaic device in which the region with a constant band gap is discontinuously connected to the region with band gap changes is improved.

Figure 3F:
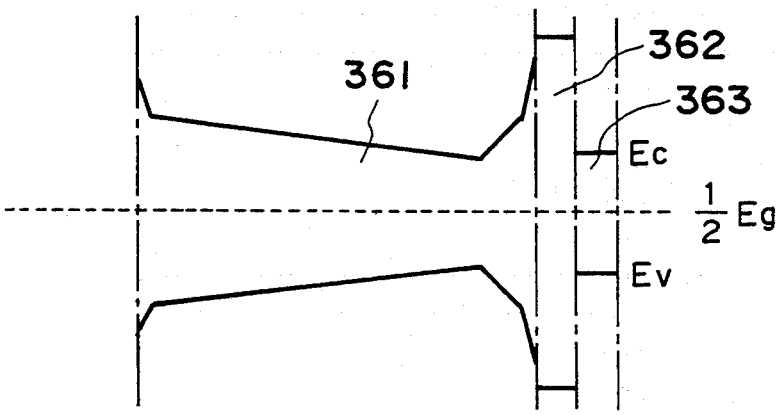

The photoconductive layer shown in FIG. 3F comprises an i-type layer 362 deposited by the microwave plasma CVD process on the p-type layer side, an i-type layer 361 having a minimum band gap and deposited by the microwave CVD process, and an i-type Si layer 363 in contact with a p-type layer. FIG. 3F shows an example in which the region with a constant band gap is connected to the region in which the band gap changes in a two-stage manner. In this example, the minimum band gap is at a position near the p-type layer. The region with the minimum band gap is connected to the region with a constant wide band gap through a stage of gently widened band gap and a stage of abruptly widened band gap so that the carriers photo-excited in the region with band gap changes can be efficiently collected. In FIG. 3F, the i-type layer 361 also has a region in which the band gap rapidly changes toward the n-type layer.

Figure 3G:
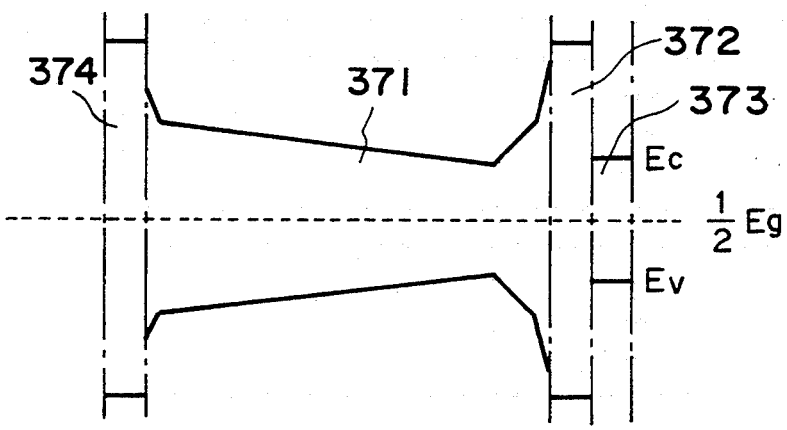

The photoconductive layer shown in FIG. 3G comprises an i-type Si layer 373 in contact with the p-type layer, an i-type layer 372 with a constant band gap which is deposited by the microwave plasma CVD process, an i-type layer 371 deposited by the microwave plasma CVD process and having a region with a minimum band gap therein, and an i-type layer 374 deposited by the microwave plasma CVD process. FIG. 3G shows an example in which a region with a constant band gap is present in the i-type layers on both the p-type layer and n-type layer sides. The region with a constant band gap on the p-type layer side is connected to the region with band gap changes through the two-stage band gap changes, and the region with a constant band gap on the n-type layer side is connected through an abrupt change in the band gap.

When the region with a constant band gap is connected to the region with band gap changes in a state where the component elements of both regions are similar, as described above, the internal strain can be decreased. As a result, annealing under vibration for a long time hardly produces the phenomenon where the defect level is increased due to breaking of the weak bonds in the i-type layer, thereby decreasing the photoelectric conversion efficiency. The photoelectric conversion efficiency can thus be maintained in a high level.

In addition, since the carrier range in the i-type layer can be increased by adding the valence electron controlling agents to the i-type layer, the carrier collection efficiency can be increased. Particularly, the content of the valence electron controlling agents is high in a region with a narrow band gap, and is low in a region with a wide band gap in accordance with the changes in the band gap so that the collection efficiency of photo-excited carriers can be further increased. Further, since the content of the valence electron controlling agents on both the p-type layer and n-type layer sides in the region with a constant band gap is higher than that in the region with the minimum band gap, it is possible to prevent the recombination of photo-excited carriers in the vicinities of the p/i interface and the n/i interface and thus increase the photoelectric conversion efficiency of the photovoltaic device.

Although, in the present invention, the preferred range of the band gap in the region with the minimum band gap of the i-type layer containing silicon and carbon atoms is selected from various values in accordance with the spectrum of the irradiation light, the range is preferably 1.6 to 1.8 eV.

In the photovoltaic device of the present invention in which the band gap continuously changes, the inclination of the tail state of the valence band is an important factor which influences the characteristics of the photovoltaic device, and the tail state of the region with the maximum band gap preferably gently continues from the tail state of the region with the minimum band gap.

For example, when the p-type layer has a laminate structure comprising a layer (referred to as "doped layer A" hereinafter consisting of, as a main component, an element in Group III or V of the Periodic Table), and a layer (referred to as "doped layer B" hereinafter) which contains a valence electron controlling agent and which consists of silicon atoms as a main component, the transmittance of the p-type layer can be increased, and the resistivity thereof can be decreased. Particularly, the side of the p-type layer which contacts the photoconductive layer is preferably the layer (doped layer B) containing the valence electron controlling agents and consisting of silicon as a main component. The contact between the photoconductive layer and the p-type layer permits a decrease in the defects therebetween.

The optimum thickness of the layer (doped layer A) which forms the p-type layer and which consists of an element in Group III in the Periodic Table as a main component ranges from 0.01 to 1 nm. The hydrogen content of the layer consisting of an element in Group III in the Periodic Table as a main component is preferably 5% or less. The content of the valence electron controlling agent contained in the layer (doped layer B) which forms the p-type layer and which contains the valence electron controlling agent and silicon atoms as main components is preferably within the range of 1500 to 10000 ppm.

Although the p-type layer is described above, an n-type layer having the same laminate structure as that of the p-type layer produces the same effects as those described above.

Although a photovoltaic device having a pin-structure is described above, the present invention can, of course, be applied to other photovoltaic devices having laminated pin structures such as a pinpin structure (double cell structure), a pinpinpin structure (triple cell structure) and the like.

The photovoltaic device of the present invention is suitable as the top pin-photovoltaic device on the incident side of a laminated multicell pin-structure photovoltaic device. In the case of the double cell structure, a pin-structure photovoltaic device having an i-type layer consisting of silicon as a main component, or a pin-structure photovoltaic device having an i-type layer consisting of silicon and germanium as main components is suitable as the bottom photovoltaic device. In the case of the triple cell structure, a pin-structure photovoltaic device having an i-type layer consisting of silicon as a main component, or a pin-structure photovoltaic device having an i-type layer consisting of silicon and germanium as main components is desirable as the middle photovoltaic device. A photovoltaic device having an i-type layer consisting of silicon and germanium as main components is suitable as the bottom photovoltaic device of the triple cell structure.

Figure 4:
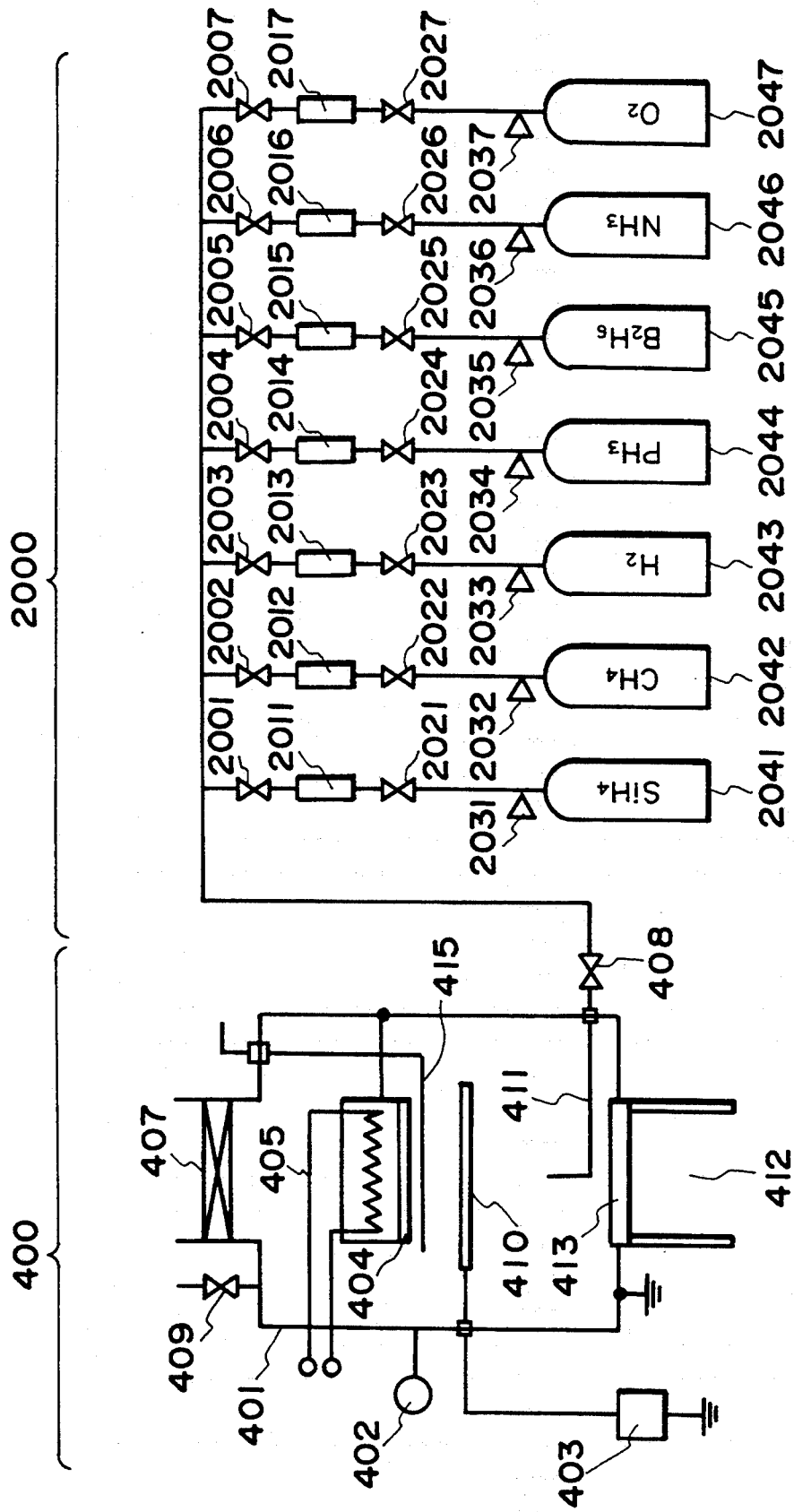
FIG. 4 is a conceptual view showing an example of an apparatus for producing a photovoltaic device of the present invention.

FIG. 4 is a schematic explanatory view showing an example of a production apparatus suitable for forming deposited films of a photovoltaic device of the present invention. The production apparatus shown in FIG. 4 comprises a deposition apparatus 400, a deposition chamber 401, a gas inlet tube 411, a substrate 404, a heater 405, a vacuum gauge 402, a conductance valve 407, an auxiliary valve 408, a leak valve 409, a RF power source 403, an RF electrode 410, a raw material gas supply apparatus 2000, mass flow controllers 2011 to 2017, valves 2001 to 2007 and 2021 to 2027, pressure regulators 2031 to 2037, and raw material gas cylinders bombs 2041 to 2047.

Although the details of the mechanism of the deposition method of the present invention are unknown, a possible mechanism is as follows:

When microwave energy lower than microwave energy required for 100% decomposition of the raw material gases and RF energy higher than the microwave energy are simultaneously applied to the raw material gases, active species suitable for forming a deposited film can be generated. When the pressure in the deposition chamber at the time of decomposition of the raw material gases is 50 mTorr or less, the mean free path of active species suitable for forming a good deposited film is sufficiently increased, thereby inhibiting gas phase reaction as much as possible.

It is also thought that when the pressure in the deposition chamber is 50 mTorr or less, the RF energy hardly influences the decomposition of the raw material gases, and controls the potential between the plasma and the substrate in the deposition chamber. Namely, in the microwave plasma CVD process, although the potential difference between the plasma and the substrate is small, the potential difference (+ on the plasma side, and − on the substrate side) between the plasma and the substrate can be increased by simultaneously applying the RF energy and the microwave energy. When the plasma potential is positive relative to the substrate and is increased, as described above, the active species produced by decomposition by the microwave energy are deposited on the substrate, and at the same time, the relaxation reaction on the surface of the substrate is promoted due to collision of cations accelerated by the plasma potential with the substrate to form a good deposited film. Particularly, this effect is significantly exhibited at a deposition rate of several nm/sec or more. In addition, since RF frequency is higher than DC frequency, the potential difference between the plasma and the substrate is determined by the distribution of ions and electrons. Namely, the potential difference between the substrate and the plasma is determined by the synergy. There is thus the effect of preventing the occurrence of sparks in the deposition chamber. As a result, stable glow discharge can be maintained for a long time of 10 hours or more.

In addition, when a layer with band gap changes is deposited, since the flow rate and flow ratio of raw material gases change with time or space, the DC voltage must be appropriately changed with time or space. However, in the deposited film forming method of the present invention, the ratio of ions is changed with the changes in the flow rates of the raw material gases and the flow ratio thereof with time or space, and the RF self bias is automatically changed in accordance with the change in the ion ratio. As a result, when RF energy is applied to a bias rod, and when the flow rates of the raw material gases and the flow rate ratio thereof are changed, discharge is significantly stabilized, as compared with the case of a DC bias.

Further, in the film forming method of the present invention, it is preferable for obtaining a desired change in the band gap to mix silicon-containing gas and carbon-containing gas at a distance of 5 m or less from the deposition chamber. When the raw material gases are mixed at a distance of 5 m or more from the deposition chamber, even if the mass flow controller is controlled in accordance with the desired band gap change, since the mixing position of the raw material gases is separated from the deposition chamber, a delay occurs in the changes in the raw material gases, and mutual diffusion of the raw material gases occurs, thereby producing a deviation from the desired band gap. Namely, if the raw material gas mixing position is at a large distance from the deposition chamber, the controllability of the band gap deteriorates.

In the film forming method of the present invention, in order to change the hydrogen content of the i-type layer in the direction of the thickness thereof, it is preferable to increase the RF energy applied to the bias rod in a region where the hydrogen content is desired to be increased, and decrease the RF energy applied to the bias rod in a region where the hydrogen content is desired to be decreased. On the other hand, when the RF energy and DC energy are simultaneously applied, it is preferable to apply a large DC voltage with positive polarity to the bias rod in a region where the hydrogen content is desired to be increased, and apply a small DC voltage with positive polarity to the bias rod in a region where the hydrogen content is desired to be decreased.

The film forming method of the present invention is described in detail below.

The substrate for forming a film on is first placed in the deposition chamber 401 shown in FIG. 4, and the deposition chamber 401 is then sufficiently evacuated to an order of $10^{-5}$ Torr or less. Although a turbo molecular pump is suitable for evacuating the deposition chamber 401, an oil diffusion pump may be used. In the case of the oil diffusion pump, a gas such as $H_2$, He, Ar, Ne, Kr, Xe or the like may be introduced into the deposition chamber 401 after the pressure in the deposition chamber 401 is $10^{-5}$ or less so as to prevent back-diffusion of oil into the deposition chamber. After the deposition chamber 401 is sufficiently evacuated, a gas such as $H_2$, He, Ar, Ne, Kr, Xe or the like is introduced into the deposition chamber 401 so that the pressure in the chamber 401 is substantially equal to that obtained when the raw material gases for forming the deposited film are introduced. The optimum pressure in the deposition chamber 401 is within the range of 0.5 to 50 mTorr.

After the pressure in the deposition chamber 401 becomes stable, the substrate heater 405 is turned on to heat the substrate to 100° to 500° C. After the substrate is stable at a predetermined temperature, the flow of gas such as $H_2$, He, Ar, Ne, Kr, Xe or the like is stopped, and predetermined amounts of raw material gases for forming the film are then introduced into the deposition chamber 401 from the gas cylinders through the mass flow controllers. The amounts of the raw material gases for forming the deposited film supplied to the deposition chamber are appropriately determined by the volume of the deposition chamber. The pressure in the deposition chamber into which the raw material gases for forming the deposited film are introduced is a very important factor in the film forming method of the present invention. The optimum pressure in the deposition chamber is 0.5 to 50 mTorr.

In the film forming method of the present invention, the microwave energy supplied to the deposition chamber for forming the film is also an important factor. The microwave energy is appropriately determined by the flow rates of the raw material gases introduced into the deposition chamber, and is smaller than the microwave energy required for 100% decomposition of the raw material gases. The microwave energy is preferably within the range of 0.005 to 1 $W/cm^3$. The frequency of the microwave energy is preferably within the range of 0.5 to 10 GHz, and a frequency of about 2.45 GHz is particularly preferred. The stability of the frequency of the microwave energy is also very important for forming the deposited film with good reproducibility by the film forming method of the present invention over a time of several hours to several tens of hours. The variation of the frequency is preferably ±2%, and the ripple of the microwave is also preferably ±2%.

In the deposited film forming method of the present invention, the combination of RF energy and microwave energy, both of which are simultaneously supplied to the deposition chamber, is also a very important factor. The RF energy is preferably within the range of 0.01 to 2 $W/cm^3$, and the frequency of the RF energy is preferably within the range of 1 to 100 MHz. A frequency of 13.56 MHz is particularly preferred. The variation of the RF frequency is within ±2%, and the RF preferably has a smooth waveform.

The supply of the RF energy is appropriately selected in accordance with the ratio between the area of the bias rod for supplying the RF energy and the electrically grounded area. Particularly, when the area of the bias rod for supplying the RF energy is smaller than the grounded area, the self bias (DC component) on the power source side for supplying the RF energy is preferably grounded. When the self bias (DC component) on the power source side for supplying the RF energy is not grounded, the area of the bias rod for supplying the RF energy is preferably larger than the grounded area in contact with the plasma.

The microwave energy is introduced into the deposition chamber 401 from a microwave energy waveguide portion 412 through a dielectric window 413, and at the same time, the RF energy is introduced into the deposition chamber 401 from the bias power source 403 through the bias rod (RF electrode) 410. In this state, the raw material gases are decomposed for a desired time to form a film having a desired thickness on the substrate. The introduction of the microwave energy and the RF energy is then stopped, and the deposition chamber is evacuated. After the deposited chamber is sufficiently purged with a gas such as $H_2$, He, Ar, Ne, Kr, Xe or the like, the deposited non-single crystal semiconductor film is removed from the deposition chamber.

As described above, a DC voltage in addition to the RF energy may be applied to the bias rod (RF electrode) 410. The applied DC voltage preferably has a polarity which makes the bias rod positive, and is preferably within the range of 10 to 300 V.

Compounds which are suitably used for forming the i-type layer of the present invention, which contain silicon or carbon atoms and which can be gasified, are the following compounds:

Examples of compounds which contain silicon atoms and which can be gasified include $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, $Si_2D_3H_3$ and the like.

Examples of compounds which contain carbon atoms and which can be gasified include $CH_4$, $CD_4$, $C_nH_{2n+2}$ (n is an integer), $C_nH_{2n}$ (n is an integer), $C_2H_2$, $C_6H_6$, $CO_2$, $CO$ and the like.

An element in Group III or V in the Periodic Table is used as the valence electron controlling agent introduced into the i-type layer deposited by the microwave plasma process of the present invention. Examples of compounds which can effectively be used as a starting material for introducing an element in Group III include boron hydrides such as $B_2H_6$, $B_4H_{10}$, $B_5H_9$, $B_5H_{11}$, $B_6H_{10}$, $B_6H_{12}$, $B_6H_{14}$ and the like; boron halides such as $BF_3$, $BCl_3$ and the like, all of which are used for introducing boron atoms; $AlCl_3$; $GaCl_3$; $InCl_3$; $TlCl_3$ and the like. Examples of compounds which can effectively be used as a starting material for introducing an atom in Group V include phosphorus hydrides such as $PH_3$, $P_2H_4$ and the like; phosphorus halides such as $PH_4I$, $PF_3$, $PF_5$, $PCl_3$, $PCl_5$, $PBr_3$, $PBr_5$, $PI_3$ and the like, all of which are used for introducing phosphorus atoms; $AsH_3$; $AsF_3$; $AsCl_3$, $AsBr_3$; $AsF_5$; $SbH_3$; $SbF_3$; $SbF_5$; $SbCl_3$; $SbCl_5$; $BiH_3$; $BiCl_3$; $BiBr_3$ and the like.

In order to achieve the objects of the present invention, each of the amounts of the atoms in Groups III and V in the Periodic Table introduced into the i-type layer is preferably 1000 ppm or less, and both atoms are preferably simultaneously supplied.

The apparatus for forming a film by the microwave plasma CVD process shown in FIG. 4 can be used for depositing the i-type layer (i-type Si layer) of the photovoltaic device of the present invention by the RF plasma CVD process. When the apparatus for forming a film by the microwave plasma CVD process shown in FIG. 4 is used for forming a film by the RF plasma CVD process, the raw material gases for forming the deposited film may be decomposed only by the RF energy without supply of the microwave energy.

The i-type layer (i-type Si layer) inserted into the p/i interface of the photovoltaic device of the present invention is deposited by the RF plasma CVD process according to the procedure below. The substrate on which layers up to the i-type layer are deposited by the microwave plasma CVD process is placed as the substrate 404 on the heater 405 in the deposition chamber 401. The door of the deposition chamber 401 is closed, and the pressure in the deposition chamber 401 is decreased to the order of $10^{-3}$ Torr. The substrate heating gas such as $H_2$, $He$, $Ar$, $Ne$, $Kr$, $Xe$ or the like is then introduced at the same flow rate and pressure as those in the RF plasma CVD process. At the same time, the substrate heater 405 is turned on, and the temperature of the heater 405 is set so that the substrate is heated to a desired temperature. When the substrate is at the desired temperature, the flow of substrate heating gas is stopped, raw material gases for forming a desired deposited film are introduced into the deposition chamber 401 from the raw material gas supply apparatus 2000 through the auxiliary valve 408 and the gas inlet tube 411.

After the pressure in the deposition chamber is stabilized at a desired value by the raw material gases, the desired RF energy is introduced into the electrode 410 from the RF power source 403 through a matching box (not shown). A plasma is then created, and deposition is continued for a desired deposition time. After a layer is deposited for the desired deposition time, the supply of the RF energy is stopped, and the substrate heater is turned off. The flow of raw material gases for forming the deposited film is then stopped, and the deposition chamber 401 is sufficiently purged. After the substrate is cooled to room temperature, the substrate is removed from the deposition chamber 401.

When the i-type Si layer is deposited by the RF plasma CVD process, the optimum conditions include a substrate temperature of 100° to 350° C. in the deposition chamber, an internal pressure of 0.1 to 10 Torr, an RF power of 0.01 to 5.0 W/cm$^3$, and a deposition rate of 0.01 to 2 nm/sec.

The RF frequency is preferably within the range of 1 to 100 MHz, and a frequency of about 13.56 MHz is particularly preferred. In the RF process, the stability of the RF frequency is also a very important factor, and the variation thereof is preferably within ±2%. The ripple of the RF power is preferably 5% or less.

In the present invention, elements in Group III and V in the Periodic Table are used as the valence electron controlling agents introduced into the i-type Si layer in order to control valence electrons. Examples of compounds which can effectively be used as a starting material for introducing an element in Group III include boron hydrides such as $B_2H_6$, $B_4H_{10}$, $B_5H_9$, $B_5H_{11}$, $B_6H_{10}$, $B_6H_{12}$, $B_6H_{14}$ and the like; boron halides such as $BF_3$, $BCl_3$ and the like, all of which are used for introducing boron atoms; $AlCl_3$; $GaCl_3$; $InCl_3$; $TlCl_3$ and the like.

Examples of compounds which can effectively be used as a starting material for introducing an atom in Group V include phosphorus hydrides such as $PH_3$, $P_2H_4$ and the like; phosphorus halides such as $PH_4I$, $PF_3$, $PF_5$, $PCl_3$, $PCl_5$, $PBr_3$, $PBr_5$, $PI_3$ and the like, all of which are used for introducing phosphorus atoms; $AsH_3$; $AsF_3$; $AsCl_3$, $AsBr_3$; $AsF_5$; $SbH_3$; $SbF_3$; $SbF_5$; $SbCl_3$; $SbCl_5$; $BiH_3$; $BiCl_3$; $BiBr_3$ and the like.

These compounds may be appropriately diluted with a gas such as $H_2$, $He$, $Ar$, $Ne$, $Kr$, $Xe$ or the like and introduced into the deposition chamber.

In order to achieve the objects of the present invention, each of the amounts of the atoms in Groups III and V in the Periodic Table introduced into the i-type Si layer is preferably 1000 ppm or less, and both atoms are preferably simultaneously supplied.

Nitrogen atoms or oxygen atoms are preferably introduced into the i-type layer deposited by the microwave plasma CVD process and the i-type Si layer deposited by the RF plasma CVD process according to the present invention. Examples of nitrogen atom introducing gases which are effectively used as a starting material for introducing nitrogen atoms include $N_2$, $NH_3$, $ND_3$, $NO$, $NO_2$, $N_2O$ and the like. Examples of oxygen atom introducing gases which are effectively used as a starting material for introducing oxygen atoms include $O_2$, $CO$, $CO_2$, $NO$, $NO_2$, $N_2O$, $CH_3CH_2OH$, $CH_3OH$ and the like.

An apparatus comprising a microwave plasma CVD apparatus and an RF plasma CVD apparatus, both of which are continuously connected, is more preferred as the deposition apparatus in the present invention. The deposition chamber for the microwave plasma CVD process is preferably separated from the deposition chamber for the RF plasma CVD process through a gate. A mechanical gate valve, a gas gate or the like is suitable as the gate.

In the present invention, when the p-type layer or n-type layer has a laminate structure, i.e., when the p-type layer or n-type layer has a laminate structure comprising a layer (doped layer A) consisting of an element in Group III and/or Group V in the Periodic Table as a main component, and a layer (doped layer B) consisting of the valence electron controlling agent and silicon atoms as a main component, the p-type layer or n-type layer can be formed by the microwave plasma CVD apparatus or the RF plasma CVD apparatus.

The doped layer A is preferably deposited by the microwave plasma CVD process or the RF plasma CVD process using as a raw material gas a gas containing an element in Group III and/or Group V in the Periodic Table. Particularly, in order to decrease the hydrogen content of the doped layer A, the layer A is preferably deposited by decomposing the raw material gas with as high a power as possible.

The doped layer A is also preferably deposited by the microwave plasma CVD process or the RF plasma CVD process using a mixture containing silicon-containing gas and as the valence electron controlling agent an element in Group III and/or Group V of the Periodic Table.

On the other hand, when a doped layer B containing a crystalline phase is deposited by the microwave plasma CVD process, it is preferred that the RF energy is smaller than microwave energy, and that the microwave energy is relatively large. The microwave energy is preferably 0.1 to 1.5 W/cm$^3$. It is also preferred for increasing the crystal grain size to dilute the raw material gases with hydrogen gas. The dilution rate of the raw material gas with hydrogen gas is preferably within the range of 0.01 to 10%.

When the doped layer B containing a crystalline phase is deposited by the RF plasma CVD process, the silicon-containing gas is diluted with hydrogen gas ($H_2$, $D_2$) to 0.01 to 10%, and the RF power is preferably 1 to 10 W/cm$^3$.

When the p-type layer and/or n-type layer of the photovoltaic device of the present invention comprises a laminate of the doped layer A and the doped layer B, the laminate structure preferably has the doped layer B at both sides thereof, e.g., a structure of BAB, BABAB, BABABAB, BABABABAB or the like.

Particularly, the transparent electrode contacts the p-type layer and/or n-type layer having a laminate structure, the doped layer B preferably contacts the transparent electrode so as to prevent the diffusion of elements in Group III and/or V in the Periodic Table into indium oxide or tin oxide which constitutes the transparent electrode, and prevents a decrease with time in the photoelectric conversion efficiency of the photovoltaic device.

The construction of the photovoltaic device of the present invention is described in further detail below.

Conductive Substrate

The conductive substrate may be made of either a conductive material or an insulating or conductive base material which is subjected to conductive treatment. Examples of conductive support materials include metals such as NiCr, stainless, Al, Cr, Mo, Au, Nb, Ta, V, Ti, Pt, Pb, Sn and the like; and alloys thereof.

Examples of electric insulating support materials include films or sheets of synthetic resins such as polyester, polyethylene, polycarbonate, cellulose acetate, polypropylene, polyvinyl chloride, polyvinylidene chloride, polystyrene, polyamide and the like; glass; ceramics; paper and the like. It is preferred that at least one surface of the electrical insulating support material is subjected to conductive treatment, and a photovoltaic layer is provided on the surface subjected to conductive treatment.

For example, when glass is used, conductivity is imparted to the glass by providing a thin film consisting of NiCr, Al, Cr, Mo, Ir, Nb, Ta, V, Ti, Pt, Pb, $In_2O_3$, ITO ($In_2O_3+SnO_2$) or the like on the surface thereof. If a synthetic resin film such as a polyester film or the like is used, conductivity is imparted to the surface thereof by providing on the surface a metal thin film consisting of NiCr, Al, Ag, Pb, Zn, Ni, Au, Cr, Mo, Ir, Nb, Ta, V, Tl, Pt or the like by vacuum evaporation, electron beam evaporation or sputtering, or laminating the surface with the metal. The substrate material can be formed into a sheet having a smooth surface or irregular surface. The thickness of the support material is appropriately determined so that a desired photovoltaic device can be formed. However, when the photovoltaic device is required to have flexibility, the device can be thinned as much as possible within the range which allows the function as the support material to be sufficiently exhibited. The thickness of the support material is generally 10 $\mu$m or more from the viewpoints of production, handling, and mechanical strength of the support material.

Reflecting Layer

The reflecting layer preferably consists of a metal such as Ag, Al, Cu, AlSi or the like, which exhibits high reflectance within the region of visible light to near infrared light. The reflecting layer is preferably formed by resistance heating vacuum evaporation, electron beam vacuum evaporation, coevaporation, or sputtering of the metal. The suitable thickness of the reflecting metal layer is 10 nm to 5000 nm. In order to form the metal into a texture, the substrate temperature at the time of deposition of metal may be 200° C. or more.

Reflection Increasing Layer

Preferred examples of materials for the reflection increasing layer include ZnO, $SnO_2$, $In_2O_3$, ITO, $TiO_2$, CdO, $Cd_2SnO_4$, $Bi_2O_3$, $MoO_3$, $Na_xWO_3$ and the like.

Preferred examples of processes of depositing the reflection increasing layer include a vacuum evaporation process, a sputtering process, a CVD process, a spray process, a spin-on process, a dipping process and the like.

Although the optimum thickness of the reflection increasing layer depends upon the refractive index of the material of the reflection increasing layer, the thickness is preferably within the range of $_{50}$ nm to $_{10}$ $\mu$m. In order to texture the reflection increasing layer, the substrate temperature at the time of deposition of the reflection increasing layer is preferably increased to 300° C. or more.

P-type Layer or N-type Layer: Second and First Conductivity Type Layers

Examples of amorphous materials (indicated by a-), including microcrystal materials (indicated by $\mu$c-)) for the p-type layer or n-type layer include materials comprising a high concentration of a p-type valence electron controlling agent (atoms of B, Al, Ga, In, or Tl in Group III of the Periodic Table) or an n-type valence electron controlling agent (atoms of P, As, Sb, or Bi in Group V of the Periodic Table), and a-Si:H, a-Si:HX, a-SiC:H, a-SiC:HX, a-SiGe:H, a-SiGeC:H, a-SiO:H, a-SiN:H, a-SiON:HX, a-SiOCN:HX, μc-Si:H, μc-SiC:H, μc-Si:HX, μc-SiC:HX, μc-SiGe:H, μc-SiO:H, μc-SiGeC:H, μc-SiN:H, μc-SiON:HX, μc-SiOCN:HX or the like. Examples of polycrystal material (indicated by poly-) include materials comprising a high concentration of p-type valence electron controlling agent (atoms of B, Al, Ga, In, or Tl in Group III of the Periodic Table) or an n-type valence electron controlling agent (atoms of P, As, Sb, or Bi in Group V of the Periodic Table), and poly-Si:H, poly-Si:HX, poly-SiC:H, poly-SiC:HX, poly-SiGe:H, poly-Si, poly-SiC, poly-SiGe or the like.

The p-type layer or n-type layer on the incident side preferably comprises a crystalline semiconductor layer absorbing less light or an amorphous semiconductor layer having a wide band gap.

The optimum amount of the atoms in Group III the Periodic Table added to the p-type layer and the optimum amount of the atoms in Group V added to the n-type layer are 0.1 to 50 atoms %.

The hydrogen atoms (H, D) or halogen atoms contained in the p-type layer or n-type layer function to compensate for the dangling bonds in the p-type layer or n-type layer and improve the doping efficiency of the p-type layer or n-type layer. The optimum amount of the hydrogen or halogen atoms added to the p-type layer or n-type layer is 0.1 to 40 atom %. Particularly, when the p-type layer or n-type layer is crystalline, the optimum amount of the hydrogen or halogen atoms is 0.1 to 8 atom %. In addition, in a preferred distribution, large amounts of hydrogen and/or halogen atoms are distributed in a portion near each of the p-type layer/i-type layer interface and the n-type layer/i-type layer interface. The content of the hydrogen and/or halogen atoms in a-portion near each of the interfaces is preferably 1.1 to 2 times that in the bulk. When the content of the hydrogen and/or halogen atoms in a portion near each of the p-type layer/i-type layer interface, and the n-type layer/i-type layer interface is higher, as described above, the defect level and mechanical strain of a portion near each of the interfaces can be decreased, thereby increasing the photoelectromotive force and photoelectric current of the photovoltaic devices of the present invention.

In regard to the electrical characteristics of the p-type layer and n-type layer of the photovoltaic device, the activation energy is 0.2 eV or less, preferably 0.1 eV or less, and the resistivity is preferably 100 Ωcm or less, more preferably 1 Ωcm or less. The thickness of the p-type layer or n-type layer is preferably 1 to 50 nm, more preferably 3 to 10 nm.

Examples of raw material gases which are suitable for depositing the p-type layer or n-type layer of the photovoltaic device include a silicon-containing compound which can be gasified, a germanium-containing compound which can be gasified, a carbon-containing compound which can be gasified, and a gas mixture thereof.

Examples of silicon-containing compounds which can be gasified include $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, $Si_2D_3H_3$ and the like.

Examples of germanium-containing compounds which can be gasified include $GeH_4$, $GeD_4$, $GeF_4$, $GeFH_3$, $GeF_2H_2$, $GeF_3H$, $GeHD_3$, $GeH_2D_2$, $GeH_3D$, $GeH_6$, $GeD_6$ and the like.

Examples of carbon-containing compounds which can be gasified include $CH_4$, $CD_4$, $C_nH_{2n+2}$ (n is an integer), $C_nH_{2n}$ (n is an integer), $C_2H_2$, $C_6H_6$, $CO_2$, $CO$ and the like.

In the present invention, atoms in Groups III and V of the Periodic Table are introduced into the p-type layer or n-type layer in order to control valence electrons.

Examples of compounds which can effectively be used as a starting material for introducing atoms in Group III include boron hydrides such as $B_2H_6$, $B_4H_{10}$, $B_5H_9$, $B_5H_{11}$, $B_6H_{10}$, $B_6H_{12}$, $B_6H_{14}$ and the like; boron halides such as $BF_3$, $BCl_3$ and the like, all of which are used for introducing boron atoms; $AlCl_3$; $GaCl_3$; $InCl_3$; $TlCl_3$ and the like. $B_2H_6$ and $BF_3$ are particularly preferred.

Examples of compounds which can effectively be used as a starting material for introducing atoms in Group V include phosphorus hydrides such as $PH_3$, $P_2H_4$ and the like; phosphorus halides such as $PH_4I$, $PF_3$, $PF_5$, $PCl_3$, $PCl_5$, $PBr_3$, $PBr_5$, $PI_3$ and the like, all of which are used for introducing phosphorus atoms; $ASH_3$; $AsF_3$; $AsCl_3$; $AsBr_3$; $AsF_5$; $SbH_3$; $SbF_3$; $SbF_5$; $SbCl_3$; $SbCl_5$; $BiH_3$; $BiCl_3$; $BiBr_3$ and the like. $PH_3$ and $PF_3$ are particularly preferred.

These compounds may be appropriately diluted with a gas such as $H_2$, He, Ar, Ne, Kr, Xe or the like and introduced into the deposition chamber.

The method of depositing the p-type layer or n-type layer suitable for the photovoltaic device is the RF plasma CVD process or the microwave plasma CVD process.

When the layer is deposited by the RF plasma CVD process, a capacitance coupling type RF plasma CVD process is suitable. When the p-type layer or n-type layer is deposited by the RF plasma CVD process, the optimum conditions include a substrate temperature of 100° to 350° C. in the deposition chamber, an internal pressure of 0.1 to 10 Torr, an RF power of 0.01 to 5.0 W/cm³, and a deposition rate of 0.1 to 30 Å/sec.

Particularly, when a layer of a microcrystal semiconductor or a-SiC:H which absorbs a small amount of light of which has a wide band gap is deposited, the raw material gases are preferably diluted 2 to 100 times with hydrogen gas, and relatively high power is preferably introduced. The RF frequency is preferably within the range of 1 to 100 MHz, and a frequency of about 13.56 MHz is particularly preferable.

When the p-type layer or n-type layer is deposited by the microwave plasma CVD process, a preferred method is to introduce microwaves into the deposition chamber using a wave guide through a dielectric window (alumina ceramics or the like) in the microwave plasma CVD apparatus.

Although the film forming method of the present invention is also suitable as a method of depositing the p-type layer or n-type layer by the microwave plasma CVD process, a deposited film which can be applied to a photovoltaic device can be formed under wider deposition conditions.

When the p-type layer or n-type layer is deposited by the microwave plasma CVD process under conditions other than those of the present invention, preferred examples of conditions include a substrate temperature of 100° to 400° C. in the deposition chamber, an internal pressure of 0.5 to 30 mTorr, a microwave power of 0.01 to 1 W/cm³, and a microwave frequency of 0.5 to 10 GHz.

Particularly, when a layer of a microcrystal semiconductor or a-SiC:H which absorbs a small amount of light or which has a wide band gap is deposited, the raw material gases are preferably diluted 2 to 100 times with hydrogen gas, and relatively high power is preferably introduced.

I-Type Layer by Microwave Plasma CVD Process

In the photovoltaic device, the i-type layer is an important layer for generating and transporting change carriers when light is applied thereto.

A slightly p-type or slightly n-type layer can be used as the i-type layer.

The i-type layer of the photovoltaic device of the present invention contains silicon and carbon atoms, and has a band gap which gently changes in the direction of the thickness thereof and a minimum band gap at a position between the center and the interface between the p-type layer and the i-type layer. The i-type layer is more preferably doped with a valence electron controlling agent as a donor and a valence electron controlling agent as an acceptor.

The hydrogen atoms (H, D) or halogen atoms (X) contained in the i-type layer function to compensate the dangling bonds of the i-type layer and increase the product of the mobility and life time of the charge carriers in the i-type layer. The hydrogen atoms or halogen atoms also have the effects of compensating the interface levels of each of the p-type layer/i-type layer interface and the n-type layer/i-type layer interface, and improving the photoelectromotive force, photoelectric current, and photoresponse of the photovoltaic device. The optimum content of hydrogen and/or halogen atoms in the i-type layer is 1 to 40 atom %.

In a preferred example of the distribution of hydrogen and/or halogen atoms, large amounts of hydrogen and/or halogen atoms are distributed on the side of each of the p-type layer/i-type layer interface and the n-type layer/i-type layer interface. The content of the hydrogen and/or halogen atoms in a portion near the each of the interfaces is preferably 1.1 to 2 times that of the bulk. It is also preferred that the content of hydrogen and/or halogen atoms changes in the direction opposite to the direction of change of the content of the silicon atoms. The content of the hydrogen and/or halogen atoms in a portion with the minimum content of silicon atoms is preferably within the range of 1 to 10 atom %, and is 0.3 to 0.8 times that of the region with the maximum content of hydrogen and/or halogen atoms.

The content of hydrogen and/or halogen atoms changes in the direction opposite to the direction of change of the silicon content. Namely, the content of hydrogen and/or halogen atoms changes in accordance with the band gap, and it is low in a region with a narrow band gap. Although the details of the mechanism are unknown, when an semiconductor alloy containing silicon and carbon atoms is deposited, the film forming method of the present invention possibly causes a difference between the energy gained by the silicon atoms and the energy gained by the carbon atoms due to a difference between the ionization potentials thereof. This causes sufficient relaxation and can thus form a good semiconductor alloy even if the content of hydrogen and/or halogen atom in the alloy semiconductor is low.

When 100 ppm or less of oxygen and/or nitrogen is added to the i-type layer containing silicon and carbon atoms, the durability of the photovoltaic device to long-term annealing under vibration can be improved. Although the cause of this is unknown, it is thought that since the component ratio between silicon atoms and carbons atom continuously changes in the direction of the thickness of the i-type layer, the residual strain is increased, as compared with the case of a mixture containing silicon and carbon atoms at a constant ratio. The addition of oxygen and/or nitrogen atoms to such a system decreases the structural strain and thus improves the durability of the photovoltaic device to long-term annealing under vibration. In a preferred distribution of oxygen and/or nitrogen atoms in the direction of the thickness, the content of oxygen and/or nitrogen atoms changes in accordance with the content of the carbon atoms. Although this distribution corresponds to the distribution of the hydrogen and/or halogen atoms, this distribution is thought to be preferred from the viewpoint of the balance between the effect of removing structural strain and the effect of decreasing dangling bonds.

In addition, the distributions of hydrogen atoms (and/or halogen atoms) and oxygen atoms (and/or nitrogen atoms) causes the continuous connection between the tail states of the valence band and the conduction band.

Although the thickness of the i-type layer significantly depends upon the structure of the photovoltaic device (single cell, tandem cell, or triple cell) and the band gap of the i-type layer, the optimum thickness is within the range of 0.05 to 1.0 μm.

The i-type layer formed by the deposited film forming method of the present invention and containing silicon and carbon atoms exhibits a small tail state on the side of the valence band even if the deposition rate is increased to 2.5 nm/sec or more. The inclination of the tail state is 60 meV or less, and the density of the dangling bonds measured by electron spin resonance (ESR) is $10^{17}/cm^3$ or less.

It is also preferred to design the i-type layer so that the band gap on the side of each of the p-type layer/i-type layer interface and the n-type layer/i-type layer interface is wider. Such design can increase the photoelectromotive force and the photoelectric current of the photovoltaic device, and can prevent the photo-deterioration when the device is used for a long time.

i-Type Layer by RF Plasma CVD Process: i-type Si Layer

The i-type layer is preferably deposited by the RF plasma CVD process at a deposition rate of 2 nm/sec or less, and the content of hydrogen and/or halogen atoms in the deposited layer is preferably within the range of 1 to 40 atom %. In a preferred bonding state of the hydrogen and/or halogen atoms, the hydrogen or halogen atoms are bonded to silicon atoms. It is also preferred that the half band width of the peak at 2000 $cm^{-1}$ in the infrared absorption spectrum, which shows the bond between a silicon atom and a hydrogen atom, is greater than that of the peak at 2000 $cm^{-1}$ of the i-type layer formed by the microwave CVD process.

Transparent Electrode

The transparent electrode is deposited by the method below. Optimum methods of depositing the transparent electrode include the sputtering process, and the vacuum evaporation process.

When a transparent electrode made of indium oxide is deposited on the substrate by using a magnetron sputtering apparatus, a target consisting of indium metal (In) or indium oxide ($In_2O_3$) or the like is used. When a transparent electrode made of indium-tin oxide is deposited on the substrate, tin metal (Sn), indium metal, an alloy of tin metal and indium metal, tin oxide, indium oxide, indium-tin oxide and the like can be appropriately used as a target in combination of two or more.

When the transparent electrode is deposited by the sputtering method, the substrate temperature is an important factor, and is preferably within the range of 25° to 600° C. Examples of sputtering gases include inert gases such as argon (Ar), neon (Ne), xenon (Xe), helium (He) or the like. Ar is particularly preferred. Oxygen ($O_2$) is preferably added to the above inert gas if required. Particularly, when a metal is used as the target, oxygen ($O_2$) is indispensable.

When the target is sputtered by the inert gas, the pressure of the discharge space is preferably within the range of 0.1 to 50 mTorr in order to effectively sputter the target.

A DC power source or RF power source is preferred as a power source, and the electric power during sputtering is preferably within the range of 10 to 1000 W.

The deposition rate of the transparent electrode depends upon the pressure in the discharge space and discharge electric power, and an optimum deposition rate is within the range of 0.01 to 10 nm/sec. The thickness of the transparent electrode is preferably determined so that the requirements of a reflection preventing film are satisfied. A preferred example of the thickness of the transparent electrode is within the range of 50 to 300 nm.

Examples of evaporation sources suitable for depositing the transparent electrode by the vacuum evaporation process include tin metal, indium metal, and an indium-tin alloy. When the transparent electrode is deposited, the substrate temperature is preferably within the range of 25° to 600° C.

In the deposition of the transparent electrode, oxygen gas ($O_2$) must be introduced into the deposition chamber within the range of $5 \times 10^{-5}$ to $9 \times 10^{-4}$ Torr after the pressure in the deposition chamber is decreased to the order of $10^{-6}$ Torr. The introduction of oxygen within the above range permits the good transparent electrode to be formed by reaction of the metal vaporized from the evaporation source and the oxygen in the gas phase.

Evaporation may be also performed through the plasma generated by introducing RF electric power in the above vacuum state. Under the above conditions, the preferred deposition rate of the transparent electrode is within the range of 0.01 to 10 nm/sec. With a deposition rate of less than 0.01 nm/sec, the productivity is decreased. With a deposition rate of more than 10 nm/sec, the film formed is coarse and thus exhibits poor transmittance, conductivity, and adhesion.

A description will now be made of a generating system of the present invention. The generating system of the present invention comprises the photovoltaic device of the present invention, a control system for controlling the electric power supplied to a storage battery and/or an external load from the photovoltaic device while monitoring the voltage and/or current thereof, and the storage battery for storing the electric power supplied from the photovoltaic device and/or supplying the electric power to the external load.

Figure 18:
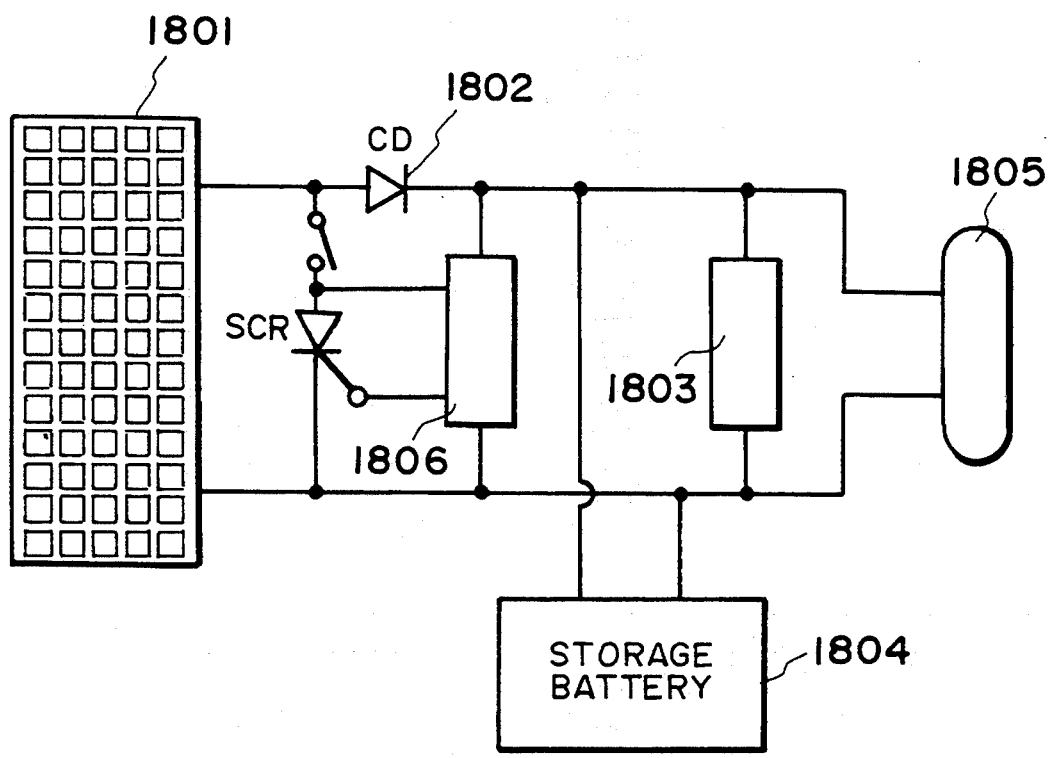
FIG. 18 is a block diagram showing a generating system of the present invention.

FIG. 18 shows an example of a power supply system of the present invention comprising a basic circuit for charging and supplying power by employing a photovoltaic device. This circuit comprises a solar cell module 1801 comprising the photovoltaic device of the present invention, a reverse current prevention diode (CD) 1802, a voltage control circuit (constant voltage circuit) 1803 for controlling the voltage by monitoring the voltage, a storage battery 1804, a load 1805 and so on. A silicon diode, a Schottky diode, or the like is suitable as the diode 1802. Examples of the storage battery include a nickel-cadmium battery, a rechargeable type silver oxide battery, a lead-acid battery, a flywheel energy storage unit, and the like. In FIG. 18, SCR denotes a thyristor, and reference numeral 1806 denotes an overcharge preventing circuit.

Although the output of the voltage control circuit 1803 is equal to that of a solar cell until the storage battery is fully charged, the charging current is stopped by a charge control IC 1806 when the battery is fully charged.

Such a solar cell system using the photovoltaic device can be used as a power source for an automobile battery charge system, a marine battery charge system, a street lamp lighting system, an exhaust system or the like.

As described above, a power source system using as a solar cell the photovoltaic device of the present invention can be stably used for a long period. In addition, even through the light applied to the solar cell varies, the photovoltaic device of the present invention sufficiently functions, and excellent stability is exhibited.

Although the effects of the present invention are described in detail below with reference to examples of the production of a non-single crystal silicon carbide solar cell according to the present invention, the present invention is not limited to these examples.

EXAMPLE 1

A substrate was first produced by the method below. A $50 \times 50$ nm$^2$ stainless substrate was washed with acetone and isopropanol under application of ultrasonic waves, and then dried. A reflecting layer of Ag (Silver) having a thickness of 0.3 µm was produced on the surface of the stainless substrate at room temperature by a sputtering process, and a reflection increasing layer of ZnO (zinc oxide) having a thickness of 1.0 µm was produced on the reflecting layer at 350° C.

A semiconductor layer was then produced on the reflection increasing layer by the glow discharge decomposition method using the production apparatus comprising the raw material gas supply apparatus 2000 and the deposition apparatus 400, as shown in FIG. 4. Raw material gases for producing the photovoltaic device of the present invention were sealed in the gas cylinders 2041 to 2047 shown in FIG. 4. The gas cylinders 2041, 2042, 2043, 2044, 2045, 2046, and 2047 are a SiH$_4$ gas (purity 99.999%) cylinder, CH$_4$ gas (purity 99.9999%) cylinder, a H$_2$ gas (purity 99.9999%) cylinder, a PH$_3$ gas cylinder diluted with H$_2$ gas to 100 ppm (purity 99.99%, referred to as "PH$_3$/H$_2$" hereinafter), a B$_2$H$_6$ gas cylinder diluted with H$_2$ gas to 100 ppm (purity 99.99%, referred to as "B$_2$H$_6$/H$_2$" hereinafter), a NH$_3$ gas cylinder diluted with H$_2$ gas to 1% (purity 99.9999%, referred to as "NH$_3$/H$_2$" hereinafter) cylinder, and an O$_2$ gas cylinder diluted with He gas to 1% (purity 99.9999%, referred to as "O$_2$/He" hereinafter) respectively. When the gas cylinders 2041 to 2047 were connected, the gases were introduced into the gas pipes to the valves 2021 to 2027, respectively, and the pressure of each of the gases was regulated to 2 kg/cm$^2$ by the pressure regulator. The SiH$_4$ gas and the CH$_4$ gas were mixed at a distance of 1 m from the deposition chamber.

The back of the substrate 404 on which the reflecting layer and the reflection increasing layer were formed was then fastened to the heater 405. The leak valve 409 of the deposition chamber 401 was closed, and the conductance valve 407 was fully opened so that the deposition chamber 401 was evacuated by a vacuum pump (not shown). When the reading of the vacuum gauge 402 was about $1 \times 10^{-4}$ Torr, the valves 2001 to 2007 were opened, and the auxiliary valve 408 was opened so that the gas pipes were evacuated. When the reading of the vacuum gauge was again about $1 \times 10^{-4}$ Torr, the valves 2001 to 2007 were closed, and the valves 2031 to 2037 were gradually opened so that the gases were introduced into the mass flow controllers 2011 to 2017, respectively.

After preparation for the film formation was completed, as described above, a semiconductor layer having an n-type layer, an i-type layer, an i-type Si layer and a p-type layer was produced on the substrate 404.

When the n-type layer was produced, the auxiliary valve 408 and the valve 2003 were gradually opened so that H₂ gas was introduced into the deposition chamber 401 through the gas inlet pipe 411. The mass flow controller 2014 was set so that the H₂ gas flow rate was 50 sccm. The pressure in the deposition chamber was regulated to 1.0 Torr by the conductance valve while observing the vacuum gauge 402, and the temperature of the substrate 404 was set to 350° C. by the heater 405. When the substrate was sufficiently heated, the valves 2001 and 2004 were gradually opened so that the SiH₄ gas and the PH₃/H₂ gas were introduced into the deposition chamber 401. At this time, the mass flow controllers 2011, 2013, and 2014 were adjusted so that the flow rates of the SiH₄ gas, the H₂ gas, and the PH₃/H₂ gas were 2 sccm, 100 sccm, and 20 sccm, respectively. The pressure in the deposition chamber 401 was adjusted to 1.0 Torr by adjusting the opening of the conductance valve 407 while observing the vacuum gauge 402. The closing of the shutter 415 was then confirmed, the output of the RF power source was set to 0.007 W/cm³, and the RF electric power was introduced into the RF electrode 410 so as to produce glow discharge. The shutter was then opened, and the production of the n-type layer on the substrate 404 was started. When the n-type layer having a thickness of 20 nm was produced, the shutter was closed, and the RF power source was turned off so that the glow discharge was stopped. After the formation of the n-type layer was completed, the valves 2001 and 2004 were closed so that the flows of the SiH₄ gas and the PH₃/H₂ gas into the deposition chamber 401 were stopped. After H₂ gas was introduced into the deposition chamber 401 for 5 minutes, the outflow valve 2003 was closed, and the deposition chamber 401 and the gas pipes were evacuated.

When the i-type layer was next produced, the valve 2003 was gradually opened, and H₂ gas was introduced into the deposition chamber 401. The flow rate of H₂ gas was adjusted to 300 sccm by the mass flow controller 2013. The pressure in the deposition chamber 401 was adjusted to 0.01 Torr by the conductance valve while observing the vacuum gauge 402, and the heater 405 was set so that the temperature of the substrate 404 was 350° C. After the substrate was sufficiently heated, the valves 2001 and 2002 were gradually opened so that SiH₄ gas and CH₄ gas were introduced into the deposition chamber 401. At this time, the mass flow controllers were adjusted so that the flow rates of the SiH₄ gas, the CH₄ gas, and the H₂ gas were 100 sccm, 30 sccm, and 300 sccm, respectively. The pressure in the deposition chamber 401 was adjusted to 0.01 Torr by adjusting the opening of the conductance valve 407 while observing the vacuum gauge 402. The output of the RF power source 403 was then set to 0.40 W/cm³, and the RF electric power was applied to the RF electrode 410. The power output of a μW power source (not shown) was then set to 0.20 W/cm³, and μW power was introduced into the deposition chamber 401 through the dielectric window 413 to produce glow discharge. The shutter was then opened, and the production of the i-type layer on the n-type layer was started. The flow rates of the SiH₄ gas and the CH₄ gas were changed by using a computer connected to the mass flow controllers in accordance with the change pattern of the flow rates shown in FIG. 5. When an i-type layer having a thickness of 300 nm was produced, the shutter was closed, and the μW power source was shut off so that glow discharge was stopped. The RF power source 403 was then turned off. After the formation of the i-type layer was completed, the valves 2001 and 2002 were closed so that the flows of the SiH₄ gas and the CH₄ gas into the deposition chamber 401 were stopped. After H₂ gas was introduced into the deposition chamber 401 for 5 minutes, the outflow valve 2003 was closed, and the deposition chamber 401 and the gas pipes were evacuated.

When the i-type Si layer was then produced, the valve 2003 was gradually opened, and H₂ gas was introduced into the deposition chamber 401. The flow rate of H₂ gas was adjusted to 50 sccm by the mass flow controller 2013. The pressure in the deposition chamber 401 was adjusted to 1.5 Torr by the conductance valve while observing the vacuum gauge 402, and the heater 405 was set so that the temperature of the substrate 404 was 250° C. After the substrate was sufficiently heated, the valve 2001 was gradually opened so that SiH₄ gas was introduced into the deposition chamber 401. At this time, the mass flow controllers were adjusted so that the flow rates of the SiH₄ gas and the H₂ gas were 2 sccm and 100 sccm, respectively. The pressure in the deposition chamber 401 was adjusted to 1.5 Torr by adjusting the opening of the conductance valve 407 while observing the vacuum gauge 402. The output of the RF power source 403 was then set to 0.007 W/cm³ and the RF electric power was introduced to produce glow discharge. The shutter was then opened, and the production of the i-type Si layer on the i-type layer was started at a deposition rate of 0.1 nm/sec. When an i-type Si layer having a thickness of 20 nm was produced, the shutter was closed, and the RF power source was shut off so that glow discharge was stopped. After the formation of the i-type Si layer was completed, the valve 2001 was closed so that the flow of the SiH₄ gas into the deposition chamber 401 was stopped. After H₂ gas was introduced into the deposition chamber 401 for 5 minutes, the outflow valve 2003 was closed, and the deposition chamber 401 and the gas pipes were evacuated.

When the p-type layer was next produced, the valve 2003 was gradually opened, and H₂ gas was introduced into the deposition chamber 401. The flow rate of H₂ gas was adjusted to 50 sccm by the mass flow 2013. The pressure in the deposition chamber 401 was adjusted to 2.0 Torr by the conductance valve while observing the vacuum gauge 402, and the heater 405 was set so that the temperature of the substrate 404 was 200° C. After the substrate was sufficiently heated, the valves 2001, 2002, and 2005 were gradually opened so that SiH₄ gas, CH$_4$ gas, and B$_2$H$_6$/H$_2$ gas were introduced into the deposition chamber 401. At this time, the mass flow controllers were adjusted so that the flow rates of the SiH$_4$ gas, CH$_4$ gas, H$_4$ gas, and B$_2$H$_6$/H$_2$ gas were 1 sccm, 0.5 sccm, 100 sccm, and 100 sccm, respectively. The pressure in the deposition chamber 401 was adjusted to 2.0 Torr by adjusting the opening of the conductance valve 407 while observing the vacuum gauge 402.

The output of the RF power source 403 was then set to 0.2 W/cm$^3$ and the RF electric power was introduced to produce glow discharge. The shutter was then opened, and the production of the p-type layer on the i-type Si layer was started. When a p-type layer having a thickness of 10 nm was produced, the shutter was closed, and the RF power source was shut off so that glow discharge was stopped. After the formation of the p-type layer was completed, the valves 2001, 2002 and 2005 were closed so that the flows of the SiH$_4$ gas, CH$_4$ gas, and B$_2$H$_6$/H$_2$ gas into the deposition chamber 401 was stopped. After H$_2$ gas was introduced into the deposition chamber 401 for 5 minutes, the outflow valve 2003 was closed, and the deposition chamber 401 and the gas pipes were evacuated. The auxiliary valve 408 was closed, and the leak valve 409 was opened so that the gas in the deposition chamber 401 was leaked out.

ITO (In$_2$O$_3$+SnO$_2$) was then deposited to a thickness of 80 nm by the usual vacuum evaporation process to form a transparent electrode. A collecting electrode of chromium (Cr) having a thickness of 10 $\mu$m was then deposited on the transparent electrode by the usual vacuum evaporation process.

The non-single crystal silicon carbide solar cell produced by the above method is referred to as "SC Example 1". The conditions for producing the n-type layer, the i-type layer, the i-type Si layer, and the p-type layer are shown in Table 1.

COMPARATIVE EXAMPLE 1-1

Figure 6:
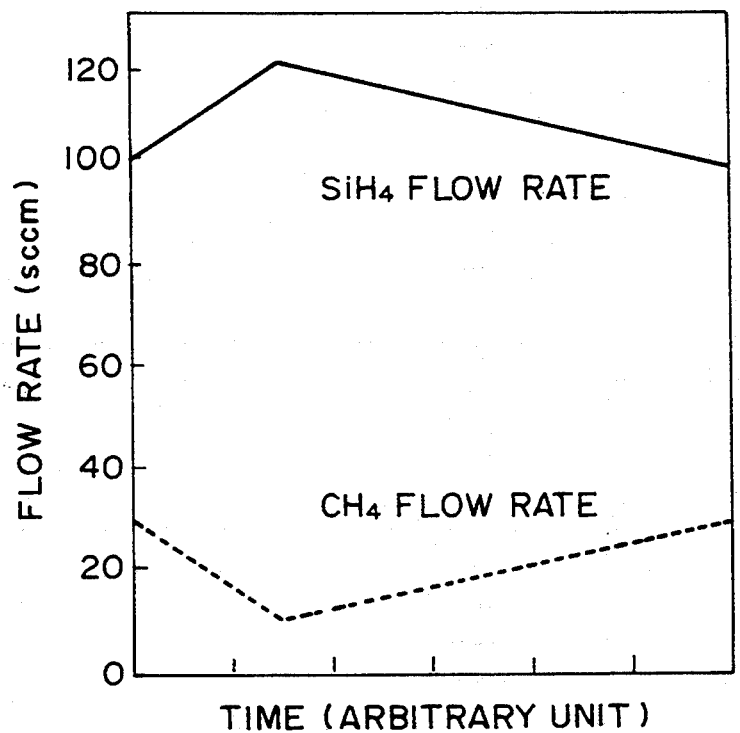
FIG. 6 is a graph showing the flow rate patterns of $SiH_4$ and $CH_4$ gases during formation of an i-type layer.

A solar cell was produced by successively forming the reflecting layer, the reflection increasing layer, the n-type layer, the i-type layer, the i-type Si layer, the p-type layer, the transparent electrode and the collecting electrode on a substrate under the same conditions according to the same procedures as those in EXAMPLE 1 with the exception that when the i-type layer was formed, the flow rates of SiH$_4$ gas and CH$_4$ gas were adjusted by the mass flow controllers in accordance with the flow rate patterns shown in FIG. 6. The thus-produced solar cell is referred to as "SC Comparative Example 1-1" hereinafter.

COMPARATIVE EXAMPLE 1-2

A solar cell was produced by successively forming the reflecting layer, the reflection increasing layer, the n-type layer, the i-type layer, the i-type Si layer, the p-type layer, the transparent electrode, and the collecting electrode on a substrate under the same conditions according to the same procedures as those in EXAMPLE 1 with the exception that when the i-type layer was formed, the $\mu$W power was set to 0.5 W/cm$^3$. The thus-produced solar cell is referred to as "SC Comparative Example 1-2" hereinafter.

COMPARATIVE EXAMPLE 1-3

A solar cell was produced by successively forming the reflecting layer, the reflection increasing layer, the n-type layer, the i-type layer, the i-type Si layer, the p-type layer, the transparent electrode, and the collecting electrode on a substrate under the same conditions according to the same procedures as those in EXAMPLE 1 with the exception that when the i-type layer was formed, the RF power was set to 0.15 W/cm$^3$. The thus-produced solar cell is referred to as "SC Comparative Example 1-3" hereinafter.

COMPARATIVE EXAMPLE 1-4

A solar cell was produced by successively forming the reflecting layer, the reflection increasing layer, the n-type layer, the i-type layer, the i-type Si layer, the p-type layer, the transparent electrode, and the collecting electrode on a substrate under the same conditions according to the same procedures as those in EXAMPLE 1 with the exception that when the i-type layer was formed, the $\mu$W power was set to 0.5 W/cm$^3$, and the RF power was set to 0.55 W/cm$^3$. The thus-produced solar cell is referred to as "SC Comparative Example 1-4" hereinafter.

COMPARATIVE EXAMPLE 1-5

A solar cell was produced by successively forming the reflecting layer, the reflection increasing layer, the n-type layer, the i-type layer, the i-type Si layer, the p-type layer, the transparent electrode, and the collecting electrode on a substrate under the same conditions according to the same procedures as those in EXAMPLE 1 with the exception that when the i-type layer was formed, the internal pressure was adjusted to 0.08 Torr. The thus-produced solar cell is referred to as "SC Comparative Example 1-5" hereinafter.

COMPARATIVE EXAMPLE 1-6

A solar cell was produced by successively forming the reflecting layer, the reflection increasing layer, the n-type layer, the i-type layer, the i-type Si layer, the p-type layer, the transparent electrode, and the collecting electrode on a substrate under the same conditions according to the same procedures as those in EXAMPLE 1 with the exception that when the i-type layer was formed, the deposition rate was set to 3 nm/sec. The thus-produced solar cell is referred to as "SC Comparative Example 1-6" hereinafter.

COMPARATIVE EXAMPLE 1-7

A solar cell was produced by successively forming the reflecting layer, the reflection increasing layer, the n-type layer, the i-type layer, the i-type Si layer, the p-type layer, the transparent electrode, and the collecting electrode on a substrate under the same conditions according to the same procedures as those in EXAMPLE 1 with the exception that when the i-type Si layer was formed, the thickness was adjusted to 40 nm. The thus-produced solar cell is referred to as "SC Comparative Example 1-7" hereinafter.

The initial photoelectric conversion efficiency (photoelectromotive power/incident light power) and the durability characteristic of each of the produced solar cells of SC Example 1 and SC Comparative Examples 1-1 to 1-7 were evaluated. The initial photoelectric conversion efficiency was determined by measuring the V-I characteristics of each of the solar cells which were placed under irradiation of AM-1.5 light (100 mW/cm$^2$).

The results of measurement show the following: the initial photoelectric conversion efficiencies of the solar cells of SC Comparative Examples 1-1 to 1-7 relative to that of the solar cell of SC Example 1:

| | |
|---|---|
| (SC Comparative Example 1-1) | 0.91 |
| (SC Comparative Example 1-2) | 0.63 |
| (SC Comparative Example 1-3) | 0.80 |
| (SC Comparative Example 1-4) | 0.65 |
| (SC Comparative Example 1-5) | 0.77 |
| (SC Comparative Example 1-6) | 0.64 |
| (SC Comparative Example 1-7) | 0.80 |

The durability characteristic was evaluated by placing each of the solar cells in the dark at a humidity of 70% and a temperature of 60° C. applying vibrations with an amplitude of 1 mm at 3600 rpm thereto for 24 hours, and then determining the decrease in the photoelectric conversion efficiency under irradiation of AM 1.5 light (100 mW/cm$^2$). The decrease in the photoelectric conversion efficiency was calculated by the following equation:

(photoelectric conversion efficiency after durability test)/(initial photoelectric conversion efficiency)

As a result of measurement, each of the solar cells (SC Comparative Example 1-1) to (SC Comparative Example 1-7) show the following decrease in the photoelectric conversion efficiency relative to that of the solar cell (SC Example 1):

| | |
|---|---|
| (SC Comparative Example 1-1) | 0.90 |
| (SC Comparative Example 1-2) | 0.82 |
| (SC Comparative Example 1-3) | 0.75 |
| (SC Comparative Example 1-4) | 0.81 |
| (SC Comparative Example 1-5) | 0.70 |
| (SC Comparative Example 1-6) | 0.67 |
| (SC Comparative Example 1-7) | 0.82 |

A stainless substrate and a barium borosilicate glass (7059 produced by Corning Co., Ltd.) substrate were used, and an i-type layer of 1 μm was formed on each of the substrates under the same conditions as those employed for forming the i-type layer in EXAMPLE 1 with the exception that the flow rates of SiH$_4$ gas and CH$_4$ gas were the values shown in Table 2 to form a sample for measuring physical properties. The thus-produced samples are respectively referred to as (SP1-1) to (SP1-7).

The band gap (Eg) and composition of each of the samples for measuring physical properties were analyzed for determining the relationship between the composition ratio of Si (silicon) atoms to C (carbon) atoms and the band gap. The results of analysis of the band gap and the composition of each of the samples are shown in Table 2 and FIG. 7.

The band gap of an i-type layer was determined by measuring the dependency of the absorption coefficient of an i-type layer on wavelength, using a glass substrate having an i-type layer formed thereon placed in a spectrophotometer (model 330produced by Hitachi, Ltd.) in accordance with the method described in "Amorphous Solar Cells" Kiyoshi Takahashi and Makoto Konagai, p109. The composition ratio of Si atoms to C atoms was measured by using a stainless substrate having the i-type layer formed thereon placed in an Auger electron spectroscopic analyzer (JAMP-3 produced by Nihon Densi).

A sample for measuring the band gap was also produced by forming an-i-type Si layer of 1 μm on a barium borosilicate glass substrate under the same conditions as those employed for producing the i-type Si layer in EXAMPLE 1. The sample is referred to as (SP1-8) hereinafter. As a result of measurement of the band gap of the produced sample by the above measurement method, the band gap was 1.75 eV.

The component ratio of Si atoms to C atoms in the i-type layer of each of the solar cells (SC Example 1) and (SC Comparative Example 1-1) to (SC Comparative Example 1-7) in the direction of the thickness thereof was measured by the same method as the above-described method of composition analysis.

Figure 8:
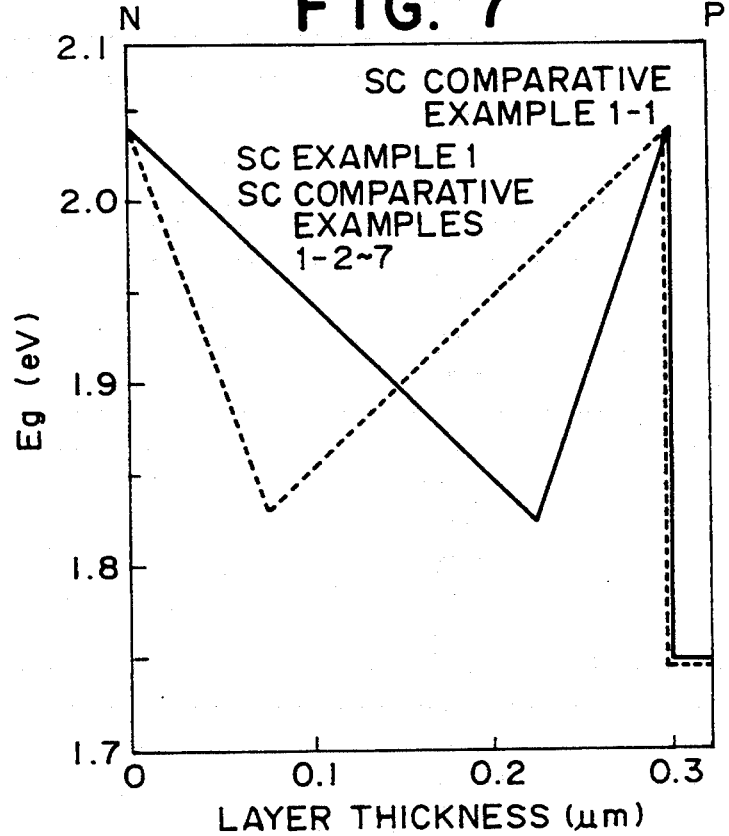
FIG. 8 is a conceptual view showing changes in the band gap in the direction of the layer thickness.

The changes of the band gap in the i-type layer and the i-type Si layer in the direction of the thickness thereof were determined from the relationship between the component ratio of Si atoms to C atoms and the band gap, which were determined by using the samples (SP1-1) to (SP1-7) and (SP1-8). The results obtained are shown in FIG. 8. As is obvious from FIG. 8, the minimum band gap of each of the solar cells (SC Example 1) and (SC Comparative Example 1-2) to (SC Comparative Example 1-7) is at a position between the center of the i-type layer and the p/i interface, and the minimum band gap of the solar cell (SC Comparative Example 1-1) is at a position between the center of the i-type layer and the n/i interface.

It is thus found that the changes in the band gap of each of the solar cells (SC Example 1) and (SC Comparative Example 1-1) to (SC Comparative Example 1-7) in the direction of the thickness thereof depend upon the ratio of the Si-containing raw material gas (in this case, SiH$_4$ gas) to the C-containing raw material gas (in this case, CH$_4$ gas), which are introduced into the deposition chamber.

COMPARATIVE EXAMPLE 1-8

Some non-single crystal silicon carbide solar cells were produced under the same conditions as those employed in EXAMPLE 1 with the exception that the μW power and the RF power which were introduced for forming the i-type layer in EXAMPLE 1 were changed to various values.

Figure 9:
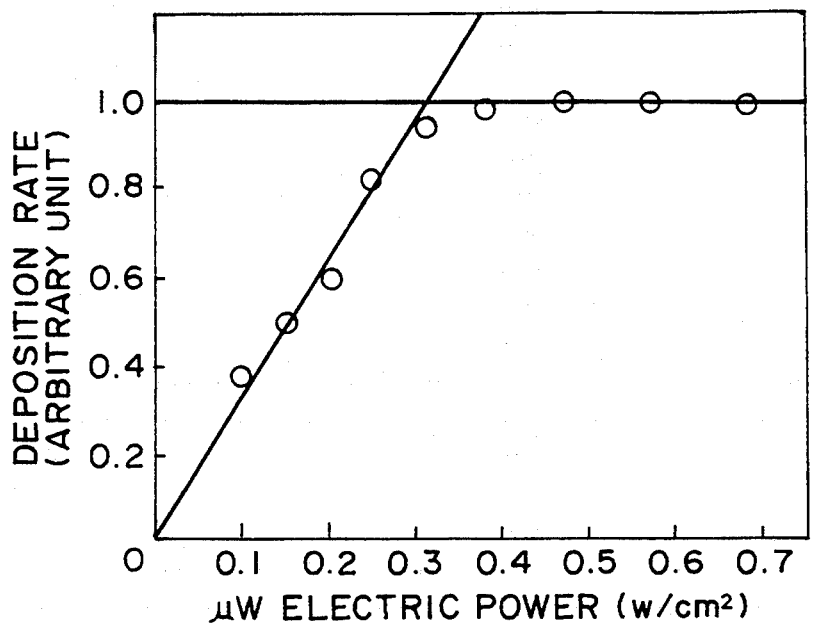
FIG. 9 is a graph showing the relationship between $\mu W$ electric power and the deposition rate.

FIG. 9 is a graph showing the relationship between the μW power and the deposition rate. It is found from the graph that the deposition rate is independent of the RF power, and becomes constant with a μW power of 0.32 W/cm$^3$ or more, and that the raw material gases, i.e., SiH$_4$ gas and CH$_4$ gas, are 100% decomposed by this electric power.

Figure 10:
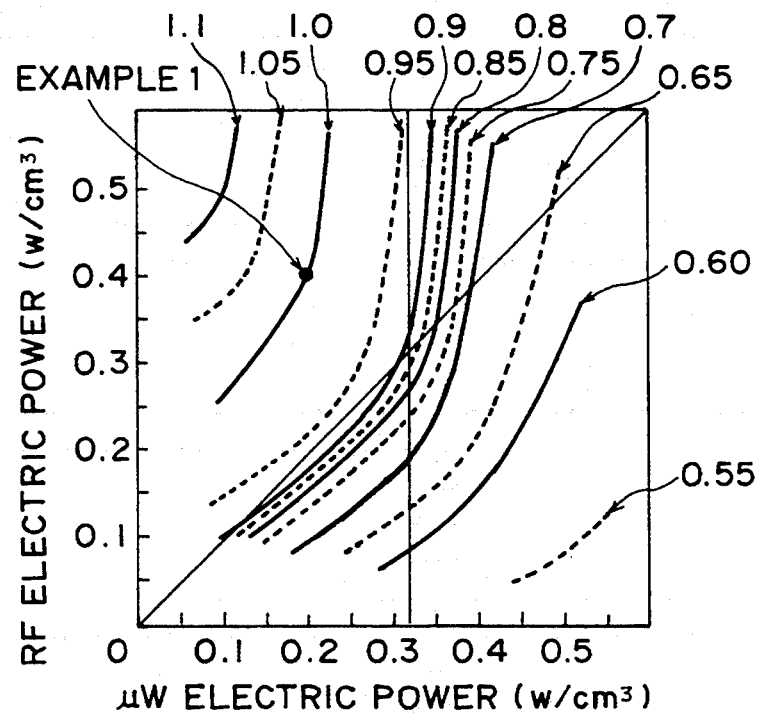
FIG. 10 is a graph showing the dependency of the initial photoelectric conversion efficiency on $\mu W$ electric power and RF electric power.

FIG. 10 shows the results of measurement of the initial photoelectric conversion efficiency of the produced solar cells to which light of AM 1.5 (100 mW/cm$^2$) was applied. In FIG. 10, the curves are envelopes which respectively show the rates of the initial photoelectric conversion efficiencies of the solar cells on the assumption that the initial photoelectric conversion efficiency of EXAMPLE 1 is 1. As seen from FIG. 10, the initial photoelectric conversion efficiency is significantly increased when the μW power is lower than the μW electric power (0.32 W/cm$^3$) for 100% decomposition of the SiH$_4$ gas and CH$_4$ gas, and the RF power is greater than the μW power.

COMPARATIVE EXAMPLE 1-9

Some non-single crystal silicon carbide solar cells were produced under the same conditions in EXAMPLE 1 with the exception that when the i-type layer was formed, the flow rates of SiH$_4$ gas and CH$_4$ gas, which were introduced into the deposition chamber, were changed to 50 sccm and 10 sccm, respectively, H$_2$ gas was not introduced, and the µW power and the RF power were changed to various values.

As a result of examination of the relationship between the deposition rate and the µW power and the RF power, it was found that the deposition rate is independent of the RF power and is constant with a µW power of 0.18 W/cm$^3$ or more, and that the raw materials gases, i.e. SiH$_4$ gas and CH$_4$ gas, are 100% decomposed with this µW electric power, as in Comparative Example 1-8. The measurement of the initial photoelectric conversion efficiency of each of the solar cells to which AM 1.5 light was applied produced the same results as those shown in FIG. 10. Namely, it was found that the initial photoelectric conversion efficiency is significantly increased when the µW power is smaller than that (0.18 W/cm$^3$) for 100% decomposing SiH$_4$ gas and CH$_4$ gas, and when the RF power is greater than the µW power.

COMPARATIVE EXAMPLE 1-10

Some non-single crystal silicon carbide solar cells were produced under the same conditions in EXAMPLE 1 with the exception that when the i-type layer was formed, the flow rates of SiH$_4$ gas, CH$_4$ gas, and H$_2$ gas, which were introduced into the deposition chamber, were changed to 200 sccm, 50 sccm, and 500 sccm, respectively, the heater was set so that the substrate temperature was 300° C., and the µW power and the RF power were changed to various values.

As a result of examination of the relationship between the deposition rate and the µW power and the RF power, it was found that the deposition rate is independent of the RF power and is constant with a µW power of 0.65 W/cm$^3$ or more, and that the raw materials gases, i.e. SiH$_4$ gas and CH$_4$ gas, are 100% decomposed with this µW power, as in Comparative Example 1-8. The measurement of the initial photoelectric conversion efficiency of each of the solar cells to which AM 1.5 light was applied produced the same results as those shown in FIG. 10. Namely, it was found that the initial photoelectric conversion efficiency is significantly increased when the µW power is smaller than that (0.65 W/cm$^3$) for 100% decomposing SiH$_4$ gas, and when the RF power is greater than the µW power.

COMPARATIVE EXAMPLE 1-11

Some non-single crystal silicon carbide solar cells were produced under the same conditions in EXAMPLE 1 with the exception that when the i-type layer was formed, the pressure in the deposition chamber was changed to various values within the range of 3 mTorr to 200 mTorr.

The measurement of the initial photoelectric conversion efficiency of each of the solar cells to which AM 1.5 light was applied produced the results shown in FIG. 11. It was found from the results that the initial photoelectric conversion efficiency is significantly decreased when the pressure is 50 mTorr or more.

COMPARATIVE EXAMPLE 1-12

Some non-single crystal silicon carbide solar cells were produced under the same conditions in EXAMPLE 1 with the exception that when the i-type Si layer was formed, the flow rate of the raw material gas, i.e. SiH$_4$ gas, and the RF electric power introduced were changed to various values, and the deposition rate of the i-type Si layer was changed.

The measurement of the initial photoelectric conversion efficiency of each of the solar cells to which AM 1.5 light was applied showed that the initial photoelectric conversion efficiency is significantly decreased when the deposition rate is 2 nm/sec or more.

COMPARATIVE EXAMPLE 1-13

Some non-single crystal silicon carbide solar cells were produced under the same conditions in EXAMPLE 1 with the exception that when the i-type Si layer was formed, the thickness of the i-type Si layer was changed.

The measurement of the initial photoelectric conversion efficiency of each of the solar cells to which AM 1.5 light was applied showed that the initial photoelectric conversion efficiency is significantly decreased when the thickness of the i-type Si layer is 30 nm or more.

As seen from the results of Comparative Examples 1-1 to 1-13, the solar cell of SC Example 1 of the present invention has better characteristics than those of the comparative solar cells SC Comparative Example 1-1 to SC Comparative Example 1-7. It was also provided that the characteristics of the solar cells are independent of the production conditions such as the flow rates of the raw material gases, the substrate temperature and so on under a pressure of 50 mTorr or more.

EXAMPLE 2

As in Example 1, several solar cells were produced by changing the minimum value of the bandgap (Eg), the pattern thereof, and the position of the minimum bandgap in the direction of the layer thickness. The initial photoelectric conversion efficiency and durability characteristics of these solar cells were examined in a similar manner to Example 1. It should be noted that the conditions, except for the changes in the flow rates of SiH$_4$ gas and CH$_4$ gas of the i-type layer, were similar to Example 1.

Figure 12:
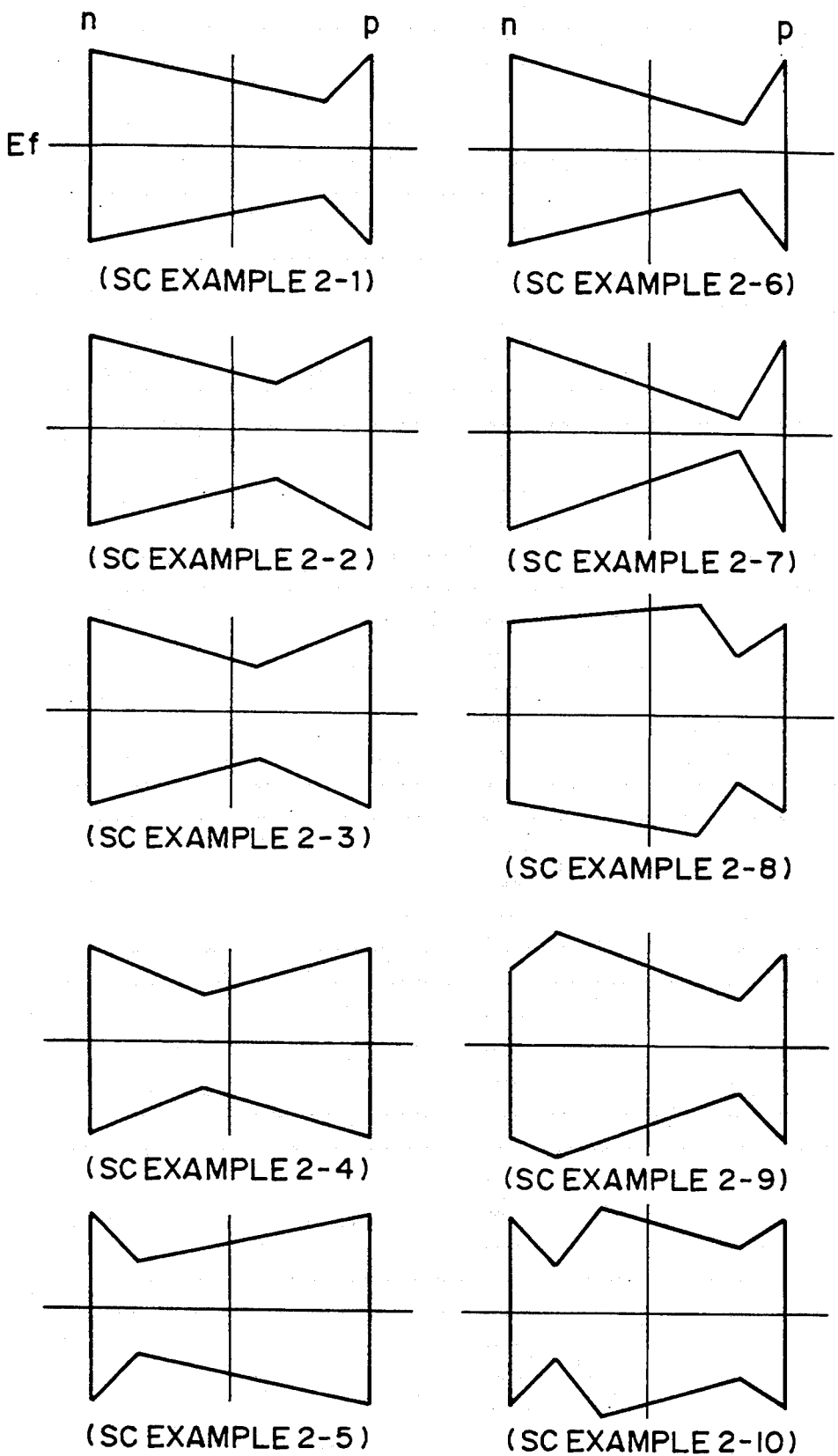
FIG. 12 is a conceptual view showing changes in the band gap of each solar cell example in the direction of the layer thickness thereof.

FIG. 12 shows the change in the bandgap of the solar cells in the direction of the layer thickness when the flow rates of SiH$_4$ gas and CH$_4$ gas are changed. (SC Example 2-1) to (SC Example 2-5) were obtained by changing the position of the minimum bandgap in the direction of the layer thickness. As the bandgap is shifted from (SC Example 2-1) to (SC Example 2-5), the position of the minimum bandgap is changed from the p/i interface to the n/i interface. (SC Example 2-5) and (SC Example 2-6) were obtained by changing the minimum bandgap of (SC Example 2-1). (SC Example 2-8) to (SC Example 2-10) were obtained by changing the patterns of the bandgap.

The results of examining the initial photoelectric conversion efficiency and durability characteristics are shown in Table 3. The values in the table are standardized on the basis of (SC Example 2-1). As can be seen from the results, regardless of the minimum bandgap and the bandgap pattern, the solar cells of the present invention are superior to the other solar cells in which the bandgap of the i-type layer changes smoothly in the direction of the layer thickness and in which the minimum bandgap is placed toward the p/i interface from the center position of the i-type layer.

EXAMPLE 3

A solar cell in which the p-type layer was formed by employing the microwave CVD process was produced. The solar cell of FIG. 1 was produced under similar conditions, manner, and processes as those in Example 1 except for the following differences. During formation of the p-type layer, 8 sccm of $SiH_4$ gas, 5 sccm of $CH_4$ gas, 300 sccm of $H_2$ gas, and 80 sccm of $B_2H_6/H_2$ gas were flowed into the deposition chamber; no RF power but only 0.40 $W/cm^3$ of $\mu W$ power was introduced; and a pressure of 0.02 Torr was used.

As a result, it was verified that the resultant solar cell (SC Example 3) as well as (SC Example 1) have better initial photoelectric conversion efficiency and durability characteristics than the comparative solar cells (SC Comparative Example 1-1) to (SC Comparative Example 1-7).

EXAMPLE 4

A solar cell obtained by reversing the stacking order of the n-type layer and the p-type layer was produced. The conditions for forming the p-type layer, the i-type Si layer, the i-type layer, and the n-type layer are shown in Table 4. The deposition speed of the i-type Si layer was 0.1 nm/sec. In forming the i-type layer, the flow rates of $SiH_4$ gas and $CH_4$ gas were changed as shown in FIG. 6 so that the minimum bandgap was placed in the vicinity of the p/i interface. The substrate and the layers other than the semicondcutor layers were produced under similar conditions and manner as those in Example 1.

As a result, it was verified that the resultant solar cell (SC Example 4) as well as (SC Example 1) have better initial photoelectric conversion efficiency and durability characteristics than the comparative solar cells (SC Comparative Example 1-1) to (SC Comparative Example 1-7).

EXAMPLE 5

A non-single crystal silicon carbide solar cell was produced such that it had a thickness of 20 nm in the region in which a bandgap maximum is present at the p/i interface side of the i-type layer.

Figure 13A:
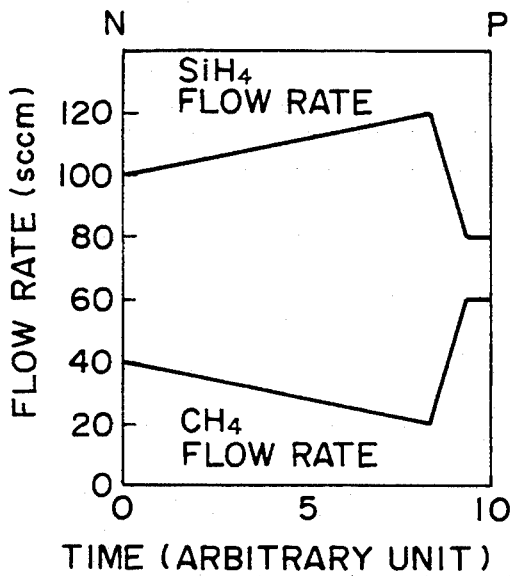
FIGS. 13A to 13D are views showing the flow rate patterns and changes in the band gap in the direction of the layer thickness.
Figure 13B:
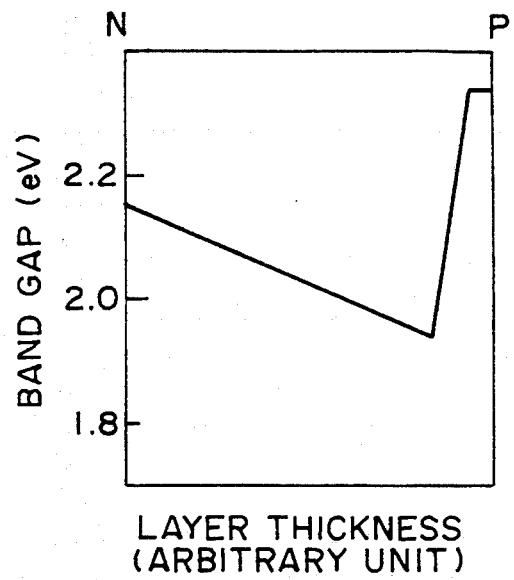

The change in the flow rate of the i-type layer is shown in FIG. 13A. The other layers, except for the i-type layer, were produced under similar conditions and manner as those in Example 1. Then, the composition of the solar cell was analyzed in a similar manner to Example 1. The change in the bandgap in the direction of the layer thickness of the i-type layer was examined on the basis of FIG. 7. The results are shown in FIG. 13B.

As a result, it was verified that the resultant solar cell (SC Example 5) as well as (SC Example 1) has better initial photoelectric conversion efficiency and durability characteristics than the comparative solar cells (SC Comparative Example 1-1) to (SC Comparative Example 1-7).

COMPARATIVE EXAMPLE 5

Several non-single crystal silicon carbide solar cells were produced by variously changing the thickness in the region in which a bandgap maximum is present at the p/i interface side of the i-type layer. They were produced under similar conditions and manner to Example 5, except for the thickness of the region.

The initial photoelectric conversion efficiency and durability characteristics of the resultant solar cells were examined. As a result, it was confirmed that such solar cells having a region of maximum bandgap thickness of between 1 nm and 30 nm have better initial photoelectric conversion efficiency and durability characteristics than the solar cell (SC Example 1) of Example 1.

EXAMPLE 6

Figure 13C:
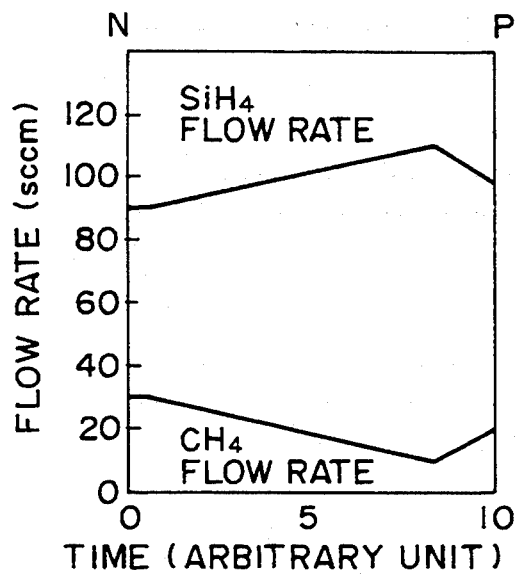
Figure 13D:
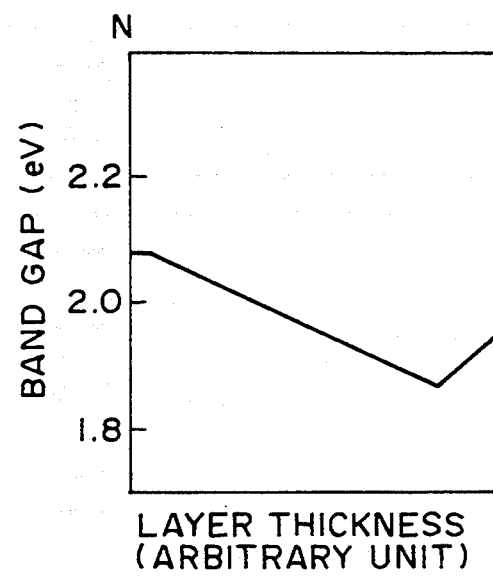

A non-single crystal silicon carbide solar cell was produced such that it had a thickness of 15 nm in the region in which a bandgap maximum is present in the vicinity of the n/i interface of the i-type layer. The change in the flow rate of the i-type layer is shown in FIG. 13C. The layers, except for the i-type layer, were produced under similar conditions and manner as those in Example 1. Then, the composition of the solar cell was analyzed in a similar manner to Example 1. The change in the bandgap in the direction of the layer thickness of the i-type layer was examined on the basis of FIG. 7. The results are shown in FIG. 13D.

It was verified that the result out solar cell (SC Example 6) as well as (SC Example 1) have better initial photoelectric conversion efficiency and durability characteristics than the comparative solar cells (SC Comparative Example 1-1) to (SC Comparative Example 1-7).

COMPARATIVE EXAMPLE 6

Several non-single crystal silicon carbide solar cells were produced by variously changing the thickness in the region in which a bandgap maximum is present at the n/i interface side of the i-type layer. They were produced under similar conditions and manner as those in Example 6, except for the thickness of the region.

The initial photoelectric conversion efficiency and durability characteristics of the resultant solar cells were examined. As a result, it was validated that such solar cells having a region thickness of maximum bandgap of between 1 nm and 30 nm have better initial photoelectric conversion efficiency and durability characteristics than the solar cell (SC Example 1) of Example 1.

EXAMPLE 7

Figure 14:
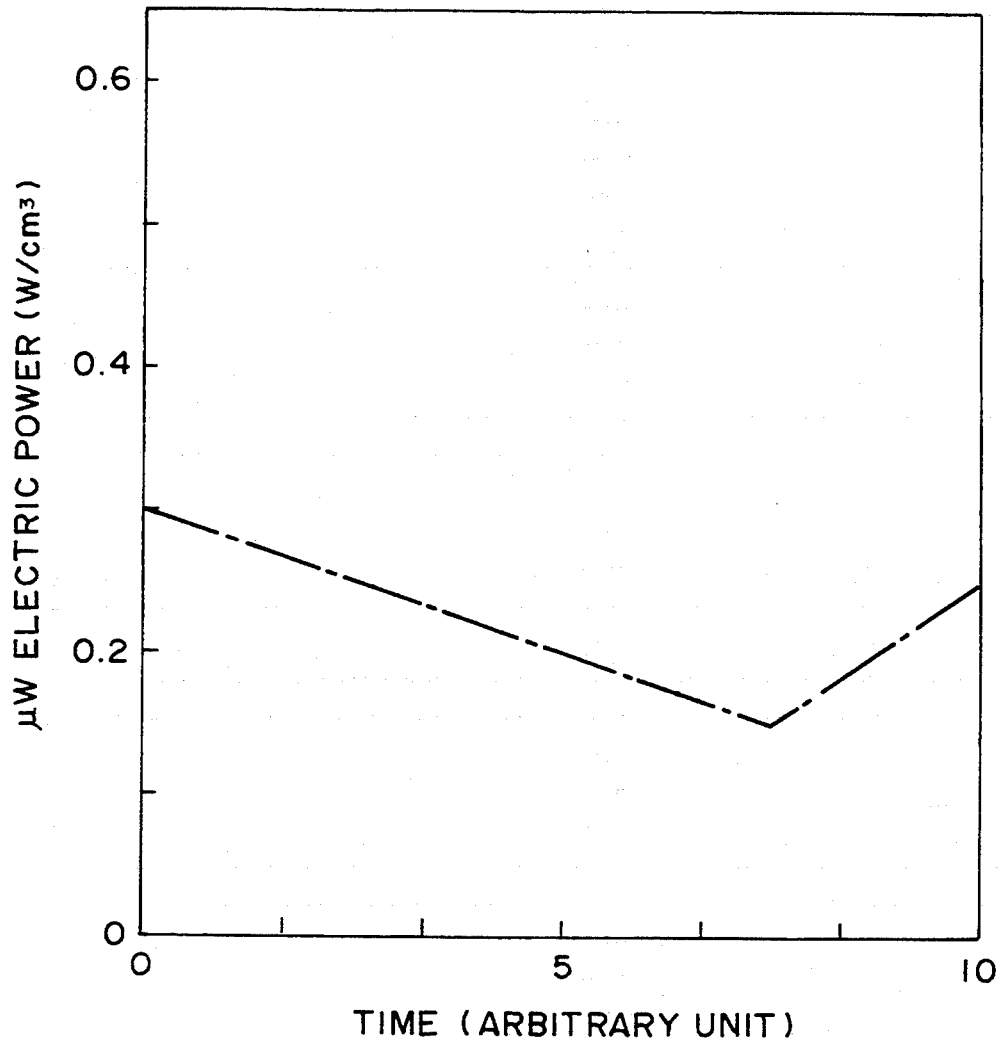
FIG. 14 is a graph showing changes in $\mu W$ electric power with time.

During format ion of the i-type layer, similar conditions, manner, and processes were employed as those used in Example 1, except that the $\mu W$ power was changed as illustrated in FIG. 14. The layer thickness of the i-type layer of the resultant solar cell (SC Example 7) was 340 nm. It was validated that the resultant solar cell (SC Example 7) as well as (SC Example 1) have better initial photoelectric conversion efficiency and durability characteristics than the comparative solar cells (SC Comparative Example 1-1) to (SC Comparative Example 1-7).

EXAMPLE 8

A non-single crystal silicon carbide solar cell with an i-type layer containing oxygen atoms was produced. In the formation of the i-type layer, similar conditions, manner, and processes as those in Example 1 were employed, except that 10 sccm of $O_2/He$ gas, in addition to the gases flowing in Example 1, was introduced to the deposition chamber 401. It was confirmed that the resultant solar cell (SC Example 8) as well as (SC Example 1) have better initial photoelectric conversion efficiency and durability characteristics than the comparative solar cells (SC Comparative Example 1-1) to (SC Comparative Example 1-7).

The oxygen atom content in the i-type layer was measured by using a secondary ion mass analyzer (SIMS). As a result, it was confirmed that $2 \times 10^{19}$ cm$^{-3}$ oxygen atoms were uniformly distributed.

EXAMPLE 9

A non-single crystal silicon carbide solar cell with an i-type layer containing nitrogen atoms was produced. In the formation of the i-type layer, similar conditions, manner, and processes as those in Example 1 were employed, except that 5 sccm of NH$_3$/H$_2$ gas in addition to the gases flowing in Example 1 was introduced to the deposition chamber 401. It was confirmed that the resultant solar cell (SC Example 9) as well as (SC Example 1) has better initial photoelectric conversion efficiency and durability characteristics than the comparative solar cells (SC Comparative Example 1-1) to (SC Comparative Example 1-7).

The nitrogen atoms content in the i-type layer was measured by using the SIMS. As a result, it was confirmed that $3 \times 10^{17}$ cm$^{-3}$ nitrogen atoms were uniformly distributed.

EXAMPLE 10

A non-single crystal silicon carbide solar cell with an i-type layer containing oxygen and nitrogen atoms was produced. In the formation of the i-type layer, similar conditions, manner, and processes as those in Example 1 were employed, except that 5 sccm of O$_2$/He gas and 5 sccm of NH$_3$/H$_2$ gas, in addition to the gases flowing in Example 1, were introduced to the deposition chamber 401.

As a result, it was confirmed that the resultant solar cell (SC Example 10) as well as (SC Example 1) has better initial photoelectric conversion efficiency and durability characteristics than the comparative solar cells (SC Comparative Example 1-1) to (SC Comparative Example 1-7).

The oxygen atom content and the nitrogen atom content of the i-type layer were measured by using the SIMS. As a result, it was confirmed that $1 \times 10^{19}$ cm$^{-3}$ oxygen atoms and $3 \times 10^{17}$ cm$^{-3}$ nitrogen atoms were uniformly distributed.

EXAMPLE 11

Figure 15A:
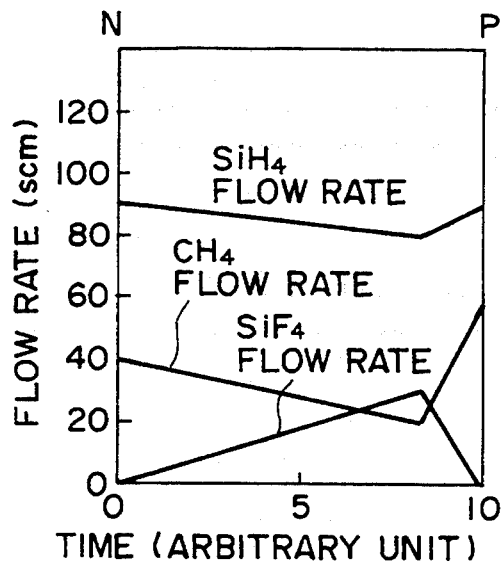
FIGS. 15A to 15C are graphs showing the flow rate, the band gap, and the distributions of silicon atoms and hydrogen atoms.
Figure 15B:
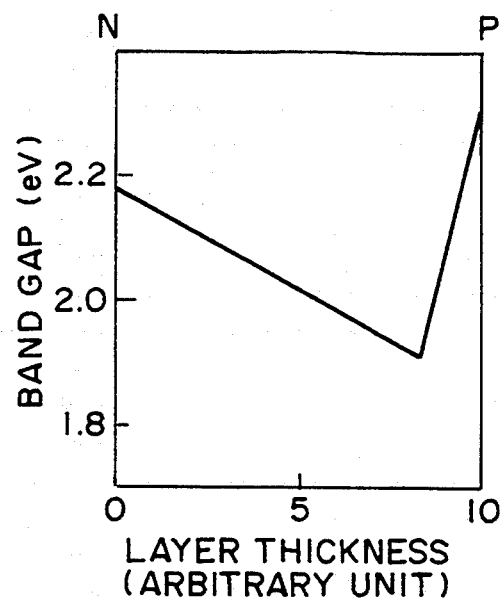
Figure 15C:
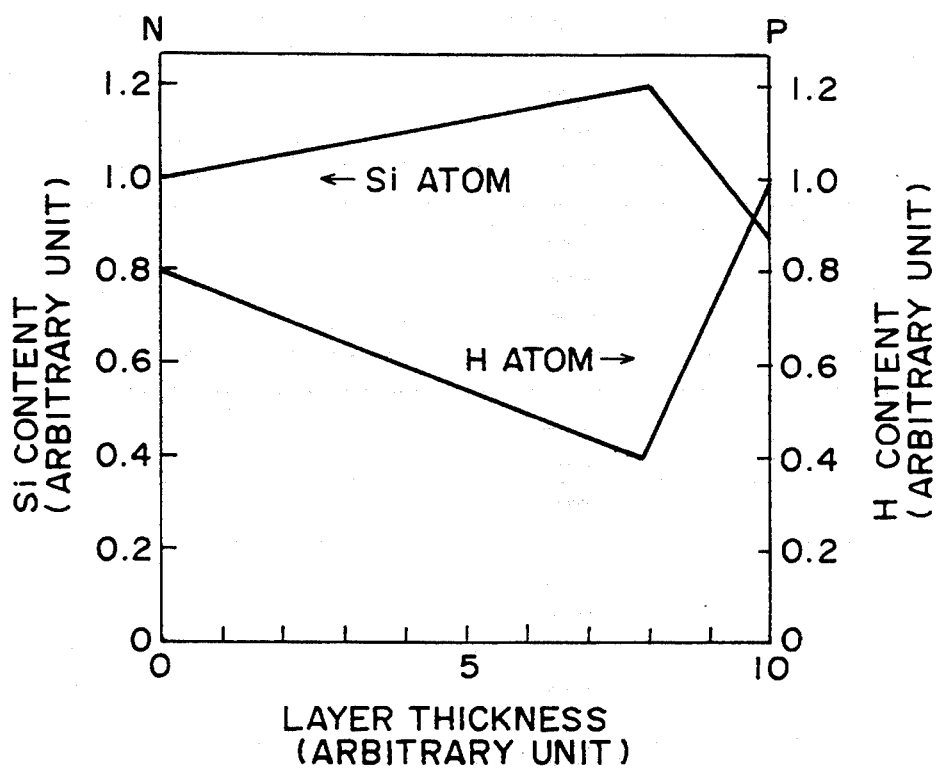

A non-single crystal silicon carbide solar cell was produced such that the hydrogen content in the i-type layer changed in accordance with the silicon content. The O$_2$/He gas cylinder was exchanged for a SiF$_4$ gas (having a purity of 99.999%) cylinder. In the formation of the i-type layer, the flow rates of SiH$_4$ gas, CH$_4$ gas, and SiF$_4$ gas were changed in accordance with the flow rate patterns of FIG. 15A. The change in the bandgap in the direction of the layer thickness of the solar cell (SC Example 11) was examined in a similar manner to Example 1. The results are shown in FIG. 15B. Moreover, the hydrogen atom content and the silicon atom content were analyzed in the direction of the thickness layer by utilizing the SIMS. As a result, it was confirmed that the hydrogen atoms distribution in the direction of the thickness layer was in opposite relation to that of the silicon atoms, as illustrated in FIG. 15C.

The initial photoelectric conversion efficiency and durability characteristics of the solar cell (SC Example 11) were examined. As a result, it was validated that the resultant solar cell (SC Example 11) as well as (SC Example 1) have better initial photoelectric conversion efficiency and durability characteristics than the comparative solar cells (SC Comparative Example 1-1) to (SC Comparative Example 1-7).

EXAMPLE 12

A non-single crystal silicon carbide solar cell (SC Example 12) was produced in similar manner and processes as those in Example 1, except that when the semiconductor layers of the non-single crystal silicon carbide solar cell of FIG. 1 were formed by utilizing the system employing the microwave plasma CVD apparatus shown in FIG. 4, silicon containing gas (SiH$_4$ gas) and carbon-containing gas (CH$_4$ gas) were mixed at a distance of 1.5 m away from the deposition chamber.

As a result, it was confirmed that the resultant solar cell (SC Example 12) has even better initial photoelectric conversion efficiency and durability characteristics than (SC Example 1).

EXAMPLE 13

Figure 16:
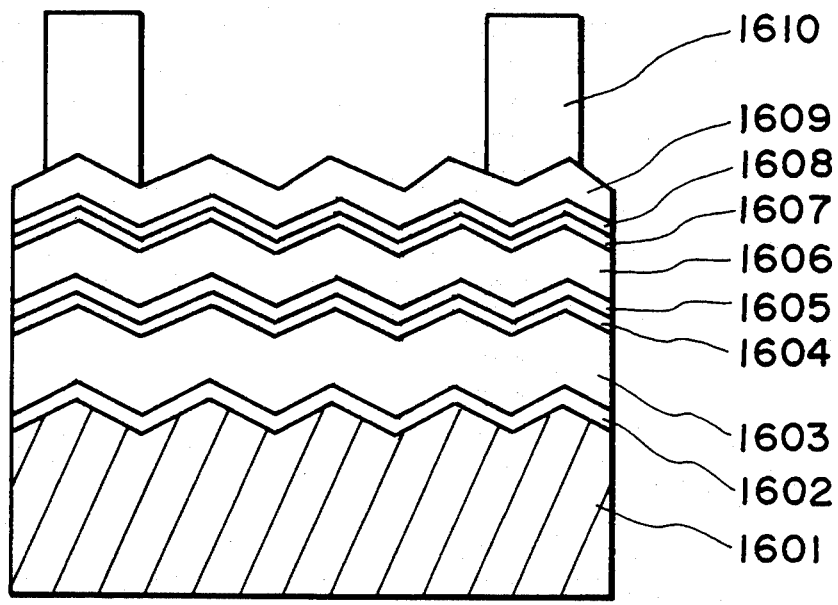
FIG. 16 is a schematic sectional view illustrating the layer structure of a tandem cell type solar cell.

A tandem type solar cell having non-single crystal silicon carbide semiconductor layers shown in FIG. 16 was produced by utilizing the system employing the microwave plasma CVD apparatus of the present invention illustrated in FIG. 4. First, a substrate 1601 was produced. A stainless substrate having a size of 50×50 mm was ultrasonic-washed with acetone and isopropanol, and then dried as in Example 1.

A reflecting layer composed of Ag having a thickness of 0.3 μm was formed on the stainless substrate by employing a sputtering process. In forming the reflecting layer, the substrate temperature was set at 350° C., and the side of the substrate was unevenly textured. A reflection increasing layer composed of ZnO having a thickness of 1.0 μm was further formed on the reflecting layer at a substrate temperature of 350° C.

Then, preparations for forming films were made by employing a similar processes as those in Example 1. In a similar manner as in Example 1, a first n-type layer 1602 was first formed on the substrate, and then, a first i-type layer 1603, a first p-type layer 1604, a second n-type layer 1605, a second i-type layer 1606, an i-type Si layer 1607, and a second p-type layer 1608 were formed successively in order. In forming the second i-type layer 1606, the flow rates of SiH$_4$ gas and CH$_4$ gas were changed in accordance with the change in the flow rates shown in FIG. 5, and the i-type Si layer 1607 was formed at a deposition speed of 0.15 nm/sec.

Then, as in Example 1, an ITO (In$_2$O$_3$+SnO$_2$) transparent electrode 1609 having a layer thickness of 80 nm and a Cr collecting electrode 1610 having a layer thickness of 10 μm were deposited on the second p-type layer 1608 by the vacuum deposition process, which is generally known. Thus, a tandem type solar cell was produced by employing the microwave plasma CVD process.

The resultant solar cell is referred to as SC Example 13. The conditions for producing the respective semiconductor layers are shown in Table 5.

COMPARATIVE EXAMPLE 13-1

A tandem type solar cell was produced using a similar processes as those in Example 13, except that in forming the second i-type layer 1606 illustrated in FIG. 16, the flow rates of SiH$_4$ gas and CH$_4$ gas were changed in accordance with the change in the flow rates shown in FIG. 6. The resulting solar cell is referred to as SC Comparative Example 13-1.

COMPARATIVE EXAMPLE 13-2

A tandem type solar cell was produced using similar processes as those in Example 13, except that in forming the second i-type layer 1606 shown in FIG. 16, the μW electric power was changed to 0.5 W/cm$^3$. The resulting solar cell is referred to as SC Comparative Example 13-2.

COMPARATIVE EXAMPLE 13-3

A tandem type solar cell was produced using similar processes as those in Example 13, except that in forming the second i-type layer 1606 shown in FIG. 16, the RF power was changed to 0.15 W/cm$^3$. The resulting solar cell is referred to as SC Comparative Example 13-3.

COMPARATIVE EXAMPLE 13-4

A tandem type solar cell was produced using similar processes as those in Example 13, except that in forming the second i-type layer 1606 shown in FIG. 16, the μW power and RF power were changed to 0.5 W/cm$^3$ and 0.55 W/cm$^3$, respectively. The resulting solar cell is referred to as SC Comparative Example 13-4.

COMPARATIVE EXAMPLE 13-5

A tandem type solar cell was produced using similar processes as those in Example 13, except that in forming the second i-type layer 1606 shown in FIG. 16, the pressure in the deposition chamber 401 was maintained at 0.1 Torr. The resulting solar cell is referred to as SC Comparative Example 13-5.

COMPARATIVE EXAMPLE 13-6

A tandem type solar cell was produced using similar processes as those in Example 13, except that in forming the i-type Si layer 1607 shown in FIG. 16, the deposition speed was changed to 3 nm/sec. The resulting solar cell is referred to as SC Comparative Example 13-6.

COMPARATIVE EXAMPLE 13-7

A tandem type solar cell was produced using similar processes as those in Example 13, except that in forming the i-type Si layer 1607 shown in FIG. 16, the layer thickness was changed to 40 nm. The resulting solar cell is referred to as SC Comparative Example 13-7.

The initial photoelectric conversion efficiency and durability characteristics of these resultant tandem type solar cells were examined in a manner similar to Example 1. As a result, it was confirmed that (SC Example 13) has better initial photoelectric conversion efficiency and durability characteristics than the comparative tandem type solar cells (SC Comparative Example 13-1) to (SC Comparative Example 13-7).

EXAMPLE 14

Figure 17:
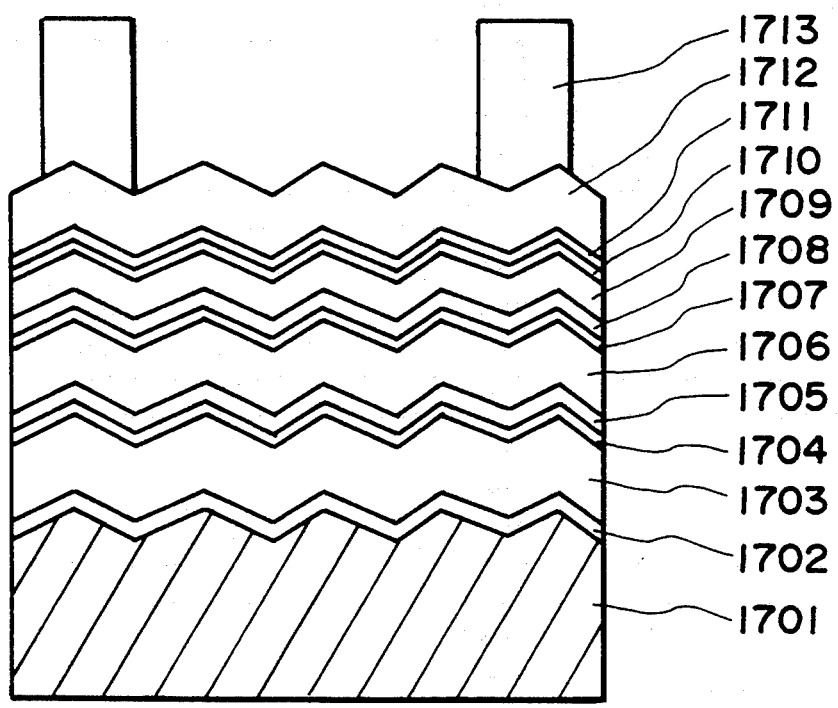
FIG. 17 is a schematic sectional view illustrating the layer structure of a triple cell type tandem solar cell.

A triple type solar cell having non-single crystal silicon carbide semiconductor layers shown in FIG. 17 was produced by utilizing the system employing the microwave plasma CVD apparatus of the present invention illustrated in FIG. 4. First, a substrate 1701 was produced. A stainless substrate having a size of 50×50 mm$^2$ was ultrasonic-washed with acetone and isopropanol, and then dried as in Example 1.

As in Example 13, a reflecting layer composed of Ag having a thickness of 0.3 μm was formed on the stainless substrate by employing a sputtering process. In forming the reflecting layer, the substrate temperature was set at 350° C., and the side of the substrate was unevenly textured. A reflection increasing layer composed of ZnO having a thickness of 1.0 μm was further formed on the reflecting layer at a substrate temperature of 350° C.

First, a GeH$_4$ gas (having a purity of 99.999%) cylinder which replaced the NH$_3$/H$_3$ gas cylinder was connected. Then, preparations for forming films were made by employing a similar processes as those in Example 1. In a similar manner and using similar processes as those in Example 1, a first n-type layer 1702 was first formed on the substrate, and then, a first i-type layer 1703 (the ratio of GeH$_4$/SiH$_4$ was changed as in 0→0.2→0.4→0.2→0), a first p-type layer 1704, a second n-type layer 1705, a second i-type layer 1706, a second p-type layer 1707, a third n-type layer 1708, a third i-type layer 1709, an i-type Si layer 1710, and a third p-type layer 1711 were formed successively in order. In forming the third i-type layer 1709, the flow rates of SiH$_4$ gas and CH$_4$ gas were changed in accordance with the change in the flow rates shown in FIG. 5, and the i-type Si layer 1710 was formed at a deposition speed of 0.15 nm/sec.

Then, as in Example 1, an ITO (In$_2$O$_3$+SnO$_2$) transparent electrode 1712 having a layer thickness of 80 nm, and then a Cr collecting electrode 1713 having a layer thickness of 10 μm were deposited on the third p-type layer 1711 by a vacuum deposition process, which is generally known. Thus, the triple type solar cell was produced by employing the microwave plasma CVD process.

The resultant solar cell is referred to as SC Example 14. The conditions for producing the respective semiconductor layers are shown in Table 6.

COMPARATIVE EXAMPLE 14-1

A triple type solar cell was produced using similar processes as those in Example 14, except that in forming the third i-type layer 1709 illustrated in FIG. 17, the flow rates of SiH$_4$ gas and CH$_4$ gas were changed in accordance with the change in the flow rates shown in FIG. 6. The resulting solar cell is referred to as SC Comparative Example 14-1.

COMPARATIVE EXAMPLE 14-2

A triple type solar cell was produced using similar processes as those in Example 14, except that in forming the third i-type layer 1709 shown in FIG. 17, the μW power was changed to 0.5 W/cm$^3$. The resulting solar cell is referred to as SC Comparative Example 14-2.

COMPARATIVE EXAMPLE 14-3

A triple type solar cell was produced using similar processes as those in Example 14, except that in forming the third i-type layer 1709 shown in FIG. 17, the RF power was changed to 0.15 W/cm$^3$. The resulting solar cell is referred to as SC Comparative Example 14-3.

COMPARATIVE EXAMPLE 14-4

A triple type solar cell was produced using similar processes as those in Example 14, except that in forming the third i-type layer 1709 shown in FIG. 17, the μW power and RF power were changed to 0.5 W/cm$^3$ and 0.55 W/cm$^3$, respectively. The resulting solar cell is referred to as SC Comparative Example 14-4.

COMPARATIVE EXAMPLE 14-4

A triple type solar cell was produced using similar processes as those in Example 14, except that in forming the third i-type layer 1709 shown in FIG. 17, the pressure in the deposition chamber 401 was maintained at 0.08 Torr. The resulting solar cell is referred to as SC Comparative Example 14-5.

COMPARATIVE EXAMPLE 14-6

A triple type solar cell was produced using similar processes as those in Example 14, except that in forming the i-type Si layer 1710 shown in FIG. 17, the deposition speed was changed to 3 nm/sec. The resulting solar cell is referred to as SC Comparative Example 14-6.

COMPARATIVE EXAMPLE 14-7

A triple type solar cell was produced using similar processes as those in Example 14, except that in forming the i-type Si layer 1710 shown in FIG. 17, the layer thickness was changed to 40 nm. The resulting solar cell is referred to as SC Comparative Example 14-7.

The initial photoelectric conversion efficiency and durability characteristics of these resultant triple type solar cells were examined in a manner similar to Example 1. As a result, it was confirmed that (SC Example 14) has better initial photoelectric conversion efficiency and durability characteristics than the comparative triple type solar cells (SC Comparative Example 14-1) to (SC Comparative Example 14-7).

EXAMPLE 15

A triple type solar cell was produced by utilizing the system employing the microwave plasma CVD apparatus of the present invention shown in FIG. 4. It was further formed into a module and applied to the generating system. 65 triple solar cells (Example 14) having a size of $50 \times 50$ mm$^2$ were produced under similar conditions, manner, and processes as those in Example 14. On an aluminium plate having a thickness of 5.0 mm, an adhesive sheet composed of EVA (ethylene vinyl acetate) and a nylon sheet were laid. The resulting solar cells were further arranged in series and in parallel to each other on the nylon sheet.

Further, an adhesive sheet composed of EVA, and a fluorine-contained resin sheet were laid on the solar cells. The resultant product was vacuum-laminated and formed into a module. The resultant module is referred to as MJ Example 15. The initial photoelectric conversion efficiency of the module was examined in a similar manner to Example 1.

The resultant module 1801 was connected to the generating system circuit shown in FIG. 18. An outdoor lamp lit during the night was used as a load 1805. The overall system was operated by the electric power output of the module 1801 and a storage battery 1804. The module 1801 was placed at an angle by which it was able to collect the sunlight most efficiently. The photoelectric conversion efficiency after a lapse of one year was examined, and the photo-deterioration rate (the photoelectric conversion efficiency after a lapse of one year/the initial photoelectric conversion efficiency) was calculated.

COMPARATIVE EXAMPLE 15-1

65 comparative triple type solar cells (SC Comparative Example 14-X) (X:1~7) were produced and formed into a module as in Example 15. Such modules are referred to as MJ Comparative Example 15-X. The initial photoelectric conversion efficiency and the photoelectric conversion efficiency after a lapse of one year were examined under similar conditions, manner, and processes as those in Example 15, and the photo-deterioration rate was calculated. The photo-deterioration rates of (MJ Comparative Example 15-X) relative to (MJ Example 15) are as follows.

| Module | Relative deterioration rate |
| --- | --- |
| MJ Example 15 | 1.00 |
| MJ Comparative 15-1 | 0.88 |
| MJ Comparative 15-2 | 0.66 |
| MJ Comparative 15-3 | 0.86 |
| MJ Comparative 15-4 | 0.64 |
| MJ Comparative 15-5 | 0.74 |
| MJ Comparative 15-6 | 0.72 |
| MJ Comparative 15-7 | 0.83 |

As a result of the above, it is seen that the solar cell module of the present example has superior photo-deteriorating-resistance characteristics than the comparative solar cell module.

A detailed description will now be given in the following Examples 16 to 30 of the non-single crystal silicon carbide solar cells in which atoms in Groups III and V of the periodic table were introduced to the i-type layer.

EXAMPLE 16

In this example, a solar cell in which P atoms and B atoms were introduced to the i-type layer was produced.

First, a substrate was produced. A stainless substrate having a size of $50 \times 50$ mm$^2$ was ultrasonic-washed with acetone and isopropanol, and then dried. A reflecting layer composed of Ag having a layer thickness of 0.3 μm was formed on the stainless substrate at a room temperature by employing a sputtering process, and then, a reflection increasing layer composed of ZnO having a layer thickness of 1.0 μm was further formed on the reflection layer at a temperature of 350° C. by employing the same process.

Then, semiconductor layer s were formed on the reflection increasing layer by utilizing the system formed by the raw material gas supplying apparatus 2000 and the deposition apparatus 4000 employing a glow discharge decomposition process shown in FIG. 4. The raw material gases for producing the photovoltaic device of the present invention were contained in gas cylinders 2041 to 2047 in FIG. 4. These gas cylinders include a SiH$_4$ gas (having a purity of 99.999%) cylinder 2041; a CH$_4$ gas (having a purity of 99.9999%) cylinder 2042; a H$_2$ gas (having a purity of 99.9999%) cylinder 2043; a PH$_3$ gas cylinder 2044, which gas was diluted to 100 ppm with H$_2$ gas (having a purity of 99.99%, hereinafter referred to as PH$_3$/H$_2$); a B$_2$H$_6$ gas cylinder 2045, which gas was diluted to 100 ppm with H$_2$ gas (having a purity of 99.99%, hereinafter referred to as B$_2$H$_6$/H$_2$); NH$_3$ gas cylinder 2046, which gas was diluted to 1% with H$_2$ gas (having a purity of 99.9999%, hereinafter referred to as NH$_3$/H$_2$); and an O$_2$ gas cylinder 2047 which gas was diluted to 1% with He gas (having a purity of 99.9999%, hereinafter referred to as O$_2$/He). When the gas cylinders 2041 to 2047 were connected to the system, the gases in these cylinders, 2041 to 2047 were introduced to valves 2021 to 2027, respectively, and the pressure of the respective gases was adjusted to 2 kg/cm$^2$ by pressure adjusting devices 2031 to 2037. SiH$_4$ gas and CH$_4$ gas were mixed at a distance of 2 m away from the deposition chamber 401.

Next, the back side of a substrate 404 with a reflecting layer and a reflection increasing layer formed was thereon placed in contact with heater 405. Leak valve 409 of the deposition chamber 401 was closed and conductance valve 407 was opened wide, and the deposition chamber 401 was evacuated by a vacuum pump (not shown). When vacuum gauge 402 indicated at approximately $1 \times 10^{-4}$ Torr, the valves 2001 to 2007 and a subsidiary valve 408 were opened, thereby evacuating the gas pipes. When the vacuum gauge 402 indicated approximately $1 \times 10^{-4}$ Torr again, the valves 2001 to 2007 were closed and the gas cylinders 2031 to 2037 were gradually opened, thereby introducing the respective gases into mass flow controllers 2011 to 2017.

After the preparations for forming films were made as described above, semiconductor layers such as an n-type layer, an i-type layer, an i-type Si layer, and a p-type layer were formed on the substrate 404.

The n-type layer was formed by the following process. The auxiliary valve 408 and the valve 2003 were gradually opened, thereby introducing H$_2$ gas into the deposition chamber 401 via gas introduction pipe 411. The mass flow controller 2013 was set so that the flow rate of H$_2$ gas was 50 sccm. The conductance valve 407 was adjusted by observing the vacuum gauge 402 so that the pressure in the deposition chamber was set at 1.0 Torr. The heater 405 was set so that the temperature of the substrate 404 was 350° C. When the substrate was sufficiently heated, the valves 2001 and 2004 were gradually opened, thereby flowing SiH$_4$ gas and PH$_3$/H$_2$ gas into the deposition chamber 401. At this time, the flow rates of SiH$_4$ gas, H$_2$ gas, and PH$_3$/H$_2$ gas were adjusted to be 2 sccm, 100 sccm, and 20 sccm, respectively, by the respective mass flow controllers 2011, 2013, and 2014. The opening of the conductance valve 407 was adjusted by observing the vacuum gauge 402 so that the pressure in the deposition chamber 401 was 1.0 Torr. It was confirmed that shutter 415 was closed. The power output of the RF power source was set at 0.007 W/cm$^3$, and then the RF electric power was applied to RF electrode 410, thereby causing glow discharge. The shutter was opened, and the formation of the n-type layer on the substrate 404 was started. When an n-type layer having a layer thickness of 20 nm was formed, the shutter was closed; the RF power source was turned off, and the glow discharge was terminated. Thus, the formation of the n-type layer was completed. The valves 2001 and 2004 were closed and the flow of SiH$_4$ gas and PH$_3$/H$_2$ gas into the deposition chamber 401 was terminated. After H$_2$ gas continued to flow into the deposition chamber 401 for 5 minutes, flow valve 2003 was closed, and the deposition chamber 401 and the gas pipes were evacuated.

Then, the i-type layer was formed by the following process. The valve 2003 was gradually opened, and H$_2$ gas was introduced into the deposition chamber 401, and the mass flow controller 2013 was adjusted so that the flow rate of H$_2$ gas was 300 sccm. The conductance valve was adjusted by observing the vacuum gauge 402 so that the pressure in the deposition chamber was 0.01 Torr. The heater 405 was set so that the temperature of the substrate 404 was 350° C. When the substrate 404 was sufficiently heated, the valves 2001, 2002, 2004, and 2005 were gradually opened and SiH$_4$ gas CH$_4$ gas, PH$_3$/H$_2$ gas and B$_2$H$_6$/H gas flowed into the deposition chamber 401. At this time, the respective mass flow controllers were adjusted so that the flow rates of SiH$_4$ gas, CH$_4$ gas, H$_2$ gas, and PH$_3$/H$_2$ gas were 100 sccm, 30 sccm, 300 sccm, and 2 sccm, respectively. The opening of the conductance valve 407 was adjusted by observing the vacuum gauge 402 so that the pressure in the deposition chamber 401 was 0.01 Torr. Then, the power output of RF power source 403 was set at 0.40 W/cm$^3$, which was applied to the RF electrode 410. Subsequently, the power output of the μW power source (not shown) was set at 0.20 W/cm$^3$, which was introduced into the deposition chamber 401 via dielectric window 413, thereby causing glow discharge. The shutter 415 was opened, and the formation of the i-type layer on the n-type layer was started. The flow rates of SiH$_4$ gas and CH$_4$ gas were changed in accordance with the pattern shown in FIG. 5, by utilizing a computer connected to the mass flow controllers. When an i-type layer having a layer thickness of 300 nm was formed, the shutter was closed, the glow-discharge was terminated, and the RF power source 403 was turned off. Thus, the formation of the i-type layer was completed. The valves 2001, 2002, 2004, and 2005 were closed, and the flow of SiH$_4$ gas, CH$_4$ gas, PH$_3$/H$_2$ gas, and B$_2$H$_6$/H$_2$ gas into the deposition chamber was terminated. After H$_2$ gas continued to flow into the deposition chamber 401 for 5 minutes, the valve 2003 was closed, and the deposition chamber 401 and the pipes were evacuated.

Then, the i-type Si layer was formed by the following process. The valve 2003 was gradually opened, and H$_2$ gas was introduced into the deposition chamber 401, and the mass flow controller 2013 was adjusted so that the flow rate of H$_2$ gas was 50 sccm. The conductance valve was adjusted by observing the vacuum gauge 402 so that the pressure in the deposition chamber was 1.5 Torr. The heater 405 was set so that the temperature of the substrate 404 was 250° C. When the substrate 404 was sufficiently heated, the valve 2001 was gradually opened, and SiH$_4$ gas flowed into the deposition chamber 401. At this time, the respective mass flow controllers were adjusted so that the flow rates of SiH$_4$ gas and H$_2$ gas were 2 sccm and 100 sccm, respectively. The opening of the conductance valve 407 was adjusted by observing the vacuum gauge 402 so that the pressure in the deposition chamber 401 was 1.5 Torr.

Then, the power output of RF power source 403 was set at 0.007 W/cm$^3$, and introduced into the deposition chamber 401, thereby causing glow discharge. The shutter 415 was opened, and the formation of the i-type Si layer on the i-type layer was started. When an i-type Si layer having a layer thickness of 20 nm was formed at a deposition speed of 0.1 nm/sec, the shutter was closed, and the RF power source was turned off, and the glow discharge was terminated. Thus, the formation of the i-type Si layer was completed. The valve 2001 was closed, and the flow of SiH$_4$ gas into the deposition chamber was terminated. After H$_2$ gas continued to flow into the deposition chamber 401 for 5 minutes, the valve 2003 was closed, and the deposition chamber 401 and the pipes were evacuated.

Then, the p-type layer was formed by the following process. The valve 2003 was gradually opened, and H$_2$ gas was introduced into the deposition chamber 401, and the mass flow controller 2013 was adjusted so that the flow rate of H$_2$ gas was 50 sccm. The conductance valve was adjusted by observing the vacuum gauge 402 so that the pressure in the deposition chamber was 2.0

Torr. The heater 405 was set so that the temperature of the substrate 404 was 200° C. When the substrate 404 was sufficiently heated, the valves 2001, 2002, and 2005 were gradually opened, and SiH$_4$ gas, CH$_4$ gas, and B$_2$H$_6$/H$_2$ gas flowed into the deposition chamber 401. At this time, the respective mass flow controllers were adjusted so that the flow rates of SiH$_4$ gas, CH$_4$ gas, H$_2$ gas, and B$_2$H$_6$/H$_2$ gas were 1 sccm, 0.5 sccm, 100 sccm, and 100 sccm, respectively. The opening of the conductance valve 407 was adjusted by observing the vacuum gauge 402 so that the pressure in the deposition chamber 401 was 2.0 Torr.

Then, the power output of RF power source 403 was set at 0.2 W/cm$^3$, and introduced into the deposition chamber 401, thereby causing glow discharge. The shutter 415 was opened, and the formation of the p-type layer on the i-type Si layer was started. When a p-type layer having a layer thickness of 10 nm was formed, the shutter was closed, the RF power source was turned off, and the glow discharge was terminated. Thus, the formation of the p-type layer was completed. The valves 2001, 2002, and 2005 were closed, and the flow of SiH$_4$ gas, CH$_4$ gas, and B$_2$H$_6$/H$_2$ gas into the deposition chamber 401 was terminated. After H$_2$ gas continued to flow into the deposition chamber 401 for 5 minutes, the valve 2003 was closed, and the deposition chamber 401 and the piping were evacuated. Then, the auxiliary valve 408 was closed, and the leak valve 409 was opened, thereby permitting leaking in, to the deposition chamber 401.

Subsequently, ITO (In$_2$O$_3$+SnO$_2$) having a layer thickness of 80 nm and in the form of a transparent electrode, and Cr having a layer thickness of 10 μm and in the fore of a collecting electrode were deposited on the p-type layer by employing a vacuum deposition process, which is generally known. Thus, the formation of the non-single crystal silicon carbide solar cell was completed. The resultant solar cell is referred to as SC Example 16. The conditions for forming the n-type layer, the i-type layer, i-type Si layer, and the p-type layer are shown in Table 7.

COMPARATIVE EXAMPLE 16-1

A solar cell was produced by forming a reflecting layer, a reflection increasing layer, an n-type layer, an i-type layer, an i-type Si layer, a p-type layer, a transparent electrode, and a collecting electrode on a substrate under similar conditions and processes as those in Example 16, except that in forming the i-type layer, the flow rates of SiH$_4$ gas and CH$_4$ gas were adjusted by the respective mass flow controllers in accordance with the pattern shown in FIG. 6. The resultant solar cell is referred to as SC Comparative Example 16-1.

COMPARATIVE EXAMPLE 16-2

A solar cell was produced by forming a reflecting layer, a reflection increasing layer, an n-type layer, an i-type layer, an i-type Si layer, a p-type layer, a transparent electrode, and a collecting electrode on a substrate under similar conditions and processes as those in Example 16, except that in forming the i-type layer, PH$_3$/H$_2$ gas did not flow into the deposition chamber. The resultant solar cell is referred to as SC Comparative Example 16-2.

COMPARATIVE EXAMPLE 16-3

A solar cell was produced by forming a reflecting layer, a reflection increasing layer, an n-type layer, an i-type layer, an i-type Si layer, a p-type layer, a transparent electrode, and a collecting electrode on a substrate under similar conditions and processes as those in Example 16, except that in forming the i-type layer, B$_2$H$_6$/H$_2$ gas did not flow into the deposition chamber. The resultant solar cell is referred to as SC Comparative Example 16-3.

COMPARATIVE EXAMPLE 16-4

A solar cell was produced by forming a reflecting layer, a reflection increasing layer, an n-type layer, an i-type layer, an i-type Si layer, a p-type layer, a transparent electrode, and a collecting electrode on a substrate under similar conditions and processes as those in Example 16, except that in forming the i-type layer, the μW power was changed to 0.5 W/cm$^3$. The resultant solar cell is referred to as SC Comparative Example 16-4.

A solar cell was produced by forming a reflecting layer, a reflection increasing layer, an n-type layer, an i-type layer, an i-type Si layer, a p-type layer, a transparent electrode, and a collecting electrode on a substrate under similar conditions and processes as those in Example 16, except that in forming the i-type layer, the RF power was changed to 0.15 W/cm$^3$. The resultant solar cell is referred to as SC Comparative Example 16-5.

COMPARATIVE EXAMPLE 16-6

A solar cell was produced by forming a reflecting layer, a reflection increasing layer, an n-type layer, an i-type layer, an i-type Si layer, a p-type layer, a transparent electrode, and a collecting electrode on a substrate under similar conditions and processes as those in Example 16, except that in forming the i-type layer, the μW power and RF power were changed to 0.5 W/cm$^3$ and 0.15 W/cm$^3$, respectively. The resultant solar cell is referred to as SC Comparative Example 16-6.

COMPARATIVE EXAMPLE 16-7

A solar cell was produced by forming a reflecting layer, a reflection increasing layer, an n-type layer, an i-type layer, an i-type Si layer, a p-type layer, a transparent electrode, and collecting electrode on a substrate under similar conditions and processes as those in Example 16, except that in forming the i-type layer, the pressure in the deposition chamber was changed to 0.08 Torr. The resultant solar cell is referred to as SC Comparative Example 16-7.

COMPARATIVE EXAMPLE 16-8

A solar cell was produced by forming a reflecting layer, a reflection increasing layer, an n-type layer, an i-type layer, an i-type Si layer, a p-type layer, a transparent electrode, and a collecting electrode on a substrate under similar conditions and processes as those in Example 16, except that in forming the i-type Si layer, the deposition speed was changed to 3 nm/sec. The resultant solar cell is referred to as SC Comparative Example 16-8.

COMPARATIVE EXAMPLE 16-9

A solar cell was produced by forming a reflecting layer, a reflection increasing layer, an n-type layer, an i-type layer, an i-type Si layer, a p-type layer, a transparent electrode, and a collecting electrode on a substrate under similar conditions and processes as those in Example 16, except that in forming the i-type Si layer, the layer thickness was changed to 40 nm. The resultant solar cell is referred to as SC Comparative Example 16-9.

The initial photoelectric conversion efficiency (photovoltaic power/incident light power) and durability characteristics of the resultant solar cells (SC Example 16) and (SC Comparative Example 16-1) to (SC Comparative Example 16-9) were examined. The initial photoelectric conversion efficiency was obtained by the following process. The resultant solar cells were placed under the illumination of AM-1.5 (100 mW/cm$^2$) light, and V-I characteristics of the solar cells were calculated.

According to the results of the measurement, the initial photoelectric conversion efficiency of the solar cell of the present example (SC Example 16) was 1.02 times that of the solar cell (SC Example 1) of Example 1. Further, the initial photoelectric conversion efficiencies of (SC Comparative Example 16-1) to (SC Comparative Example 16-9) are as follows, compared to that of the solar cell (SC Example 16).

| | |
|---|---|
| (SC Example 16) | 1 |
| (SC Comparative Example 16-1) | 0.85 |
| (SC Comparative Example 16-2) | 0.85 |
| (SC Comparative Example 16-3) | 0.84 |
| (SC Comparative Example 16-4) | 0.63 |
| (SC Comparative Example 16-5) | 0.80 |
| (SC Comparative Example 16-6) | 0.65 |
| (SC Comparative Example 16-7) | 0.69 |
| (SC Comparative Example 16-8) | 0.72 |
| (SC Comparative Example 16-9) | 0.85 |

Durability characteristics were then evaluated by the following process. The resultant solar cells were placed in the dark at 70% humidity and a temperature of 60° C. Vibrations having an amplitude of 1 mm were applied to the solar cells at 3600 rpm for 24 hours, and thereafter, the deterioration rate (photoelectric conversion efficiency after the durability test/initial photoelectric conversion efficiency) of the photoelectric conversion efficiency of the solar cells under the illumination of AM 1.5 (100 mW/cm$^2$) light was calculated.

According to the results of the measurement, the durability characteristics of the solar cell (SC Example 16) of the present example was 1.1 times better than that of the solar cell (SC Example 1) of Example 1. Further, the deterioration rates of the photoelectric conversion efficiency of (SC Comparative Example 16-1) to (SC Comparative Example 16-9) are as follows, compared to that of (SC Example 16).

| | |
|---|---|
| (SC Example 16) | 1 |
| (SC Comparative Example 16-1) | 0.85 |
| (SC Comparative Example 16-2) | 0.84 |
| (SC Comparative Example 16-3) | 0.83 |
| (SC Comparative Example 16-4) | 0.69 |
| (SC Comparative Example 16-5) | 0.80 |
| (SC Comparative Example 16-6) | 0.71 |
| (SC Comparative Example 16-7) | 0.73 |
| (SC Comparative Example 16-8) | 0.78 |
| (SC Comparative Example 16-9) | 0.87 |

Then, an i-type layer having a thickness of 1 μm was formed on a substrate under similar conditions as those of Example 16, except that a stainless substrate and a barium borosilicate glass (7059 made by Corning Co., Ltd.) substrate were used and the flow rates of SiH$_4$ gas and CH$_4$ gas were changed variously. Thus, samples for determining the film properties were obtained. The bandgap (Eg) and the composition of the resulting samples were analyzed, and the relationship between the composition ratio of Si (silicon) atoms to C (carbon) atoms, and the bandgap was further examined. As a result, a relationship similar to FIG. 7 were obtained.

Also, an i-type Si layer having a thickness of 1 μm was formed on a barium borosilicate glass substrate under similar conditions as those of Example 16, whereby, sample for measuring the bandgap was obtained. The bandgap of such sample was measured by the foregoing measuring process and determined as 1.75 eV.

An analysis was made of the composition of silicon atoms and carbon atoms in the direction of the layer thickness of the i-type layers of the resultant solar cells (SC Example 16) and (SC Comparative Example 16-1) to (SC Comparative Example 16-9). As a result, it was verified that the minimum bandgap was located toward the p/i interface from the center position of the i-type layers in the solar cells (SC Example 16) and (SC Comparative Example 16-2) to (SC Comparative Example 16-9), and that the minimum bandgap was located toward the n/i interface from the center position of the i-type layer in (SC Comparative Example 16-1).

It was further confirmed that the change in the bandgap in the direction of the layer thickness of (SC Example 16) and (SC Comparative Example 16-1) to (SC Comparative Example 16-9) depends on the ratio of the raw material gas containing Si (SiH$_4$ gas in this case) to the raw material gas containing C (CH$_4$ gas in this case).

Then, an analysis was made of the composition of P atoms and B atoms in the direction of the layer thickness in the i-type layers of the solar cells (SC Example 16) and (SC Comparative Example 16-1) to (SC Comparative Example 16-9) by utilizing a secondary ion mass analyzer (IMS-3F made by CAMECA). As a result, the P atoms and B atoms were uniformly distributed in the direction of the layer thickness, and the composition ratio is as follows.

| | | | | |
|---|---|---|---|---|
| (SC Example 16) | P/(Si + C) | not more than 3 ppm | B/(Si + C) | not more than 10 ppm |
| (SC CE 16-1) | P/(Si + C) | not more than 3 ppm | B/(Si + C) | not more than 10 ppm |
| (SC CE 16-2) | P/(Si + C) | N.D. | B/(Si + C) | not more than 10 ppm |
| (SC CE 16-3) | P/(Si + C) | not more than 3 ppm | B/(Si + C) | N.D. |
| (SC CE 16-4) | P/(Si + C) | not more than 4 ppm | B/(Si + C) | not more than 18 ppm |
| (SC CE 16-5) | P/(Si + C) | not more than 3 ppm | B/(Si + C) | not more than 10 ppm |
| (SC CE 16-6) | P/(Si + C) | not more than 4 ppm | B/(Si + C) | not more than 15 ppm |
| (SC CE 16-7) | P/(Si + C) | not more than 3 ppm | B/(Si + C) | not more than 10 ppm |
| (SC CE 16-8) | P/(Si + C) | not more than 3 ppm | B/(Si + C) | not more than 10 ppm |
| (SC CE 16-9) | P/(Si + C) | not more than 3 ppm | B/(Si + C) | not more than 10 ppm |

CE: Comparative Example
N.D.: Not Detectable

COMPARATIVE EXAMPLE 16-10

Several non-monocrystal silicon carbide solar cells were produced in generally the same manner as in Example 16, except that different levels of μW power and RF power were introduced to form the i-type layers of the solar cells.

The deposition rate did not depend on the RF power, but it leveled off when the μW power was 0.32 W/cm$^3$ or greater. When the μW power was 0.32 W/cm³ or greater, decomposition of 100% of the SiH₄ gas and the CH₄ gas, which were raw material gases, was achieved.

The initial photoelectric conversion efficiencies of the solar cells were determined under illumination of AM 1.5 light (100 mW/cm²). The results were generally the same as shown in FIG. 10. The initial photoelectric conversion efficiency was significantly enhanced when the μW power was 0.32 W/cm³, the level at which decomposition of 100% of the SiH₄ and CH₄ gases was achieved, or lower than 0.32 W/cm³ when the RF power was greater than the μW power.

COMPARATIVE EXAMPLE 16-11

Several non-monocrystal silicon carbide solar cells were produced in generally the same manner as in Example 16, except that, to form the i-type layers, the flow rates of the SiH₄ and CH₄ gases introduced into the deposition chamber 401 were adjusted to 50 sccm and 10 sccm, respectively, and no H₂ gas was introduced thereinto, and different levels of the μW power and RF power were introduced. Like Comparative Example 16-10, the deposition rate did not depend on the RF power, but it leveled off when the μW power was 0.18 W/cm³ or greater. When the μW power was 0.18 W/cm³ or greater, decomposition of 100% of the SiH₄ gas and CH₄ gas was achieved. The initial photoelectric conversion efficiencies of the solar cells were determined under illumination of AM 1.5 light. The results were generally the same as shown in FIG. 10. The initial photoelectric conversion efficiency was significantly enhanced when the μW power was 0.18 W/cm³, the level at which 100% of the SiH₄ gas and the CH₄ gas were decomposed, or lower than 0.18 W/cm³ when the RF power was greater than the μW electric power.

COMPARATIVE EXAMPLE 16-12

Several non-monocrystal silicon carbide solar cells were produced in generally the same manner as in Example 16, except that, to form the i-type layers, the flow rates of the SiH₄, CH₄, and H₂ gases introduced into the deposition chamber 401 were adjusted to 200 sccm, 50 sccm, and 500 sccm, respectively, and the heater was set so as to provide a substrate temperature of 300° C., and different levels of the μW power and RF power were introduced. Like Comparative Example 16-10, the deposition rate did not depend on the RF power, but it leveled off when the μW power was 0.65 W/cm³ or greater. When the μW power was 0.65 W/cm³ or greater, decomposition of 100% of the SiH₄ gas and the CH₄ gas was achieved.

The initial photoelectric conversion efficiencies of the solar cells were determined under illumination of AM 1.5 light. The results were generally the same as shown in FIG. 10. The initial photoelectric conversion efficiency was significantly enhanced when the μW power was 0.65 W/cm³, the level at which decomposition of 100% of the SiH₄ gas was achieved, or lower than 0.65 W/cm³ when the RF power was greater than the μW power.

COMPARATIVE EXAMPLE 16-13

Several non-monocrystal silicon carbide solar cells were produced in generally the same manner as in Example 16, except that, to form i-type layers, the pressure inside the deposition chamber 401 was varied in a range from 3 mTorr to 200 mTorr. The initial photoelectric conversion efficiencies of the solar cells were determined under illumination of AM 1.5 light. As a result, the initial photoelectric conversion efficiency was significantly reduced when the pressure inside the deposition chamber 401 was 50 mTorr or greater.

COMPARATIVE EXAMPLE 16-14

Several non-monocrystal silicon carbide solar cells were produced in generally the same manner as in Example 16, except that, to form the i-type layer, the flow rate of the SiH₄ gas, which is a raw material gas, and the RF power were changed to various levels so as to change the i-type Si layer deposition rate to various levels. The initial photoelectric conversion efficiencies of the solar cells were determined under illumination of AM 1.5 light. As a result, the initial photoelectric conversion efficiency was significantly reduced when the deposition rate was 2 nm/sec or greater.

COMPARATIVE EXAMPLE 16-15

Several non-monocrystal silicon carbide solar cells were produced in generally the same manner as in Example 16, except that the thickness of the i-type Si layers was varied. The initial photoelectric conversion efficiencies of the solar cells were determined under illumination of AM 1.5 light. As a result, the initial photoelectric conversion efficiency was significantly reduced when the thickness of the i-type layer was 30 nm or greater.

As may be understood with reference to Comparative Examples 16-1 to 16-15, the solar cell SC Ex. 16 according to the present invention has better characteristics than the solar cells SC Comp. 16-1 to SC Comp. 16-9 and, if the pressure inside the deposition chamber is 50 mTorr or lower, achieves good characteristics regardless of variations of the production conditions such as the raw material gas flow rates or the substrate temperature.

EXAMPLE 17

Several solar cells were produced in generally the same manner as in Example 16, except that the variation patterns of the flow rates of the SiH₄ and CH₄ gases were changed during formation of the i-type layers so as to achieve various patterns of the bandgaps (Eg), various sizes of the minimum bandgaps, and various positions of the minimum bandgaps with respect to the direction of the layer thickness. The initial photoelectric converison efficiencies and durabilities of the solar cells were determined in generally the same manner as in Example 16.

The solar cells thus formed by changing the variation patterns of the flow rates of the SiH₄ gas and CH₄ gas achieved various bandgap patterns as shown in FIG. 12. The initial photoelectric conversion efficiencies and durabilities of the solar cells are shown in Table 8. The values shown in Table 8 were obtained by standardization based on the results of the solar cell SC Ex. 17-1.

FIG. 12 and Table 8 indicate that better characteristics can be achieved by a solar cell according to the present invention in which the bandgap of the i-type layer gradually varies and the position of the minimum bandgap is closer to the p/i interface than it is to the n/i interface, regardless of the size of the minimum bandgap and the variation pattern of the bandgap.

EXAMPLE 18

Several solar cells were produced in generally the same manner as in Example 16, except that the concentration and type of the valence electron control agent were varied for the formation of the i-type layers. The initial photoelectric conversion efficiencies and durabilities of the solar cells were determined in generally the same manner as in Example 16.

EXAMPLE 18-1

To produce a solar cell SC Ex. 18-1, the flow rate of the valence electron control agent gas (the $B_2H_6/H_2$ gas) which serves as an acceptor of the i-type layer was reduced to a fifth of the flow rate thereof in Example 16, and the total $H_2$ flow rate was maintained at the same level as in Example 16. Like the solar cell SC Ex. 16, the solar cell SC Ex. 18-1 achieved better initial photoelectric conversion efficiency and durability than the solar cells SC Comp. 16-1 to SC Comp. 16-9.

EXAMPLE 18-2

To produce a solar cell SC Ex. 18-2, the flow rate of the valence electron control agent gas ($B_2H_6/H_2$ gas) which serves as an acceptor of the i-type layer was increased to fivefold of the flow rate in Example 16, and the total $H_2$ flow rate was maintained at the same level as in Example 16. Like the solar cell SC Ex. 16, the solar cell SC Ex. 18-2 achieved better initial photoelectric conversion efficiency and durability than the solar cells SC Comp. 16-1 to SC Comp. 16-9.

EXAMPLE 18-3

To produce a solar cell SC Ex. 18-3, the flow rate of the valence electron control agent gas ($PH_3/H_2$ gas) which serves as a donor of the i-type layer was reduced to a fifth of the flow rate in Example 16, and the total $H_2$ flow rate was maintained at the same level as in Example 16. Like the solar cell SC Ex. 16, the solar cell SC Ex. 18-3 achieved better initial photoelectric conversion efficiency and durability than the solar cells SC Comp. 16-1 to SC Comp. 16-9.

EXAMPLE 18-4

To produce a solar cell SC Ex. 18-4, the flow rate of the valence electron control agent gas ($PH_3/H_2$ gas) which serves as a donor of the i-type layer was increased to fivefold of the flow rate in Example 16, and the total $H_2$ flow rate was maintained at the same level as in Example 16. Like the solar cell SC Ex. 16, the solar cell SC Ex. 18-4 achieved better initial photoelectric conversion efficiency and durability than the solar cells SC Comp. 16-1 to SC Comp. 16-9.

EXAMPLE 18-5

A solar cell SC Ex. 18-5 was produced by generally the same method and procedure as in Example 16, except for using a combination of hydrogen gas and trimethyl aluminum ($Al(CH_3)_3$, referred to as "TMA"), which is liquid at room temperature and atmospheric pressure, instead of the $B_2H_6/H_2$ gas, as the valence electron control agent gas which serves as an acceptor of the i-type layer. The TMA (having a purity of 99.99%) contained in a liquid cylinder was gasified by bubbling with hydrogen gas, and the thus-obtained TMA/$H_2$ gas introduced into the deposition chamber 401 at a flow rate of 10 sccm. Like the solar cell SC Ex. 16, the solar cell SC Ex. 18-5 achieved better initial photoelectric conversion efficiency and durability than the solar cells SC Comp. 16-1 to SC Comp. 16-9.

EXAMPLE 18-6

A solar cell SC Ex. 18-6 was produced by generally the same method and procedure as in Example 16, except for using a combination of hydrogen and hydrogen sulfide ($H_2S$), instead of the $PH_3/H_2$, as the valence electron control agent gas which serves as a donor of the i-type layer. The cylinder containing the $NH_3/H_2$ gas was replaced with a cylinder containing $H_2S$ gas (having a purity of 99.99%, referred to as "$H_2S/H_2$ gas") prepared by diluting hydrogen sulfide to 100 ppm with hydrogen ($H_2$). The $H_2S/H_2$ gas was introduced at a flow rate of 1 sccm. Other conditions were the same as in Example 16. Like the solar cell SC Ex. 16, the solar cell SC Ex. 18-6 achieved better initial photoelectric conversion efficiency and durability than the solar cells SC Comp. 16-1 to SC Comp. 16-9.

EXAMPLE 19

A solar cell SC Ex. 19 in which the n-type layers and the p-type layers were reversed in position was produced. Table 9 shows the conditions of forming the p-type layer, the i-type Si layer, the i-type layer, and the n-type layer. The deposition rate of the i-type Si layer was 0.1 nm/sec. During formation of the i-type layer, the flow rates of the $SiH_4$ gas and the $CH_4$ gas were varied as indicated in FIG. 6 so that the minimum bandgap was positioned closer to the p/i interface. The substrate and the layers other than the semiconductor layers were formed by the same method and under the same conditions as in Example 16. Like the solar cell SC Ex. 16, the solar cell SC Ex. 19 achieved better initial photoelectric conversion efficiency and durability than the solar cells SC Comp. 16-1 to SC Comp. 16-9.

EXAMPLE 20

A non-monocrystal silicon carbide solar cell SC Ex. 20, in which the maximum bandgap of the i-type layer was closer to the p/i interface and the thickness of a region including the maximum bandgap was 20 nm, was produced by generally the same method and conditions as in Example 16, except that the gas flow rates were varied as indicated in FIG. 13A during formation of the i-type layer.

The composition analysis of the solar cell was performed by generally the same method as in Example 16. The variation of the bandgap in the i-type layer with respect to the direction of the layer thickness was examined based on the graph in FIG. 7. The result was generally the same as shown in FIG. 13B.

Like the solar cell SC Ex. 16, the solar cell SC Ex. 20 achieved better initial photoelectric conversion efficiency and durability than the solar cells SC Comp. 16-1 to SC Comp. 16-9.

COMPARATIVE EXAMPLE 20

Several non-monocrystal silicon carbide solar cells, in which regions including the maximum bandgaps of the i-type layers were closer to the p/i interfaces and had various thicknesses, were produced by the same method and conditions as in Example 20, except that the thicknesses of the maximum bandgap region were varied.

The initial photoelectric conversion efficiencies and durabilities of the solar cells were determined. As a result, the solar cells having maximum bandgap regions having thicknesses within a range between 1 nm and 30 nm achieved better initial photoelectric conversion efficiency and durability than the solar cell SC Ex. 16.

EXAMPLE 21

A non-monocrystal silicon carbide solar cell SC Ex. 21, in which the maximum bandgap region of the i-type layer was adjacent to the n/i interface and the thickness of the region was 15 nm, was produced by generally the same method and conditions as in Example 16, except that the gas flow rates were varied as indicated in FIG. 13C during formation of the i-type layers. Composition analysis of the solar cell was performed by generally the same method as in Example 16. The variation of the bandgap in the i-type layer with respect to the direction of the layer thickness was examined based on the graph in FIG. 7. The result was generally the same as shown in FIG. 13D.

Like the solar cell SC Ex. 16, the solar cell SC Ex. 21 achieved better initial photoelectric conversion efficiency and durability than the solar cells SC Comp. 16-1 to SC Comp. 16-9.

COMPARATIVE EXAMPLE 21

Several non-monocrystal silicon carbide solar cells, in which regions including the maximum bandgaps of the i-type layers were closer to the p/i interfaces and had various thicknesses, were produced by the same method and conditions as in Example 21, except that the thicknesses of the maximum bandgap regions of the i-type layers were varied.

The initial photoelectric conversion efficiencies and durabilities of the solar cells were determined. As a result, the solar cells having maximum bandgap regions having thicknesses within a range between 1 nm and 30 nm achieved better initial photoelectric conversion efficiency and durability than the solar cell SC Ex. 16.

EXAMPLE 22

Figure 19A:
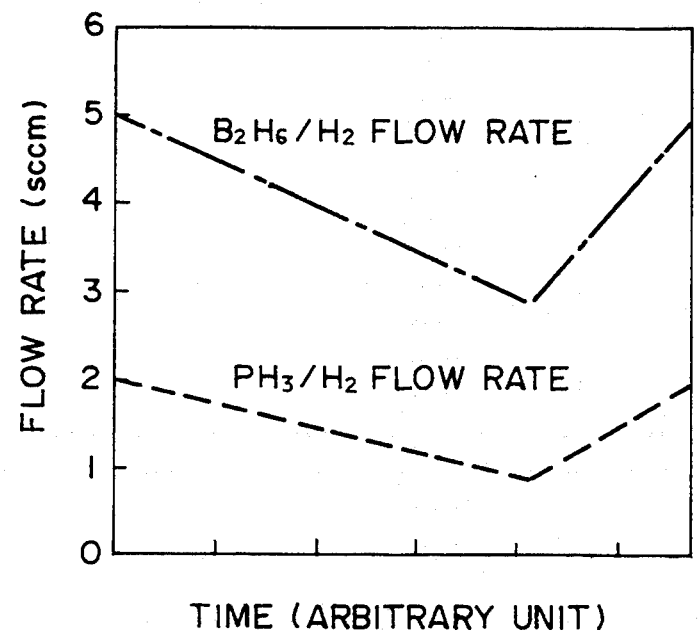
FIG. 19A is a graph showing changes in the flow rates of $PH_3/H_2$ and $B_2H_6/H_2$ gases.

A non-monocrystal silicon carbide solar cell SC Ex. 22, in which the valence electron control agent was distributed within the i-type layer, was produced by the same method, procedure, and conditions as in Example 16, except that the flow rates of the $PH_3/H_2$ gas and the $B_2H_6/H_2$ gas were varied as indicated in FIG. 19A during formation of the i-type layer. Like the solar cell SC Ex. 16, the solar cell SC Ex. 22 achieved better initial photoelectric conversion efficiency and durability than the solar cells SC Comp. 16-1 to SC Comp. 16-9.

Figure 19B:
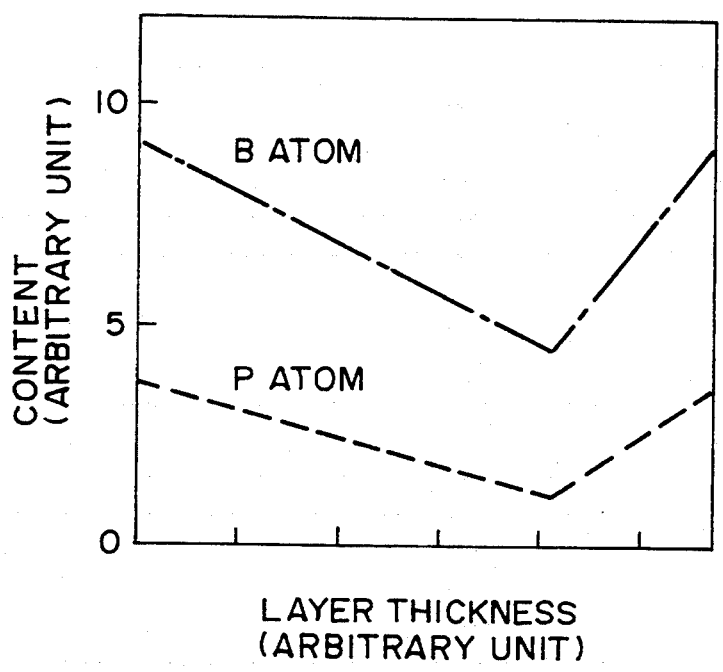
FIG. 19B is a graph showing the distributions of the B and P contents in an i-type layer in the direction of the thickness thereof.

The variations of the phosphorus atom content and boron atom content in the i-type layer with respect to the direction of the layer thickness were determined by a secondary ion mass spectrometer (SIMS). As a result, the phosphorus atom and boron atom contents were smallest at the minimum bandgap positions, as shown in FIG. 19B.

EXAMPLE 23

A non-monocrystal silicon carbide solar cell SC Ex. 23 having an i-type layer containing oxygen atoms was produced by the same method, procedure, and conditions as in Example 16, except that $O_2$/He gas was introduced into the deposition chamber 401 at a flow rate of 10 sccm in addition to the gases introduced in Example 16. Like the solar cell SC Ex. 16, the solar cell SC Ex. 23 achieved better initial photoelectric conversion efficiency and durability than the solar cells SC Comp. 16-1 to SC Comp. 16-9. The oxygen atom content in the i-type layer was determined by using SIMS. As a result, oxygen atoms were uniformly distributed over the entire thickness of the i-type layer, and the oxygen content was $2 \times 10^{19}$ atoms/cm$^3$.

EXAMPLE 24

A non-monocrystal silicon carbide solar cell SC Ex. 24 having an i-type layer containing nitrogen atoms was produced by the same method, procedure, and conditions as in Example 16, except that $NH_3/H_2$ gas was introduced into the deposition chamber 401 at a flow rate of 5 sccm in addition to the gases introduced in Example 16. Like the solar cell SC Ex. 16, the solar cell SC Ex. 24 achieved better initial photoelectric conversion efficiency and durability than the solar cells SC Comp. 16-1 to SC Comp. 16-9.

The nitrogen atom content in the i-type layer was determined by using SIMS. As a result, nitrogen atoms were uniformly distributed, and the nitrogen content was $3 \times 10^{17}$ atoms/cm$^3$.

EXAMPLE 25

A non-monocrystal silicon carbide solar cell SC Ex. 25 having an i-type layer containing oxygen atoms and nitrogen atoms was produced by the same method, procedure, and conditions as in Example 16, except that $O_2$/He gas and $NH_3/H_2$ gas were introduced into the deposition chamber 401 at flow rates of 5 sccm and 5 sccm in addition to the gases introduced in Example 16. Like the solar cell SC Ex. 16, the solar cell SC Ex. 25 achieved better initial photoelectric conversion efficiency and durability than the solar cells SC Comp. 16-1 to SC Comp. 16-9.

The oxygen atom and nitrogen atom contents in the i-type layer were determined by using SIMS. As a result, oxygen atoms and nitrogen atoms were uniformly distributed, and the oxygen and nitrogen contents were $1 \times 10^{19}$ atoms/cm$^3$ and $3 \times 10^{17}$ atoms/cm$^3$, respectively.

EXAMPLE 26

A non-monocrystal silicon carbide solar cell SC Ex. 26 having a hydrogen content in the i-type layer corresponding to the silicon content was produced. The $O_2$/He gas cylinder was replaced with a cylinder containing $SiF_4$ gas (having a purity of 99.99%), and the flow rates of the $SiH_4$ gas, the $CH_4$ gas, and the $SiF_4$ gas were varied as indicated in FIG. 15A. The bandgap variation with respect to the direction of layer thickness was determined by generally the same method as in Example 16. The result was generally the same as shown in FIG. 15B.

Determination of the hydrogen atom content and the silicon atom content the i-type layer was performed over the thickness of the i-type layer using the secondary ion mass spectrometer (SIMS). As a result, the hydrogen content varies over the layer thickness corresponding to the variation of the silicon content, as indicated in FIG. 15C.

Like the solar cell SC Ex. 16, the solar cell SC Ex. 26 achieved better initial photoelectric conversion efficiency and durability than the solar cells SC Comp. 16-1 to SC Comp. 16-9.

EXAMPLE 27

A non-monocrystal silicon carbide solar cell SC Ex. 27 was produced by using a production system employing the microwave plasma CVD method of the present invention, as shown in FIG. 4, by the same method and procedure as in Example 16, except that the silicon-containing gas (SiH$_4$) and the carboncontaining gas (CH$_4$ gas) were mixed at a position 5 meters apart from the deposition chamber to form semiconductor layers as shown in FIG. 1. The solar cell SC Ex. 27 achieved better initial photoelectric conversion efficiency and durability than the solar cell SC Ex. 16.

EXAMPLE 28

A tandem type solar cell SC Ex. 28, as shown in FIG. 16, having non-monocrystal silicon carbide semiconductor layers was produced by using the production system employing the microwave plasma CVD method according to the present invention.

First, a substrate was prepared as follows: Similar to Example 16, a stainless steel substrate of 50×50 mm$^2$ was ultrasonic-cleaned with acetone and isopropanol and then dried. A reflecting Ag (silver) layer was formed to a thickness of 0.3 $\mu$m on the surface of the stainless steel substrate by sputtering. During the sputtering process, the substrate was maintained at 350° C. so as to make the surface irregular, that is, texturize the surface. Then, a reflection enhancing layer of ZnO (zinc oxide) was formed thereon to a thickness of 1.0 $\mu$m while the substrate temperature was maintained at 350° C.

Figure 5:
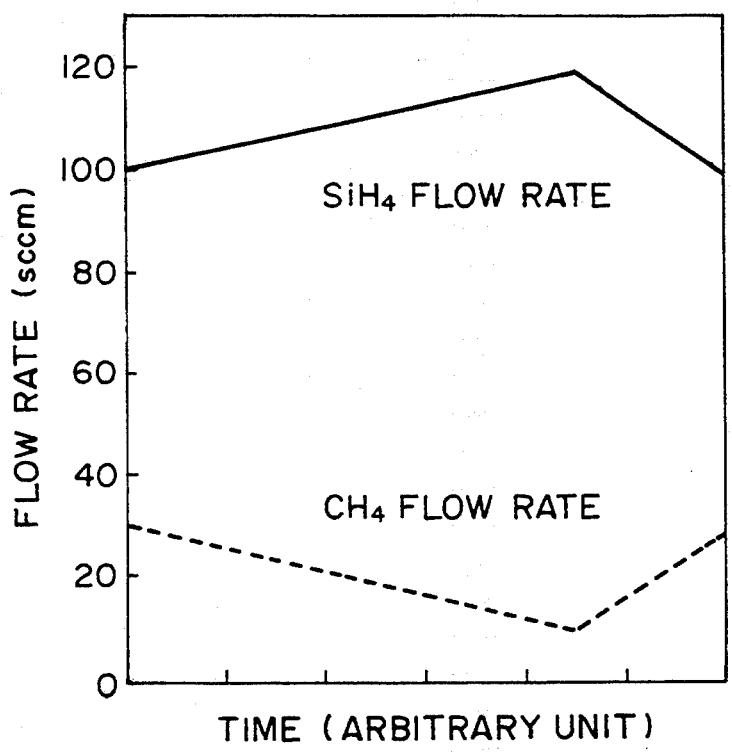
FIG. 5 is a graph showing the flow rate patterns of $SiH_4$ and $CH_4$ gases during formation of an i-type layer.

By generally the same method and procedure as in Example 16, the first n-type layer was formed on the substrate, followed by sequentially forming the first i-type layer, the first p-type layer, the second n-type layer, the second i-type layer, an i-type Si layer, and the second p-type layer on one another. The second i-type layer was formed by varying the flow rates of the SiH$_4$ and CH$_4$ gases as indicated in FIG. 5. The i-type Si layer was deposited at a rate of 0.15 nm/sec.

Further, similar to Example 16, ITO (In$_2$O$_3$+SnO$_2$) and chrome (Cr) were successively deposited on the second p-type layer by a normal vacuum vapor deposition method so as to form a transparent electrode having a thickness of 80 nm and a current collecting electrode having a thickness of 10 $\mu$m, respectively.

The tandem type solar cell SC Ex. 28 was thus produced by the microwave plasma CVD method. The conditions of forming the semiconductor layers are shown in Table 10.

COMPARATIVE EXAMPLE 28-1

A tandem type solar cell SC Comp. 28-1 was produced by the same method and procedure as in Example 28, except that the flow rates of the SiH$_4$ and CH$_4$ gases were varied as indicated in FIG. 6 during formation of the second i-type layer as shown in FIG. 16.

COMPARATIVE EXAMPLE 28-2

A tandem type solar cell SC Comp. 28-2 was produced by the same method and procedure as in Example 28, except that no PH$_3$/H$_2$ gas was introduced during formation of the second i-type layer as shown in FIG. 16.

COMPARATIVE EXAMPLE 28-3

A tandem type solar cell SC Comp. 28-3 was produced by the same method and procedure as in Example 28, except that no B$_2$H$_6$/H$_2$ gas was introduced during formation of the second i-type layer as shown in FIG. 16.

COMPARATIVE EXAMPLE 28-4

A tandem type solar cell SC Comp. 28-4 was produced by the same method and procedure as in Example 28, except that the $\mu$W power was set to 0.5 W/cm$^3$ during formation of the second i-type layer as shown in FIG. 16.

COMPARATIVE EXAMPLE 28-5

A tandem type solar cell SC Comp. 28-5 was produced by the same method and procedure as in Example 28, except that the RF power was set to 0.15 W/cm$^3$ during formation of the second i-type layer as shown in FIG. 16.

COMPARATIVE EXAMPLE 28-6

A tandem type solar cell SC Comp. 28-6 was produced by the same method and procedure as in Example 28, except that the $\mu$W and RF powers were set to 0.5 W/cm$^3$ and 0.55 W/cm$^3$, respectively, during formation of the second i-type layer as shown in FIG. 16.

COMPARATIVE EXAMPLE 28-7

A tandem type solar cell SC Comp. 28-7 was produced by the same method and procedure as in Example 28, except that the pressure inside the deposition chamber 401 was adjusted to 0.1 Torr during formation of the second i-type layer as shown in FIG. 16.

COMPARATIVE EXAMPLE 28-8

A tandem type solar cell SC Comp. 28-8 was produced by the same method and procedure as in Example 28, except that the i-type Si layer as shown in FIG. 16 was deposited at a rate of 3 nm/sec.

COMPARATIVE EXAMPLE 28-9

A tandem type solar cell SC Comp. 28-9 was produced by the same method and procedure as in Example 28, except that the i-type Si layer as shown in FIG. 16 was deposited to a thickness of 40 nm.

The initial photoelectric conversion efficiencies and durabilities of these tandem type solar cells were determined in generally the same method as in Example 16. As a result, the tandem type solar cell SC Ex. 28 achieved better initial photoelectric conversion efficiency and durability than the tandem type solar cells SC Comp. 28-1 to SC Comp. 28-9.

EXAMPLE 29

A triple type solar cell SC Ex. 29 having non-monocrystal silicon carbide semiconductor layers as shown in FIG. 17 was produced by using the system employing the microwave plasma CVD method, as shown in FIG. 4, according to the present invention.

First, a substrate was prepared as follows: Similar to Example 16, a stainless steel substrate of 50×50 mm$^2$ was ultrasonic-cleaned with acetone and isopropanol and then dried. Similar to Example 28, a reflecting Ag (silver) layer was formed to a thickness of 0.3 $\mu$m on the surface of the stainless steel substrate by sputtering at a substrate temperature of 350° C., thus texturizing the surface Then, a reflection enhancing layer of ZnO (zinc oxide) was formed thereon to a thickness of 1.0 $\mu$m while the substrate temperature was maintained at 350° C.

The NH$_3$/H$_2$ gas cylinder was replaced with a cylinder containing GeH$_4$ gas (having a purity of 99.999%). Preparation for film deposition was performed by generally the same method and procedure as in Example 16.

By generally the same method and procedure as in Example 16, the first n-type layer was formed on the substrate, followed by sequentially forming the first i-type layer (the GeH$_4$/SiH$_4$ ratio was varied as follows: 0→0.1→0.4→0.1→0), the first p-type layer, the second n-type layer, the second i-type layer, the second p-type layer, the third n-type layer, the third i-type layer, an i-type Si layer, and the third p-type layer on one another.

The third i-type layer was formed by varying the flow rates of the SiH$_4$ and CH$_4$ gases as indicated in FIG. 5. The i-type Si layer was deposited at a rate of 0.15 nm/sec.

Further, similar to Example 16, ITO (In$_2$O$_3$+SnO$_2$) and chrome (Cr) were successively deposited on the third p-type layer by a normal vacuum vapor deposition method so as to form a transparent electrode having a thickness of 80 nm and a current collecting electrode having a thickness of 10 μm, respectively.

The triple type solar cell SC Ex. 29 was thus produced by the microwave plasma CVD method. The conditions of forming the semiconductor layers are shown in Table 11.

COMPARATIVE EXAMPLE 29-1

A triple type solar cell SC Comp. 29-1 was produced by the same method and procedure as in Example 29, except that the flow rates of the SiH$_4$ gas and CH$_4$ gas were varied as indicated in FIG. 6 during formation of the third i-type layer 1709 shown in FIG. 17.

COMPARATIVE EXAMPLE 29-2

A triple type solar cell SC Comp. 29-2 was produced by the same method and procedure as in Example 29, except that no PH$_3$/H$_2$ gas was introduced during formation of the third i-type layer 1709 shown in FIG. 17.

COMPARATIVE EXAMPLE 29-3

A triple type solar cell SC Comp. 29-3 was produced by the same method and procedure as in Example 29, except that no B$_2$H$_6$/H$_2$ gas was introduced during formation of the third i-type layer 1709 shown in FIG. 17.

COMPARATIVE EXAMPLE 29-4

A triple type solar cell SC Comp. 29-4 was produced by the same method and procedure as in Example 29, except that the μW power was set to 0.5 W/cm$^3$ during formation of the third i-type layer 1709 shown in FIG. 17.

COMPARATIVE EXAMPLE 29-5

A triple type solar cell SC Comp. 29-5 was produced by the same method and procedure as in Example 29, except that the RF power was set to 0.15 W/cm$^3$ during formation of the third i-type layer 1709 shown in FIG. 17.

COMPARATIVE EXAMPLE 29-6

A triple type solar cell SC Comp. 29-6 was produced by the same method and procedure as in Example 29, except that the μW and RF powers were set to 0.5 W/cm$^3$ and 0.55 W/cm$^3$, respectively, during formation of the third i-type layer 1709 shown in FIG. 17.

COMPARATIVE EXAMPLE 29-7

A triple type solar cell SC Comp. 29-7 was produced by the same method and procedure as in Example 29, except that the pressure inside the deposition chamber 401 was adjusted to 0.08 Torr during formation of the third i-type layer 1709 shown in FIG. 17.

COMPARATIVE EXAMPLE 29-8

A triple type solar cell SC Comp. 29-8 was produced by the same method and procedure as in Example 29, except that the i-type Si layer 1710 shown in FIG. 17 was deposited at a rate of 3 nm/sec.

COMPARATIVE EXAMPLE 29-9

A triple type solar cell SC Comp. 29-9 was produced by the same method and procedure as in Example 29, except that the i-type Si layer as shown in FIG. 17 was deposited to a thickness of 40 nm.

The initial photoelectric conversion efficiencies and durabilities of these triple type solar cells were determined in generally the same method as in Example 16. As a result, the triple type solar cell SC Ex. 29 achieved better initial photoelectric conversion efficiency and durability than the triple type solar cells SC Comp. 29-1 to SC Comp. 29-9.

EXAMPLE 30

Triple type solar cells as shown in FIG. 17 were produced by using the production system as shown in FIG. 4 employing the microwave plasma CVD method of the present invention. The solar cells thus produced were formed into a module MJ Ex. 30, which was then used for a power generation system.

65 triple type solar cells SC Ex. 29 each of 50×50 mm$^2$ were produced by the same method and conditions as in Example 29. Separately, an adhesive sheet made of EVA (ethylene vinyl acetate) was laid on an aluminium plate having a thickness of 5.0 mm, and a nylon sheet was laid on the adhesive sheet. The triple type solar cells were arranged in series and parallel on the nylon sheet. The triple type solar cells were then covered with another adhesive sheet of EVA, which was then covered with a fluorocarbon resin sheet. This assembly was formed into a module by vacuum lamination.

The initial photoelectric conversion efficiency of the thus-formed module MJ Ex. 30 was determined by generally the same method as in Example 16. The module was connected to the power generation system, as shown in FIG. 18, which employed as the load 1805 a street light that turns on during the night. The system was operated by the power from the storage battery 1804 and the module 1801 was set at such an angle as to receive an optimal amount of sunlight. After a year, the photoelectric conversion efficiency of the module MJ Ex. 30 1801 was determined, and the photo-deterioration rate (the photoelectric conversion efficiency after one year/the initial photoelectric conversion efficiency) of this module MJ Ex. 30 was obtained.

COMPARATIVE EXAMPLE 30-1

65 triple type solar cells SC Comp. 29-X (X=1 to 9) were produced by the same method, procedure and conditions as in Comparative Examples 29-X, and formed into modules MJ Comp. 30-X in generally the same manner as in Example 30.

The initial photoelectric conversion efficiencies and the photoelectric conversion efficiencies after one year of the modules MJ Comp. 30-X were determined by the same method, procedure, and conditions as in Example 30. The photo-deterioration rates of the modules MJ Comp. 30-X relative to that of the module MJ Ex. 30 are as follows:

| Module | Relative Photo-deterioration rate |
| --- | --- |
| MJ Ex. 30 | 1.00 |
| MJ Comp. 30-1 | 0.82 |
| MJ Comp. 30-2 | 0.80 |
| MJ Comp. 30-3 | 0.81 |
| MJ Comp. 30-4 | 0.70 |
| MJ Comp. 30-5 | 0.80 |
| MJ Comp. 30-6 | 0.74 |
| MJ Comp. 30-7 | 0.74 |
| MJ Comp. 30-8 | 0.72 |
| MJ Comp. 30-9 | 0.83 |

The results show that the solar cell module according to the present invention achieved better photo-deterioration characteristics than the conventional solar cell modules.

The present invention will be further described with reference to Examples 31 to 45 of non-monocrystal silicon carbide solar cells in which the p-type or n-type layer has a laminate structure.

EXAMPLE 31

A solar cell SC Ex. 31 whose p-type layer had a laminate structure was produced as follows:

First, a substrate was prepared as follows. Similar to Example 16, a stainless steel substrate of 50×50 mm$^2$ was ultrasonic-cleaned with acetone and isopropanol and then dried. By the sputtering method, a reflecting Ag (silver) layer was formed to a thickness of 0.3 μm on the surface of the stainless steel substrate, and a reflection enhancing layer of ZnO (zinc oxide) was formed thereon to a thickness of 1.0 μm while the substrate temperature was maintained at 350° C.

Then, semiconductor layers were formed on the reflection enhancing layer by using a production system comprising the raw material gas supplying apparatus 2000 and the deposition apparatus 400, as shown in FIG. 4, the system employing the glow discharge decomposition method.

Referring to FIG. 4, the gas cylinders 2041–2047 contained raw material gasses for forming photovoltaic devices according to the present invention as follows: the cylinder 2041 contained SiH$_4$ gas (having a purity of 99.999 %); the cylinder 2042, CH$_4$ gas (having a purity of 99.9999 %); the cylinder 2043, H$_2$ gas (having a purity of 99.9999 %); the cylinder 2044, PH$_3$ gas (having a purity of 99.99 %) prepared by diluting PH$_3$ to 100 ppm with H$_2$ gas (hereinafter, referred to as "the PH$_3$/H$_2$ gas"); the cylinder 2045, a B$_2$H$_6$ gas (having a purity of 99.99%) prepared by diluting B$_2$H$_6$ to 100 ppm with H$_2$ gas (hereinafter, referred to as "the B$_2$H$_6$/H$_2$ gas"); the cylinder 2046, NH$_3$ gas (having a purity of 99.9999%) prepared by diluting NH$_3$ to 1% with H$_2$ gas (hereinafter, referred to as "the NH$_3$/H$_2$ gas"); and the cylinder 2047, O$_2$ gas (having a purity of 99.9999%) prepared by diluting O$_2$ to 1% with He gas (hereinafter, referred to as "the O$_2$/He gas"). The pipes connecting the gas cylinders 2041–2047 to the valves 2021–2027 were filled with the corresponding gases. The pressure of the gases was adjusted to 2 Kg/cm$^2$ by using the corresponding pressure adjusters 2031–2037. The SiH$_4$ gas and the CH$_4$ gas were mixed at a position five meters from the deposition chamber 401.

After the substrate 404 having a reflecting layer and a reflection enhancing layer is fixed, at the side thereof remote from these layers, to the heater 405, and the leak valve 409 of the deposition chamber 401 was closed and the conductance valve 407 was completely opened so as to remove the air from the deposition chamber 401 by a vacuum pump (not shown). When the vacuum gauge 402 indicated about 1×10$^{-4}$ Torr, the valves 2001–2007 and the auxiliary valve 408 were opened to evacuate the corresponding pipes. When the vacuum gauge 402 indicated about 1×10$^{-4}$ Torr again, the valves 2001–2007 were closed and the valves 2031–2037 were gradually opened so as to introduced the gases into the mass flow controllers 2011–2017.

After the above preparation for film formation was completed, semiconductor layers, that is, the n-type layers, the i-type layers, the i-type Si layer, and the p-type layers, were formed on the substrate 404.

The n-type layers were formed as follows. The auxiliary valve 408 and the valve 2003 were gradually opened to introduce the H$_2$ gas through the gas introducing pipe 411 into the deposition chamber 401. The mass flow controller 2013 was operated to achieve a H$_2$ gas flow rate of 50 sccm. The conductance valve 407 was adjusted while monitoring the vacuum gauge 402 so as to achieve a pressure of 1.0 Torr in the deposition chamber 401. The heater 405 was set so as to achieve a substrate temperature of 350° C. When the substrate 404 was sufficiently heated, the valves 2001 and 2004 were gradually opened to introduce the SiH$_4$ gas and PH$_3$/H$_2$ gas into the deposition chamber 401. The flow rates of the SiH$_4$, H$_2$, and PH$_3$/H$_2$ gases were set to 2 sccm, 100 sccm, and 20 sccm, respectively, by operating the corresponding mass flow controllers 2011, 2013, and 2014. A pressure of 1.0 Torr was achieved in the deposition chamber 401 by adjusting the opening of the conductance valve 407 while monitoring the vacuum gauge 402. After observing that the shutter 415 was closed, the output of the RF power source was set to 0.007 W/cm$^3$ to supply RF power to the RF electrode 410, thus causing glow discharge. Then, the shutter 415 was opened to start deposition of an n-type layer on the substrate 404. When the n-type layer was deposited to a thickness of 20 nm, the shutter 415 was closed and then the RF power source 403 was switched off to discontinue the glow discharge. The n-type layer was thus formed. The valves 2001 and 2004 were then closed to stop the flow of the SiH$_4$ gas and PH$_3$/H$_2$ gas into the deposition chamber 401. The valve 2003 was left open to continuously introduce the H$_2$ gas into the deposition chamber 401 for 5 minutes. After closing the valve 2003, the deposition chamber 401 and the connecting pipes were evacuated.

The i-type layers were formed as follows. The valve 2003 was gradually opened to introduce the H$_2$ gas into the deposition chamber 401. The mass flow controller 2013 was operated to achieve a H$_2$ gas flow rate of 300 sccm. The conductance valve 407 was adjusted while monitoring the vacuum gauge 402 so as to achieve a pressure of 0.01 Torr in the deposition chamber 401. The heater 405 was set so as to achieve a substrate temperature of 350° C. When the substrate 404 was sufficiently heated the valves 2001, 2002 were gradually opened to introduce the SiH$_4$ gas and CH$_4$ gas into the deposition chamber 401. The flow rates of the SiH$_4$, CH$_4$, and H$_2$ gases were set to 100 sccm, 30 sccm, and 300 sccm, respectively, by operating the corresponding mass flow controllers 2011, 2012, and 2013. A pressure of 0.01 Torr was achieved in the deposition chamber 401 by adjusting the opening of the conductance valve 407 while monitoring the vacuum gauge 402. Then, the output of the RF power source was set to 0.40 W/cm$^3$ to apply RF power to the RF electrode 410. Subsequently, the output of the μW power source (not shown) was set to 0.2 W/cm$^3$, to introduce the μW power through the dielectric window 413 into the deposition chamber 401, thus causing glow discharge. Then, the shutter 415 was opened to start the deposition of an i-type layer on the n-type layer. The SiH$_4$ and CH$_4$ gas flow rates were varied as indicated in FIG. 5 by using a computer connected to the mass flow controllers. When the i-type layer was deposited to a thickness of 300 nm, the shutter 415 was closed and then the μW power source was switched off to discontinue the glow discharge, followed by switching off the RF power source 403. The i-type layer was thus formed. The valves 2001 and 2002 were then closed to stop the flow of the SiH$_4$ gas and CH$_4$ gas into the deposition chamber 401. The valve 2003 was left open to continuously introduce the H$_2$ gas into the deposition chamber 401 for 5 minutes. After closing the valve 2003, the deposition chamber 401 and the connecting pipes were evacuated.

The i-type Si layer was formed as follows. The valve 2003 was gradually opened to introduce the H$_2$ gas into the deposition chamber 401. The mass flow controller 2013 was operated to achieve a H$_2$ gas flow rate of 50 sccm. The conductance valve 407 was adjusted while monitoring the vacuum gauge 402 so as to achieve a pressure of 1.5 Torr in the deposition chamber 401. The heater 405 was set so as to achieve a substrate temperature of 250° C. When the substrate 404 was sufficiently heated the valve 2001 was gradually opened to introduce the SiH$_4$ gas into the deposition chamber 401. The flow rates of the SiH$_4$ and H$_2$ gases were set to 2 sccm and 100 sccm, respectively, by operating the corresponding mass flow controllers 2011 and 2013.

A pressure of 1.5 Torr was achieved in the deposition chamber 401 by adjusting the opening of the conductance valve 407 while monitoring the vacuum gauge 402. Then, the output of the RF power source was set to 0.007 W/cm$^3$ to introduce RF power to the RF electrode 410, thus causing glow discharge. Then, the shutter 415 was opened to start the deposition of an i-type Si layer on the i-type layer at a rate of 0.1 nm/sec. When the i-type Si layer was deposited to a thickness of 20 nm, the shutter 415 was closed and then the RF power source 403 was switched off to discontinue the glow discharge. The i-type Si layer was thus formed. The valve 2001 was then closed to stop the flow of the SiH$_4$ gas into the deposition chamber 401. The valve 2003 was left open to continuously introduce the H$_2$ gas into the deposition chamber 401 for 5 minutes. After closing the valve 2003, the deposition chamber 401 and the connecting pipes were evacuated.

The p-type layers were formed as follows. The valve 2003 was gradually opened to introduce the H$_2$ gas into the deposition chamber 401. The mass flow controller 2013 was operated to achieve a H$_2$ gas flow rate of 300 sccm. The conductance valve 407 was adjusted while monitoring the vacuum gauge 402 so as to achieve a pressure of 0.01 Torr in the deposition chamber 401. The heater 405 was set so as to achieve a substrate temperature of 200° C. When the substrate 404 was sufficiently heated the valves 2001, 2002, and 2005 were gradually opened to introduce the SiH$_4$ gas, CH$_4$ gas, H$_2$ gas, and B$_2$H$_6$/H$_2$ gas into the deposition chamber 401. The flow rates of the SiH$_4$ gas, CH$_4$ gas, H$_2$ gas, and B$_2$H$_6$/H$_2$ gas were set to 10 sccm, 5 sccm, 300 sccm, and 10 sccm, respectively, by operating the corresponding mass flow controllers. A pressure of 0.02 Torr was achieved in the deposition chamber 401 by adjusting the opening of the conductance valve 407 while monitoring the vacuum gauge 402. Then, the output of the μW power source was set to 0.30 W/cm$^3$, to introduce the μW power through the dielectric window 413 into deposition chamber 401, thus causing glow discharge. Then, the shutter 415 was opened to start deposition of a lightly-doped layer (referred to as "the layer B") on the i-type Si layer. When the layer B was deposited to a thickness of about 3 nm, the shutter 415 was closed and, then, the μW power source was switched off to discontinue the glow discharge. The i-type layer was thus formed. The valves 2001, 2002, and 2005 were then closed to stop the flow of the SiH$_4$, CH$_4$, and B$_2$H$_6$/H$_2$ gases into the deposition chamber 401. The valve 2003 was left open to continuously introduce the H$_2$ gas into the deposition chamber 401 for 5 minutes. After closing the valve 2003, the deposition chamber 401 and the connecting pipes were evacuated.

Subsequently, the valve 2005 was gradually opened to introduce the B$_2$H$_6$/H$_2$ gas into the deposition chamber 401. The B$_2$H$_6$/H$_2$ gas flow rate was adjusted to 1000 sccm by using the corresponding mass flow controller 2015. The pressure inside the deposition chamber 401 was adjusted to 0.02 Torr by operating conductance valve 407 while monitoring the vacuum gauge 402. The output of the μW power source was set to 0.02 W/cm$^3$ to introduce the μW power through the dielectric window 413 into the deposition chamber 401, thus causing glow discharge. Then, the shutter 415 was opened to start deposition of a boron (B) layer (referred to as "the layer A") on the layer B. After depositing the layer A for six seconds, the shutter 415 was closed and then the μW power source was switched off to discontinue the glow discharge. The layer A was thus formed. The valve 2005 was then closed to stop the flow of the B$_2$H$_6$/H$_2$ gas into the deposition chamber 401. The valve 2003 was left open to continuously introduce the H$_2$ gas into the deposition chamber 401 for 5 minutes. After closing the valve 2003, the deposition chamber 401 and the connecting pipes were evacuated.

By the same method, procedure, and conditions as described above, another B layer was deposited on the layer A, followed by depositing thereon another A layer and still another B layer. A p-type layer having a thickness of about 10 nm was thus formed.

The auxiliary valve 408 was closed and the leak valve 409 was opened to permit leakage of the deposition chamber 401.

Then, ITO (In$_2$O$_3$+SnO$_2$) and chrome (Cr) were successively deposited on the p-type layer by a normal vacuum vapor deposition method so as to form a transparent electrode having a layer thickness of 80 nm and a current collecting electrode having a layer thickness of 10 μm, respectively.

A non-monocrystal silicon carbide solar cell SC Ex. 31 was thus produced. The conditions for producing the n-type layer, i-type layer, i-type Si layer, and p-type layer of the solar cell SC Ex. 31 are shown in Table 12.

COMPARATIVE EXAMPLE 31-1

A solar cell SC Comp. 31-1 comprising a substrate, a reflecting layer, a reflection enhancing layer, an n-type layer, an i-type layer, an i-type Si layer, a p-type layer, a transparent electrode, and a current collecting layer was produced by the same procedure and conditions as in Example 31, except that the flow rates of the SiH$_4$ and CH$_4$ gases were varied as indicated in FIG. 6 during formation of the i-type layer.

COMPARATIVE EXAMPLE 31-2

A solar cell SC Comp. 31-2 comprising a substrate, a reflecting layer, a reflection enhancing layer, an n-type layer, an i-type layer, an i-type Si layer, a p-type layer, a transparent electrode, and a current collecting layer was produced by the same procesure and conditions as in Example 31, except that the μW power was set to 0.5 W/cm$^3$ during formation of the i-type layer.

COMPARATIVE EXAMPLE 31-3

A solar cell SC Comp. 31-3 comprising a substrate, a reflecting layer, a reflection enhancing layer, an n-type layer, an i-type layer, an i-type Si layer, a p-type layer, a transparent electrode, and a current collecting layer was produced by the same procedure and conditions as in Example 31, except that the RF power was set to 0.15 W/cm$^3$ during formation of the i-type layer.

COMPARATIVE EXAMPLE 31-4

A solar cell SC Comp. 31-4 comprising a substrate, a reflecting layer, a reflection enhancing layer, an n-type layer, an i-type layer, an i-type Si layer, a p-type layer, a transparent electrode, and a current collecting layer was produced by the same procedure and conditions as in Example 31, except that the μW and RF powers were set to 0.5 W/cm$^3$ and 0.55 W/cm$^3$, respectively, during formation of the i-type layer.

COMPARATIVE EXAMPLE 31-5

A solar cell SC Comp. 31-5 comprising a substrate, a reflecting layer, a reflection enhancing layer, an n-type layer, an i-type layer, an i-type Si layer, a p-type layer, a transparent electrode, and a current collecting layer was produced by the same procedure and conditions as in Example 31, except that the pressure inside the deposition chamber 401 was adjusted to 0.08 Torr during formation of the i-type layer.

COMPARATIVE EXAMPLE 31-6

A solar cell SC Comp. 31-6 comprising a substrate, a reflecting layer, a reflection enhancing layer, an n-type layer, an i-type layer, an i-type Si layer, a p-type layer, a transparent electrode, and a current collecting layer was produced by the same procedure and conditions as in Example 31, except that the i-type Si layer was deposited at a rate of 3 nm/sec.

COMPARATIVE EXAMPLE 31-7

A solar cell SC Comp. 31-7 comprising a substrate, a reflecting layer, a reflection enhancing layer, an n-type layer, an i-type layer, an i-type Si layer, a p-type layer, a transparent electrode, and a current collecting layer was produced by the same procedure and conditions as in Example 31, except that the i-type Si layer was deposited to a thickness of 40 nm.

The initial photoelectric conversion efficiencies (photovoltaic power/incident light power) and durabilities of the solar cells SC Ex. 31 and SC Comp. 31-1 to 31-7 were determined. The initial photoelectric conversion efficiency of each solar cell was determined based on the V-I characteristic thereof measured under illumination of AM-1.5 light (100 mW/cm$^2$), As a result, the solar cell SC Ex. 31 achieved an initial photoelectric conversion efficiency 1.03 times as great as that of the solar cell SC Ex. 1.

The ratios of the initial photoelectric conversion efficiencies of the solar cells SC Comp. 31-1 to SC Comp. 31-7 to that of the solar cell SC Ex. 31 are as follows:

| SC Comp. 31-1 | 0.80 |
| SC Comp. 31-2 | 0.61 |
| SC Comp. 31-3 | 0.78 |
| SC Comp. 31-4 | 0.65 |
| SC Comp. 31-5 | 0.75 |
| SC Comp. 31-6 | 0.78 |
| SC Comp. 31-7 | 0.83 |

The durability of each of the solar cells was determined based on the reduction of the photoelectric conversion efficiency (photoelectric conversion efficiency after durability test/initial photoelectric conversion efficiency). The solar cells were placed in the dark at a humidity of 70% and a temperature of 60° C. for 24 hours while being subjected to 3600-rpm vibrations having an amplitude of 1 mm. Then, the photoelectric conversion efficiency of each cell was determined under illumination of AM-1.5 light (100 mW/cm$^2$).

As a result, the solar cell SC Ex. 31 exhibited a durability 1.11 times as great as that of the solar cell SC Ex. 1.

The ratios of the photoelectric conversion efficiency reductions of the solar cells SC Comp. 31-1 to SC Comp. 31-7 to that of the solar cell SC Ex. 31 are as follows:

| SC Comp. 31-1 | 0.81 |
| SC Comp. 31-2 | 0.75 |
| SC Comp. 31-3 | 0.85 |
| SC Comp. 31-4 | 0.80 |
| SC Comp. 31-5 | 0.72 |
| SC Comp. 31-6 | 0.80 |
| SC Comp. 31-7 | 0.85 |

Figure 7:
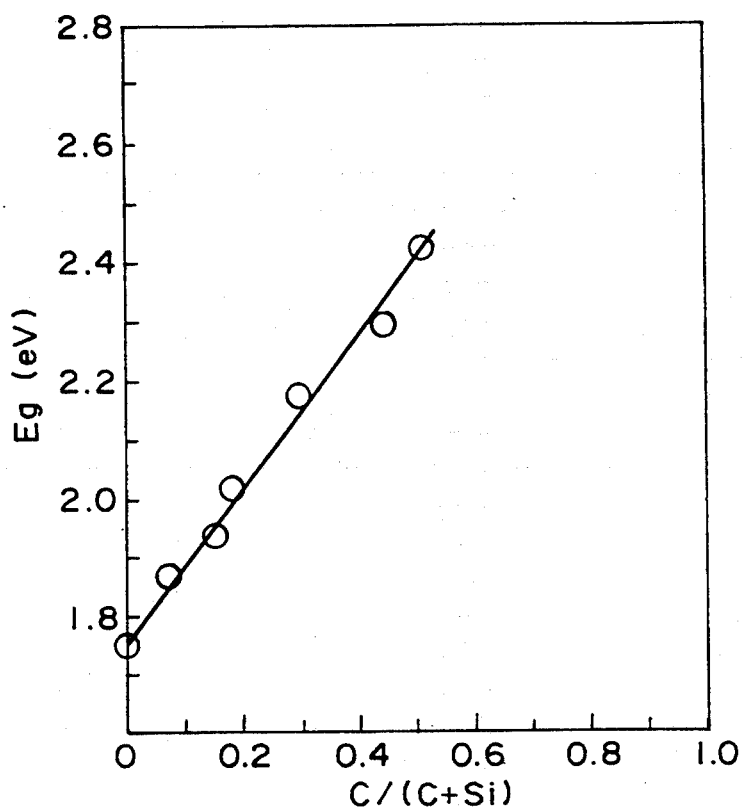
FIG. 7 is a correlation diagram showing the relationship between the composition ratio of Si atoms and C atoms and the band gap.

Several i-type layers were deposited to a thickness of 1 μm on stainless steel substrates and barium borosilicate glass (Corning 7059) substrates to obtain samples for film property analysis under the same conditions as in the formation of the i-type layer in Example 31, except that the flow rates of the SiH$_4$ and CH$_4$ gases were changed to various levels. The samples were analyzed for bandgap (Eg) and composition. As a result, the relationship between the bandgap and the composition ratio of carbon atoms to the total of carbon atoms and silicon atoms was generally the same as indicated in FIG. 7.

Several i-type Si layers were deposited to a thickness of 1 μm on barium borosilicate glass substrates to obtain samples for bandgap determination under the same conditions as in the formation of the i-type Si layer in Example 31. The bandgap of the samples determined by the above-described method was 1.75 eV.

Then i-type layers of the solar cells SC Ex. 31 and SC Comp. 31-1 to SC Comp. 31-7 were analyzed for the Si atom and C atom contents and distributions.

As a result, it was determined that the position of the minimum bandgap in the i-type layer was closer to the p/i interface than it was to the n/i interface in each of the solar cells SC Ex. 31 and SC Comp. 31-2 to SC Comp. 31-7, while it was closer to the n/i interface in the solar cell SC Comp. 31-1.

Therefore, it was shown that the variation of the bandgap with respect to the direction of the layer thickness in the solar cells SC Ex. 31 and SC Comp. 31-1 to SC Comp. 31-7 depended on the flow rate ratio between the silicon-containing raw material gas ($SiH_4$ gas in Examples) and the carbon-containing material gas ($CH_4$ gas in Examples) introduced into the deposition chamber.

Figure 20:
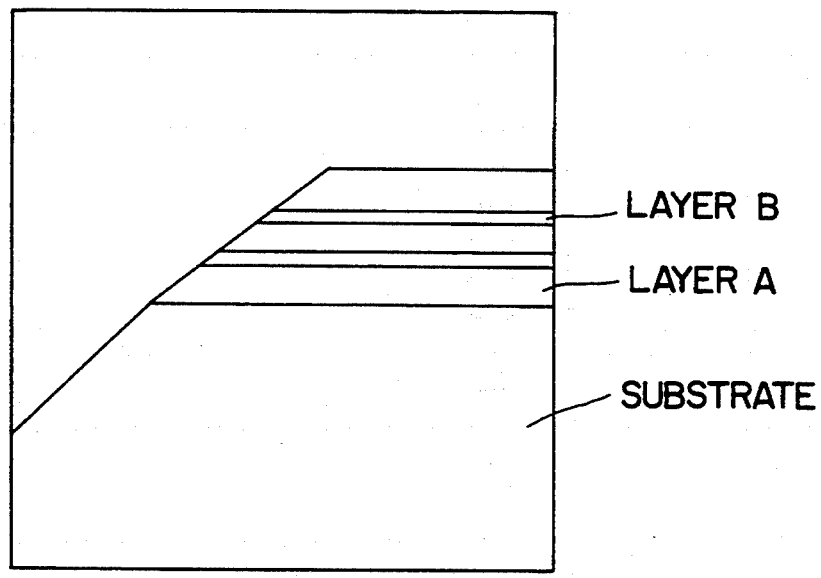
FIG. 20 is a schematic view illustrating a sectional TEM image of a p-type layer.

A section of a p-type layer formed on a silicon substrate (111) was observed by TEM (transmission electron microscopy). A p-type layer was formed on a silicon substrate by generally the same method and procedure as in Example 31, except that deposition of each A layer was continued for 12 seconds. The sample p-type layer was sectioned, and the layers A and layers B in a p-type layer section was observed. As a result, the layers A having thicknesses of about 1 nm and the layers B having thicknesses of about 3 nm were alternately laminated as shown in FIG. 20.

COMPARATIVE EXAMPLE 31-8

Several non-monocrystal silicon carbide solar cells were produced under the same conditions as in Example 31, except that the $\mu W$ power and the RF power were changed to various levels to form the i-type layers of the solar cells. As a result, the deposition rate did not depend on the RF power, but it leveled off when the $\mu W$ power was 0.32 $W/cm^3$ or greater. When the $\mu W$ powers was 0.32 $W/cm^3$ or greater, decomposition of 100% of the $SiH_4$ gas and $CH_4$ gas, which were the raw material gases, was achieved.

The initial photoelectric conversion efficiencies of the solar cells were determined under illumination of AM1.5 light (100 $mW/cm^2$). As a result, the initial photoelectric conversion efficiency was significantly enhanced when the $\mu W$ power was 0.32 $W/cm^3$, the level at which decomposition of 100% of the $SiH_4$ gas and $CH_4$ gas was achieved, or lower than 0.32 $W/cm^3$ and the RF power was greater than the $\mu W$ power.

COMPARATIVE EXAMPLE 31-9

Several non-monocrystal silicon carbide solar cells were produced under the same conditions as in Example 31, except that, to form i-type layers, the flow rates of the $SiH_4$ and $CH_4$ gases introduced into the deposition chamber 401 were adjusted to 50 sccm and 10 sccm, respectively, and no $H_2$ gas was introduced thereinto, and different levels of the $\mu W$ power and RF power were introduced. Like Comparative Example 31-8, the deposition rate did not depend on the RF power, but it leveled off when the $\mu W$ power was 0.18 $W/cm^3$ or greater. When the $\mu W$ power was 0.18 $W/cm^3$ or greater, decomposition of 100% of the $SiH_4$ and $CH_4$ gases was achieved.

The initial photoelectric conversion efficiencies of the solar cells were determined under illumination of AM 1.5 light. The results were generally the same as shown in FIG. 10. The initial photoelectric conversion efficiency was significantly enhanced when the $\mu W$ power was 0.18 $W/cm^3$, the level at which 100% of the $SiH_4$ gas and the $CH_4$ gas were decomposed, or lower than 0.18 $W/cm^3$ and the RF power was greater than the $\mu W$ power.

COMPARATIVE EXAMPLE 31-10

Several non-monocrystal silicon carbide solar cells were produced under the same conditions as in Example 31, except that, to form i-type layers, the flow rates of the $SiH_4$, $CH_4$, and $H_2$ gases introduced into the deposition chamber 401 were adjusted to 200 sccm, 50 sccm, and 500 sccm, respectively, and the heater was set so as to provide a substrate temperature of 300° C., and different levels of the $\mu W$ power and RF power were introduced. Like Comparative Example 31-10, the deposition rate did not depend on the RF power, but it leveled off when the $\mu W$ power was 0.65 $W/cm^3$ or greater. When the $\mu W$ power was 0.65 $W/cm^3$ or greater, decomposition of 100% of the $SiH_4$ and $CH_4$ gases was achieved.

The initial photoelectric conversion efficiencies of the solar cells were determined under illumination of AM1.5 light. The results were generally the same as shown in FIG. 10. The initial photoelectric conversion efficiency was significantly enhanced when the $\mu W$ power was 0.65 $W/cm^3$, the level at which decomposition of 100% of the $SiH_4$ gas was achieved, or lower than 0.65 $W/cm^3$ and the RF power was greater than the $\mu W$ power.

COMPARATIVE EXAMPLE 31-11

Several non-monocrystal silicon carbide solar cells were produced under the same conditions as in Example 31, except that, to form i-type layers, the pressure inside the deposition chamber 401 was changed to various levels within a range from 3 mTorr to 200 mTorr.

The initial photoelectric conversion efficiencies of the solar cells were determined under illumination of AM1.5 light. As a result, the initial photoelectric conversion efficiency was significantly reduced when the pressure inside the deposition chamber 401 was 50 mTorr or greater.

COMPARATIVE EXAMPLE 31-12

Several non-monocrystal silicon carbide solar cells were produced under the same conditions as in Example 31, except that, to form the i-type layer, the flow rate of the $SiH_4$ gas, which is a raw material gas, and the RF power were changed to various levels so as to vary the i-type Si layer deposition rate.

The initial photoelectric conversion efficiencies of the solar cells were determined under illumination of AM1.5 light. As a result, the initial photoelectric conversion efficiency was significantly reduced when the deposition rate was 2 nm/sec or greater.

COMPARATIVE EXAMPLE 31-13

Several non-monocrystal silicon carbide solar cells were produced under the same conditions as in Example 31, except that the thickness of the i-type Si layers was varied. The initial photoelectric conversion efficiencies of the solar cells were determined under illumination of AM1.5 light. As a result, the initial photoelectric conversion efficiency was significantly reduced when the thickness of the i-type layer was 30 nm or greater.

As understood with reference to Comparative Examples 31-1 to 31-13, the solar cell SC Ex. 31 according to the present invention had better characteristics than the solar cells SC Comp. 31-1 to SC Comp. 31-7 and, if the pressure inside the deposition chamber is 50 mTorr or lower, exhibited characteristics regardless of variations of the production conditions such as the material gas flow rates or the substrate temperature.

EXAMPLE 32

Several solar cells were produced in generally the same manner as in Example 31, except that different variation patterns of the flow rates of the $SiH_4$ and $CH_4$ gases were employed during formation of the i-type layers so as to achieve various patterns of the bandgaps (Eg), various sizes of the minimum bandgaps, and various positions of the minimum bandgaps with respect to the direction of the thickness of the i-type layers. The initial photoelectric conversion efficiencies and durabilities of the solar cells were determined in generally the same manner as in Example 31. The solar cells thus formed by changing the variation patterns of the flow rates of the $SiH_4$ and $CH_4$ gases had various bandgap patterns as shown in FIG. 12.

The initial photoelectric conversion efficiencies and durabilities of the solar cells are shown in Table 13. The values shown in Table 13 were obtained by standardization based on the results of the solar cell SC Ex. 32-1.

FIG. 12 and Table 13 indicate that better characteristics can be achieved by solar cells according to the present invention in which the bandgap in the i-type layer gradually varies and the position of the minimum bandgap is closer to the p/i interface than it is to the n/i interface, regardless of the size of the minimum bandgap and the variation pattern of the bandgap.

EXAMPLE 33

A solar cell having layers A formed by the mercury-enhanced photosensitized CVD method was produced. A low-pressure mercury lamp and a quartz glass window having a diameter of 100 mm and a thickness of 10 mm were attached to a film producing system as shown in FIG. 4 so that light from the low-pressure mercury lamp is transmitted through the quartz glass window and into the deposition chamber 401. A shutter for covering the quartz glass window (referred to as "the window shutter") was provided at the side of the window facing the inside of the deposition chamber 401 for shielding the quartz glass window from deposition. Further, mercury (having a purity of 99.999%) was placed in a container having inlet and outlet valves and the container was connected to the pipe between the valve 2005 and the mass flow controller 2015 so that the mercury would be evaporated by bubbling the mercury with the $B_2H_6/H_2$ gas and introduced into the deposition chamber 401 together with the $B_2H_6/H_2$ gas.

A solar cell SC Ex. 33 as shown in FIG. 1 was produced by using the above-described production system by the same method, procedure, and conditions as in Example 31, except for the following differences: the flow rate of the $B_2H_6/H_2$ gas into the deposition chamber 401 was adjusted to 1000 sccm; the pressure inside the deposition chamber 401 was adjusted to 1.0 Torr; the shutter 415 was opened beforehand; and while the low-pressure mercury lamp was switched on, the window shutter was opened for 60 seconds to form a layer A on the layer B.

Like the solar cell SC Ex. 31, the thus-formed solar cell SC Ex. 33 achieved better initial photoelectric conversion efficiency and durability than the solar cells SC Comp. 31-1 to SC Comp. 31-7.

EXAMPLE 34

A solar cell SC Ex. 34 in which the n-type layer and the p-type layer were reversed in position was produced. Table 14 shows the conditions of producing the p-type layer, the i-type Si layer, the i-type layer, and the n-type layer. The i-type Si layer was deposited at a rate of 1 nm/sec. The flow rates of the $SiH_4$ and $CH_4$ gases were varied as indicated in FIG. 6 during formation of the i-type layer so that the position of the minimum bandgap became closer to the p/i interface. The n-type layer was formed using the $PH_3/H_2$ gas in generally the same manner as in Example 31. The substrate and the layers other than the semiconductor layers were formed by the same method and conditions as in Example 31. Like the solar cell SC Ex. 31, the thus-formed solar cell SC Ex. 34 achieved better initial photoelectric conversion efficiency and durability than the solar cells SC Comp. 31-1 to SC Comp. 31-7.

EXAMPLE 35

A non-monocrystal silicon carbide solar cell SC Ex. 35, in which a region including the maximum bandgap in the i-type layer was closer to the p/i interface and had a thickness of 20 nm, was produced by the same method and conditions as in Example 31, except that the $SiH_4$ and $CH_4$ gas flow rates were varied as indicated in FIG. 13A during formation of the i-type layer.

The compositional analysis of the solar cell SC Ex. 35 was performed by generally the same method as in Example 31. The bandgap variation in the i-type layer with respect to the direction of the layer thickness was examined based on the graph in FIG. 7. The result was generally the same as indicated in FIG. 13B. Further, like the solar cell SC Ex. 31, the thus-formed solar cell SC Ex. 35 provided better initial photoelectric conversion efficiency and durability than the solar cells SC Comp. 31-1 to SC Comp. 31-7.

COMPARATIVE EXAMPLE 35

Several solar cells, in each of which a region including the maximum bandgap in the i-type layer was closer to the p/i interface, were produced by the same method and conditions as in Example 35, except that thickness of the region was varied.

The initial photoelectric conversion efficiencies and durabilities of the solar cells were determined. As a result, the solar cells having maximum bandgap regions with thickness within a range between 1 nm and 30 nm achieved better initial photoelectric conversion efficiency and durability than the solar cell SC Ex. 31.

EXAMPLE 36

A non-monocrystal silicon carbide solar cell SC Ex. 36, in which a region including the maximum bandgap in the i-type layer was closer to the n/i interface and had a thickness of 15 nm, was produced by the same method and conditions as in Example 31, except that the $SiH_4$ and $CH_4$ gas flow rates were varied as indicated in FIG. 13C during formation of the i-type layer.

The composition analysis of the solar cell SC Ex. 36 was performed by generally the same method as in Example 31. The bandgap variation in the i-type layer with respect to the direction of the layer thickness was examined based on the graph in FIG. 7. The result was generally the same as indicated in FIG. 13D. Further, like the solar cell SC Ex. 31, the thus-formed solar cell SC Ex. 36 achieved better initial photoelectric conversion efficiency and durability than the solar cells SC¹Comp. 31-1 to SC Comp. 31-7.

COMPARATIVE EXAMPLE 36

Several solar cells, in each of which a region including the maximum bandgap in the i-type layer was closer to the n/i interface, were produced by the same method and conditions as in Example 36, except that the thicknesses of the regions were varied.

The initial photoelectric conversion efficiencies and durabilities of the solar cells were determined. As a result, the solar cells having maximum bandgap regions with thicknesses within a range between 1 nm and 30 nm achieved better initial photoelectric conversion efficiency and durability than the solar cell SC Ex. 31.

EXAMPLE 37

A solar cell whose p-type layer was formed from triethyl boron ($B(C_2H_5)_3$, referred to as "TEB") was produced as follows.

TEB (having a purity of 99.99%) was placed in a liquid cylinder having inlet and outlet valves at normal pressure and temperature. The liquid cylinder was connected to the raw material gas supplying apparatus so that the TEB would be gasified by bubbling with the $H_2$ gas and introduced into the deposition chamber together with the $H_2$ gas.

A layer B was formed on the i-type Si layer by the same procedure and conditions as in Example 31, except that the TEB/$H_2$ gas was introduced, instead of the $B_2H_6/H_2$ gas, into the deposition chamber at a flow rate of 10 sccm. After the $H_2$ gas was introduced into the deposition chamber for 5 minutes, the deposition chamber was evacuated. Subsequently, a layer A was formed on the layer B by the same procedure and conditions as in Example 31, except that the TEB/$H_2$ gas was introduced, instead of the $B_2H_6/H_2$ gas, into the deposition chamber at a flow rate of 1000 sccm. After the $H_2$ gas was introduced into the deposition chamber for 5 minutes, the deposition chamber was evacuated.

Similarly, another layer B was formed on the layer A, followed by forming thereon another layer A and still another layer B. Then, the deposition chamber was evacuated.

The layers other than the p-type layer were formed by the same method, procedure, and conditions as in Example 31.

Like the solar cell SC Ex. 31, the thus formed solar cell Sc Ex. 37 achieved better initial photoelectric conversion efficiency and durability than the solar cells SC Comp. 31-1 to SC Comp. 31-7.

EXAMPLE 38

A non-monocrystal silicon carbide solar cell SC Ex. 38 having an i-type layer containing oxygen atoms was produced by the same method, procedure, and conditions as in Example 31, except that the $O_2$/He gas was introduced into the deposition chamber 401 at a flow rate of 10 sccm in addition to the gases introduced in Example 31. Like the solar cell SC Ex. 31, the solar cell SC Ex. 38 achieved better initial photoelectric conversion efficiency and durability than the solar cells SC Comp. 31-1 to SC Comp. 31-9.

The oxygen atom content in the i-type layer was determined by using the secondary ion mass spectrometer (SIMS). As a result, oxygen atoms were uniformly distributed over the thickness of the i-type layer, and the oxygen content was $2 \times 10^{19}$ atoms/cm³.

EXAMPLE 39

A non-monocrystal silicon carbide solar cell SC Ex. 39 having an i-type layer containing nitrogen atoms was produced by the same method, procedure, and conditions as in Example 31, except that the $NH_3/H_2$ gas was introduced into the deposition chamber 401 at a flow rate of 5 sccm in addition to the gases introduced in Example 31. Like the solar cell SC Ex. 31, the solar cell SC Ex. 39 achieved better initial photoelectric conversion efficiency and durability than the solar cells SC Comp. 31-1 to SC Comp. 31-9. The nitrogen atom content in the i-type layer was determined by using the SIMS. As a result, nitrogen atoms were uniformly distributed, and the nitrogen content was $3 \times 10^{17}$ atoms/cm³.

EXAMPLE 40

A non-monocrystal silicon carbide solar cell SC Ex. 40 having an i-type layer containing oxygen atoms and nitrogen atoms was produced by the same method, procedure, and conditions as in Example 31, except that the $O_2$/He gas and the $NH_3/H_2$ gas were introduced into the deposition chamber 401 at flow rates of 5 sccm and 5 sccm in addition to the gases introduced in Example 31. Like the solar cell SC Ex. 31, the solar cell SC Ex. 40 achieved better initial photoelectric conversion efficiency and durability than the solar cells SC Comp. 31-1 to SC Comp. 31-9.

The oxygen atom and nitrogen atom contents in the i-type layer were determined by using the SIMS. As a result, oxygen atoms and nitrogen atoms were uniformly distributed, and the oxygen and nitrogen contents were $1 \times 10^{19}$ atoms/cm³ and $3 \times 10^{17}$ atoms/cm³, respectively.

EXAMPLE 41

Non-monocrystal silicon-carbide solar cells in which the hydrogen content in the i-type layer varied in correspondence with the silicon content were produced. The $O_2$/He gas cylinder was replaced by a $SiF_4$-gas (purity: 99.999%) cylinder the flow rates of the $SiH_4$ gas, $CH_4$ gas, and $SiF_4$ gas being varied in accordance with the flow rate patterns of FIG. 15A when forming the i-type layer. Upon examination of the changes in band gap in the thickness direction of these solar cells (SC Ex. (example) 41) by the same method as in Example 31, the results as shown in FIG. 15B were obtained, Further, the hydrogen atom and silicon atom contents as a function of in the thickness direction were analyzed by using a secondary ion mass spectrometer. The analysis showed that the hydrogen atom content exhibited a distribution in the thickness direction in correspondence with the silicon atom content, as shown in FIG. 15C.

Measurement of the initial photoelectric conversion efficiency and durability characteristic of these solar cells (SC Ex. 41) showed that they had an initial photoelectric conversion efficiency and durability characteristic which were more satisfactory than those of the comparison solar cells (SC Comp. 31-1) through (SC Comp. 31-7).

EXAMPLE 42

A non-monocrystal silicon-carbide solar cell (SC Ex. 57) was produced by means of a production apparatus based on the microwave plasma CVD method as shown in FIG. 4, by the same method and procedures as in Example 31 except that when forming the semiconductor layer of the non-monocrystal silicon-carbide solar cell as shown in FIG. 1, the silicon atom containing gas (SiH₄ gas) and the carbon atom containing gas (CH₄ gas) were mixed with each other at a position 5 m away from the deposition chamber. It was found that the produced solar cell (SC Ex. 42) had an initial photoelectric conversion efficiency and durability characteristic which were still better than those of the solar cell of (SC Ex. 31).

EXAMPLE 43

A tandem-type solar cell as shown in FIG. 16, having a non-monocrystal silicon-carbide semiconductor layer, was produced by means of the production apparatus of FIG. 4 based on the microwave plasma CVD method of the present invention.

First, the substrate was prepared. As in the case of Example 31, a stainless substrate having a size of 50×50 mm was subjected to ultrasonic cleaning using acetone and isopropanol and then dried. A reflective layer of Ag (silver) was formed on the surface of this stainless substrate to a thickness of 0.3 μm by sputtering. The substrate temperature was set at 350° C., and a surface irregularity was imparted to the substrate surface (texturization). Then, while retaining the substrate temperature at 350° C., a reflection increasing layer of ZnO (zinc oxide) was formed to a thickness of 1.0 μm.

Next, a first n-type layer was formed on the substrate by the same method and procedures as in Example 31. Then, a first i-type layer, first p-type layer, second n-type layer, second i-type layer, i-type Si layer, and second p-type layer were successively formed thereon. When forming the second i-type layer, the flow rates of the SiH₄ and CH₄ gases were varied in accordance with the flow rate changing pattern as shown in FIG. 5. The deposition rate of the i-type Si layer was 0.15 nm/sec, and the second p-type layer was formed in a laminated structure as in Example 31.

Next, as in Example 31, an ITO (In₂O₃+SnO₂) layer having a thickness of 80 nm and serving as a transparent electrode, and a chromium (Cr) layer having a thickness of 10 μm and serving as a collecting electrode, were formed on the second p-type layer by the standard vacuum evaporation method.

In this way, the production of the tandem-type solar cell using the microwave plasma CVD method was completed. This solar cell will be referred to as (SC Ex. 43). The production conditions for each semiconductor layer are given in Table 15.

COMPARATIVE EXAMPLE 43-1

A tandem-type solar cell was produced by the same method and procedures as in Example 43 except that when forming the second i-type layer 1606 of FIG. 16, the flow rates of the SiH₄ gas and the CH₄ gas were varied in accordance with the flow rate changing pattern of FIG. 6. This solar cell is referred to as (SC Comp. 43-1).

COMPARATIVE EXAMPLE 43-2

A tandem-type solar cell was produced by the same method and procedures as in Example 43 except that when forming the second i-type layer 1606 of FIG. 16, the μW power was set to 0.5 W/cm³. This solar cell will be referred to as (SC Comp. 43-2).

COMPARATIVE EXAMPLE 43-3

A tandem-type solar cell was produced by the same method and procedures as in Example 43 except that when forming the second i-type layer 1606 of FIG. 16, the RF power was set to 0.15 W/cm³. This solar cell is referred to as (SC Comp. 43-3).

COMPARATIVE EXAMPLE 43-4

A tandem-type solar cell was produced by the same method and procedures as in Example 43 except that when forming the second i-type layer 1606 of FIG. 16, the μW power and the RF power were set to 0.5 W/cm³ and 0.55 W/cm³, respectively. This solar cell is referred to as (SC Comp. 43-4).

COMPARATIVE EXAMPLE 43-5

A tandem-type solar cell was produced by the same method and procedures as in Example 43 except that when forming the second i-type layer 1606 of FIG. 16, the pressure inside the deposition chamber 401 was set to 0.1 Tort. This solar cell is referred to as (SC Comp. 43-5).

COMPARATIVE EXAMPLE 43-6

A tandem-type solar cell was produced by the same method and procedures as in Example 43 except that when forming the second i-type layer 1607 of FIG. 16, the deposition rate was set to 3 nm/sec. This solar cell is referred to as (SC Comp. 43-6).

COMPARATIVE EXAMPLE 43-7

A tandem-type solar cell was produced by the same method and procedures as in Example 43 except that when forming the second i-type layer 1607 of FIG. 16, the layer thickness was set to 40 nm. This solar cell is referred to as (SC Comp. 43-7).

The initial photoelectric conversion efficiency and durability characteristic of each of these tandem-type solar cells were measured by the same method as in the case of Example 31, and it was found that the (SC Ex. 43) had a photoelectric conversion efficiency and durability characteristic better than those of the tandem type solar cells for comparison (SC Comp. 43-1) through (SC Comp. 43-7).

EXAMPLE 44

A triple-type solar cell as shown in FIG. 17, having a non-monocrystal silicon-carbide semiconductor layer, was produced by means of the production apparatus of FIG. 4 based on the microwave plasma CVD method of the present invention.

First, the substrate was prepared. As in the case of Example 31, a stainless substrate having a size of 50×50 mm was subjected to ultrasonic cleaning using acetone and isopropanol and then dried. A reflective layer of Ag (silver) was formed on the surface of this stainless substrate to a thickness of 0.3 μm by sputtering. The substrate temperature was set at 350° C., and a surface irregularity was imparted-to the substrate surface (texturization). Then, while maintaining the substrate temperature at 350° C., a reflection increasing layer of ZnO (zinc oxide) was formed to a thickness of 1.0 μm.

Next, instead of the NH₃/H₂ gas cylinder, a GeH₄-gas (purity: 99.999%) cylinder was connected, thus completing the preparation for layer formation by the same method and procedures as in Example 31. A first n-type layer was formed on the substrate by the same method and procedures as in Example 31. Then, a first i-type layer (which was formed by varying the GeH$_4$/SiH$_4$ ratio as: 0→0.3→0.5→0.3→0), first p-type layer, second n-type layer, second i-type layer, second p-type layer, third n-type layer, third i-type layer, i-type Si layer, and third p-type layer were successively formed thereon.

When forming the third i-type layer, the flow rates of the SiH$_4$ and CH$_4$ gases were varied in accordance with the flow rate changing pattern as shown in FIG. 5. The deposition rate of the i-type Si layer was 0.15 nm/sec, and the second p-type layer and the third p-type layer were formed in a laminated structure as in Example 31.

Next, as in Example 31, an ITO (In$_2$O$_3$+SnO$_2$) layer having a thickness of 80 nm and serving as a transparent electrode, and a chromium (Cr) layer having a thickness of 10 μm and serving as a collecting electrode, were formed on the third p-type layer by a standard vacuum evaporation method.

In this way, the production of the triple-type solar cell using the microwave plasma CVD method was completed. This solar cell is referred to as (SC Ex. 44). The production conditions for each semiconductor layer are summarized in Table 16.

COMPARATIVE EXAMPLE 44-1

A triple-type solar cell was produced by the same method and procedures as in Example 44 except that when forming the third i-type layer 1709 of FIG. 17, the flow rates of the SiH$_4$ gas and the CH$_4$ gas were varied in accordance with the flow rate changing pattern of FIG. 6. This solar cell is referred to as (SC Comp. 44-1).

COMPARATIVE EXAMPLE 44-2

A triple-type solar cell was produced by the same method and procedures as in Example 44 except that when forming the third i-type layer 1709 of FIG. 17, the μW power was set to 0.5 W/cm$^3$. This solar cell is referred to as (SC Comp. 44-2).

COMPARATIVE EXAMPLE 44-3

A triple-type solar cell was produced by the same method and procedures as in Example 44 except that when forming the third i-type layer 1709 of FIG. 17, the RF power was set to 0.15 W/cm$^3$. This solar cell is be referred to as (SC Comp. 44-3).

COMPARATIVE EXAMPLE 44-4

A triple-type solar cell was produced by the same method and procedures as in Example 44 except that when forming the third i-type layer 1709 of FIG. 17, the μW power and the RF power were set to 0.5 W/cm$^3$ and 0.55 W/cm$^3$, respectively. This solar cell is referred to as (SC Comp. 44-4).

COMPARATIVE EXAMPLE 44-5

A triple-type solar cell was produced by the same method and procedures as in Example 44 except that when forming the third i-type layer 1709 of FIG. 17, the pressure inside the deposition chamber 401 was set to 0.08 Torr. This solar cell is referred to as (SC Comp. 44-5).

COMPARATIVE EXAMPLE 44-6

A triple-type solar cell was produced by the same method and procedures as in Example 44 except that when forming the third i-type layer 1710 of FIG. 17, the deposition rate was set to 3 nm/sec. This solar cell is referred to as (SC Comp. 44-6).

COMPARATIVE EXAMPLE 44-7

A triple-type solar cell was produced by the same method and procedures as in Example 44 except that when forming the third i-type layer 1710 of FIG. 17, the layer thickness was set to 40 nm. This solar cell is referred to as (SC Comp. 44-7).

The initial photoelectric conversion efficiency and durability characteristic of each of these triple-type solar cells were measured by the same method as in the case of Example 44, and it was found that the (SC Ex. 44) had a photoelectric conversion efficiency and durability characteristic better than those of the triple type solar cells for comparison (SC Comp. 44-1) through (SC Comp. 44-7).

EXAMPLE 45

Triple-type solar cells as shown in FIG. 17 were produced by means of the production apparatus of FIG. 4 using the microwave plasma CVD method of the present invention, and were modularized and then applied to a power generation system.

Under the same conditions and by the same method and procedures as in Example 44, sixty-five triple-type solar cells (SC Ex. 44) having a size of 50×50 mm$^2$ were produced. An adhesive sheet consisting of EVA (ethylene vinyl acetate) was placed on an aluminum plate having a thickness of 5.0 mm. Further, a nylon sheet was placed thereon. The solar cells were placed on the nylon sheet and connected in series and in parallel. Another EVA adhesive sheet was placed on these solar cells. Further, a fluorine resin sheet was placed thereon and vacuum-laminated to effect modularization. The initial photoelectric conversion efficiency of the prepared module was then measured by the same method as in Example 31.

The prepared module 1801 was connected to the power generation system of FIG. 18, and a street lamp to be lit at night was used as a load 1805. The entire system is operated by the power of a storage battery 1804 and that of the module 1801, with the latter being set at an angle enabling a maximum quantity of sunlight to be collected. The photo-electric conversion efficiency after one year was measured to obtain a photo-deterioration rate (photoelectric-conversion-efficiency-after-one-year/initial-photoelectric-conversion-efficiency). This module is referred to as (MJ Ex. 45).

COMPARATIVE EXAMPLE 45-1

Sixty-five triple-type solar cells (SC Comp. 44-X) (X: 1 to 7) were produced modularized as in Example 45. These modules are referred to as (MJ Comp. 45-X), The initial photoelectric efficiency and the photoelectric conversion efficiency after one year of these solar cells were measured under the same conditions and by the same method and procedures as in Example 45 to obtain the photo-deterioration ratio.

The following were the photo-deterioration ratio of each of the comparative examples (MJ Comp. 45-X) as compared with that of (MJ Ex. 45):

| Module | Photo-deterioration ratio as compared with that of (MJ Ex. 45) |
| --- | --- |
| MJ Ex. 45 | 1.00 |
| MJ Comp. 45-1 | 0.84 |

| Module | Photo-deterioration ratio as compared with that of (MJ Ex. 45) |
| --- | --- |
| MJ Comp. 45-2 | 0.80 |
| MJ Comp. 45-3 | 0.85 |
| MJ Comp. 45-4 | 0.81 |
| MJ Comp. 45-5 | 0.71 |
| MJ Comp. 45-6 | 0.72 |
| MJ Comp. 45-7 | 0.82 |

The above results showed that the solar cell module of the present invention had better photo-deterioration characteristics than those of the solar cell modules for comparison.

Next, the present invention will be described with reference to examples of the solar cell (46 to 60) in which a valence controlling agent is introduced into the i-type layer and in which the p-type or n-type layer is formed as a laminate.

EXAMPLE 46

In this example, a solar cell was formed in which P and B atoms were introduced into the i-type layer, with the p-type layer being formed in a laminated structure.

First, the substrate was prepared. A stainless substrate having a size of 50×50 mm$^2$ was subjected to ultrasonic cleaning using acetone and isopropanol and then dried. A reflective layer of Ag (silver) was formed on the surface of this stainless substrate to a thickness of 0.3 μm by sputtering at room temperature. Then, at a temperature of 350° C., a reflection increasing layer of ZnO (zinc oxide) was formed to a thickness of 1.0 μm.

Next, a semiconductor layer was formed on the reflection increasing layer by using a production apparatus based on the glow discharge decomposition method, which apparatus was composed of the raw material gas feeding apparatus 2000 and the deposition apparatus 400 shown in FIG. 4. Gas cylinders 2041 through 2047 containing the raw material gases for producing the photovoltaic device of the present invention were used. Numeral 2041 indicates a cylinder containing SiH$_4$ gas (purity: 99.999%); numeral 2042 indicates a cylinder containing CH$_4$ gas (purity: 99.9999%); numeral 2043 indicates a cylinder containing H$_2$ gas (purity: 99.9999%); numeral 2044 indicates a cylinder containing PH$_3$ gas diluted to 100 ppm with H$_2$ gas (purity: 99.99%, hereinafter abbreviated as: "PH$_3$/H$_2$"); numeral 2045 indicates a cylinder containing B$_2$H$_6$ gas diluted to 100 ppm with H$_2$ gas (purity: 99.99%, hereinafter abbreviated as: "B$_2$H$_6$/H$_2$"); numeral 2046 indicates a cylinder containing NH$_3$ gas diluted to 1% with H$_2$ gas (purity: 99.9999%, hereinafter abbreviated as: "NH$_3$/H$_2$"); and numeral 2047 indicates a cylinder containing O$_2$ gas diluted to 1% with H$_2$ gas (purity 99.9999%, hereinafter abbreviated as: "O$_2$/H$_2$"). When installing the gas cylinders 2041 through 2047, the above gases were previously introduced into the gas pipes leading to gas valves 2021 through 2027, the pressure of each gas being adjusted to 2 kg/cm$^2$ by means of pressure regulators 2031 through 2037.

Next, the back surface of a substrate 404, on which the reflection layer and the reflection increasing layer had been formed, was mounted on heater 405. The leak valve 409 of deposition chamber 401 was closed, and conductance valve 407 was fully opened, creating a vacuum inside the deposition chamber 401 by means of a vacuum pump (not shown). When the vacuum meter 402 read approximately $1 \times 10^{-4}$ Torr, the valves 2001 through 2007 and an auxiliary valve 408 were opened, creating a vacuum inside the gas pipes. When the vacuum meter 402 read approximately $1 \times 10^{-4}$ Torr again, the valves 2001 through 2007 were closed, and the pressure regulators 2031 through 2037 were gradually opened, introducing the gases into mass flow controllers 2011 through 2017.

When the preparation for layer formation had thus been completed, semiconductor layers, i.e., an n-type layer, i-type layer, i-type Si layer, and p-type layer, were formed on the substrate 404.

To form the n-type layer, the auxiliary valve 408 and the valve 2003 were gradually opened to introduce H$_2$ gas into the deposition chamber 401 through a gas introduction pipe 411. The mass flow controller 2013 was set to make the flow rate of the H$_2$ gas 50 sccm, and adjustment was performed with the conductance valve while referring to the vacuum meter 402 so that the pressure inside the deposition chamber was 1.0 Torr, setting the heater 405 in such a way as to cause the substrate 404 to reach a temperature of 350° C. When the substrate had been heated to a sufficient degree, the valves 2001 and 2004 were gradually opened to introduce SiH$_4$ gas and PH$_3$/H$_2$ gas into the deposition chamber 401. In this process, adjustment was made by using the mass flow controllers 2011, 2013, and 2014 in such a way as to cause the flow rates of the SiH$_4$ gas, H$_2$ gas, and PH$_3$/H$_2$ gas to be 2 sccm, 100 sccm, and 20 sccm, respectively. Regarding the pressure inside the deposition chamber 401, the opening of the conductance valve 407 was adjusted, while referring to the vacuum meter 402, in such a way as to cause the pressure to be 1.0 Torr. It was confirmed that shutter 415 was closed, and the power of the RF power source was set to 0.007 W/cm$^3$, RF power being supplied to an RF electrode 410 to cause glow discharge. The shutter was then opened, and the formation of the n-type layer on the substrate 404 was started. When the n-type layer had been formed to a thickness of 20 nm, the shutter was closed and the RF power was cut off to stop the glow discharge, thus completing the formation of the n-type layer. The valves 2001 and 2004 were closed to stop the supply of SiH$_4$ gas and PH$_3$/H$_2$ gas into the deposition chamber 401. After supplying H$_2$ gas for five minutes into the deposition chamber 401, the flow valve 2003 was closed, creating a vacuum inside the deposition chamber 401 and the gas pipes.

Next, to form the i-type layer, the valve 2003 was gradually opened to introduce H$_2$ gas into the deposition chamber 401. Adjustment was made with the mass flow controller 2013 to set the flow rate of the H$_2$ gas at 300 sccm. Adjustment was made with the conductance valve, while referring to the vacuum meter 402, to set the pressure inside the deposition chamber at 0.01 Torr, and setting the heater 405 so that the substrate 404 might reach a temperature of 350° C. When the substrate had been heated to a sufficient degree, the valves 2001, 2002, 2004, and 2005 were gradually opened to introduce SiH$_4$ gas, CH$_4$ gas, PH$_3$/H$_2$ gas, and B$_2$H$_6$/H$_2$ gas into the deposition chamber 401. In this process, adjustment was made by using the mass flow controllers to cause the respective flow rates of the SiH$_4$ gas, CH$_4$ gas, H$_2$ gas, PH$_3$/H$_2$ gas, and B$_2$H$_6$/H$_2$ gas to be 100 sccm, 30 sccm, 300 sccm, 2 sccm, and 5 sccm. Regarding the pressure inside the deposition chamber 401, the opening of the conductance valve 407 was adjusted while referring to the vacuum meter 402 to set the pressure at 0.1 Torr.

Next, the output power of the RF power source 403 was set to 0.40 W/cm$^3$ and applied to the RF electrode 410. After that, the output power of the μW power source (not shown) was set to 0.20 W/cm$^3$, and μW power was introduced into the deposition chamber 401 through a dielectric window 413 to cause glow discharge. The shutter was then opened to start the formation of the i-type layer on the n-type layer. By using a computer connected to the mass flow controllers, the respective flow rates of the SiH$_4$ gas and CH$_4$ gas were varied in accordance with the flow rate change pattern shown in FIG. 5. When the i-type layer had been formed to a thickness of 300 nm, the shutter was closed, the μW power source was turned off to stop the glow discharge; and the RF power source was turned off, thus completing the formation of the i-type layer. The valves 2001, 2002, 2004, and 2005 were closed to stop the supply of the SiH$_4$ gas, CH$_4$ gas, PH$_3$/H$_2$ gas, and B$_2$H$_6$/H$_2$ gas into the deposition chamber 401. After supplying H$_2$ gas for five minutes into the deposition chamber 401, the valve 2003 was closed, creating a vacuum inside the deposition chamber 401 and the gas pipes.

Next, to form the i-type Si layer, the valve 2003 was gradually opened to introduce H$_2$ gas into the deposition chamber 401. Adjustment was made with the mass flow controller 2013 to set the flow rate of the H$_2$ gas to 50 sccm. Adjustment was made with the conductance valve, while referring to the vacuum meter 402, to set the pressure inside the deposition chamber at 1.5 Torr, and setting the heater 405 to cause the substrate 404 to reach a temperature of 250° C. When the substrate had been heated to a sufficient degree, the valve 2001 was gradually opened to introduce SiH$_4$ gas into the deposition chamber 401. In this process, adjustment was made by using the mass flow controllers to set the respective flow rates of the SiH$_4$ gas and H$_2$ gas at 2 sccm and 100 sccm. Regarding the pressure inside the deposition chamber 401, the opening of the conductance valve 407 was adjusted while referring to the vacuum meter 402 to set the pressure at 1.5 Torr.

The power of the RF power source was set to 0.007 W/cm$^3$ and RF power was introduced to cause glow discharge. The shutter 415 was opened to start the formation of the i-type Si layer on the i-type layer. When the i-type Si layer had been formed to a thickness of 20 nm at a deposition rate of 0.1 nm/sec, the shutter was closed, and the RF power source was turned off to stop the glow discharge, thus completing the formation of the i-type Si layer. The valve 2001 was then closed to stop the supply of the SiH$_4$ gas into the deposition chamber 401. After supplying H$_2$ gas for five minutes into the deposition chamber 401, the valve 2003 was closed, creating a vacuum inside the deposition chamber 401 and the gas pipes.

To form the p-type layer, the valve 2003 was gradually opened to introduce H$_2$ gas into the deposition chamber 401. Adjustment was made with the mass flow controller 2013 to set the flow rate of the H$_2$ gas at 300 sccm. Adjustment was made with the conductance valve to set the pressure inside the deposition chamber at 0.02 Torr while referring to the vacuum meter 402, setting the heater 405 to cause the substrate 404 to reach a temperature of 200° C. When the substrate had been heated to a sufficient degree, the valves 2001, 2002, and 2005 were gradually opened to introduce SiH$_4$ gas, CH$_4$ gas, H$_2$ gas, and B$_2$H$_6$/H$_2$ gas into the deposition chamber 401. In this process, adjustment was made by using the mass flow controllers to set the respective flow rates of the SiH$_4$ gas, CH$_4$ gas, H$_2$ gas, and B$_2$H$_6$/H$_2$ gas at 10 sccm, 5 sccm, 300 sccm, and 10 sccm. Regarding the pressure inside the deposition chamber 401, the opening of the conductance valve 407 was adjusted while referring to the vacuum meter 402 to set the pressure at 0.02 Torr.

The power of the μW power source was set to 0.30 W/cm$^3$ and μW power was introduced into the deposition chamber 401 through the dielectric window 413 to cause glow discharge, and the shutter 415 was opened to start the formation of a lightly-doped layer (which will be referred to as the "B-layer") on the i-type Si layer. When the B-layer had been formed to a thickness of 3 nm, the shutter was closed, and the μW power source was turned off to stop the glow discharge. The valves 2001, 2002, and 2005 were then closed to stop the supply of the SiH$_4$ gas, CH$_4$ gas, and B$_2$H$_6$/H$_2$ gas into the deposition chamber 401. After supplying H$_2$ gas for five minutes into the deposition chamber 401, the valve 2003 was closed, creating a vacuum inside the deposition chamber 401 and the gas pipes.

Next, valve 2005 was gradually opened to introduce B$_2$H$_6$/H$_2$ gas into the deposition chamber 401, making adjustment with the mass flow controller to set the flow rate of the gas t 1000 sccm. Adjustment was made with the conductance valve, while referring to the vacuum meter 402, to set the pressure inside the deposition chamber 401 at 0.02 Torr. The power of the μW power source was set at 0.20 W/cm$^3$ and μW power was introduced into the deposition chamber 401 to cause glow discharge. The shutter 415 was then opened to start the formation of a boron layer (which will be referred to as the "A-layer") on the B-layer. After six seconds had elapsed, the shutter was closed, and the μW power source was turned off to stop the glow discharge. The valve 2005 was closed to stop the supply of the B$_2$H$_6$/H$_2$ gas into the deposition chamber 401. After supplying H$_2$ gas for five minutes into the deposition chamber 401, the valve 2003 was closed, creating a vacuum inside the deposition chamber 401 and the gas pipes Subsequently, B and A-layers were formed in alternate succession on the A-layer by the same method and procedures and under the same conditions as described above, thereby completing the formation of a p-type layer having a thickness of approximately 10 nm.

The auxiliary valve 408 was closed and the leak valve 409 was opened to effect leakage of the deposition chamber 401.

Next, an ITO (In$_2$O$_3$+SnO$_2$) layer having a thickness of 80 nm and serving as a transparent electrode, and a chromium (Cr) layer having a thickness of 10 μm and serving as a collecting electrode, were respectively formed on the p-type layer by a standard vacuum evaporation method. In this way, the production of the non-monocrystal silicon-carbide solar cell was completed. This solar cell is referred to as (SC Ex. 46). The production conditions for the formation of the n-type layer, i-type layer, i-type Si layer, and p-type layer are given in Table 17.

COMPARATIVE EXAMPLE 46-1

A solar cell was produced by forming a reflective layer, reflection increasing layer, n-type layer, i-type layer, i-type Si layer, p-type layer, transparent electrode, and collecting electrode on a substrate under the same conditions and by the same procedures as in Example 46 except that the flow rates of the SiH4 gas and CH4 gas when forming the i-type layer were adjusted in accordance with the flow rate pattern shown in FIG. 6 by their respective mass flow controllers. This solar cell is referred to as (SC Comp. 46-1).

COMPARATIVE EXAMPLE 46-2

A solar cell was produced by forming a reflective layer, reflection increasing layer, n-type layer, i-type layer, i-type Si layer, p-type layer, transparent electrode, and collecting electrode on a substrate by the same method and procedures as in Example 46 except that the PH3/H2 gas was not supplied when forming the i-type layer. This solar cell is referred to as (SC Comp. 46-2).

COMPARATIVE EXAMPLE 46-3

A solar cell was produced by forming a reflective layer, reflection increasing layer, n-type layer, i-type layer, i-type Si layer, p-type layer, transparent electrode, and collecting electrode on a substrate by the same method and procedures as in Example 46 except that the B2H6/H2 gas was not supplied when forming the i-type layer. This solar cell is referred to as (SC Comp. 46-3).

COMPARATIVE EXAMPLE 46-4

A solar cell was produced by forming a reflective layer, reflection increasing layer, n-type layer, i-type layer, i-type Si layer, p-type layer, transparent electrode, and collecting electrode on a substrate under the same conditions and by the same procedures as in Example 46 except that the $\mu$W power when forming the i-type layer was set at 0.5 W/cm$^3$. This solar cell is referred to as (SC Comp. 46-4).

COMPARATIVE EXAMPLE 46-5

A solar cell was produced by forming a reflective layer, reflection increasing layer, n-type layer, i-type layer, i-type Si layer, p-type layer, transparent electrode, and collecting electrode on a substrate under the same conditions and by the same procedures as in Example 46 except that the RF power when forming the i-type layer was set at 0.15 W/cm$^3$. This solar cell is be referred to as (SC Comp. 46-5).

COMPARATIVE EXAMPLE 46-6

A solar cell was produced by forming a reflective layer, reflection increasing layer, n-type layer, i-type layer, i-type Si layer, p-type layer, transparent electrode, and collecting electrode on a substrate under the same conditions and by the same procedures as in Example 46 except that the $\mu$W power and RF power when forming the i-type layer were set at 0.5 W/cm$^3$ and 0.55 W/cm$^3$ respectively. This solar cell is referred to as (SC Comp. 46-6).

COMPARATIVE EXAMPLE 46-7

A solar cell was produced by forming a reflective layer, reflection increasing layer, n-type layer, i-type layer, i-type Si layer, p-type layer, transparent electrode, and collecting electrode on a substrate under the same conditions and by the same procedures as in Example 46 except that the pressure inside the deposition chamber when forming the i-type layer was set at 0.08 Torr. This solar cell is referred to as (SC Comp. 46-7).

COMPARATIVE EXAMPLE 46-8

A solar cell was produced by forming a reflective layer, reflection increasing layer, n-type layer, i-type layer, i-type Si layer, p-type layer, transparent electrode, and collecting electrode on a substrate under the same conditions and by the same procedures as in Example 46 except that the deposition rate when forming the i-type Si layer was 3 nm/sec. This solar cell is referred to as (SC Comp. 46-8).

COMPARATIVE EXAMPLE 46-9

A solar cell was produced by forming a reflective layer, reflection increasing layer, n-type layer, i-type layer, i-type Si layer, p-type layer, transparent electrode, and collecting electrode on a substrate under the same conditions and by the same procedures as in Example 46 except that the layer thickness when forming the i-type Si layer was 40 nm, This solar cell is referred to as (SC Comp. 46-9).

The initial photoelectric conversion efficiency (photovoltaic-power/incident-light-power) and durability characteristic of the above solar cells (SC Ex. 46) and (SC Comp. 46-1) through (SC Comp. 46-9) were measured. The measurement of the initial photoelectric conversion efficiency was effected by measuring the V-I characteristics of the produced solar cells under AM-1.5 (100 mW/cm$^2$) light irradiation.

The measurement results showed that the solar cell of this example (SC Ex. 46) had an initial photoelectric conversion efficiency which was 1.031 times higher than that of the solar cell of the first example (SC Ex. 1), thus indicating a further improvement in characteristics, The initial photoelectric conversion efficiency of each of the solar cells (SC Comp. 46-1) through (SC Comp. 46-9) as compared with that of the solar cell (SC Ex. 46) (i,e., assuming that the latter was 1.0) was as follows:

| | |
|---|---|
| (SC Comp. 46-1) | 0.76 |
| (SC Comp. 46-2) | 0.74 |
| (SC Comp. 46-3) | 0.73 |
| (SC Comp. 46-4) | 0.63 |
| (SC Comp. 46-5) | 0.80 |
| (SC Comp. 46-6) | 0.65 |
| (SC Comp. 46-7) | 0.72 |
| (SC Comp. 46-8) | 0.74 |
| (SC Comp. 46-9) | 0.80 |

The measurement of the durability characteristic was performed by measuring the reduction in photoelectric conversion efficiency (photoelectric-conversion-efficiency-after-durability-test/initial-photoelectric-conversion-efficiency) of the produced solar cells under the light irradiation condition of AM-1.5 (100 mW/cm$^2$) after being placed in the dark at a humidity of 70% and a temperature of 60° C. and subjected, for 24 hours, to an oscillation having a frequency of 3600 rpm and an amplitude of 1 mm.

The results of the measurement showed that the durability characteristic of the solar cell of this example (SC Ex. 46) was superior to that of the solar cell of the first example (SC Ex. 1).

The reduction in photoelectric conversion efficiency of each of the solar cells (SC Comp. 46-1) through (SC Comp. 46-9) as compared with that of the solar cell (SC Ex. 46) (i.e., assuming that the latter was 1.0) was as follows:

| | |
|---|---|
| (SC Comp. 46-1) | 0.75 |
| (SC Comp. 46-2) | 0.74 |
| (SC Comp. 46-3) | 0.73 |
| (SC Comp. 46-4) | 0.65 |
| (SC Comp. 46-5) | 0.82 |
| (SC Comp. 46-6) | 0.70 |
| (SC Comp. 46-7) | 0.71 |
| (SC Comp. 46-8) | 0.76 |
| (SC Comp. 46-9) | 0.86 |

Samples for film property measurement were prepared by forming i-type layers to a thickness of 1 μm on substrates under the same conditions as in the case of the i-type layer of Example 46 except that a stainless substrate and a substrate of barium boro-silicate glass (7059, manufactured by Corning Co., Ltd.) were used and the flow rates of the $SiH_4$ gas and $CH_4$ gas were varied.

The band gap (Eg) and the composition of the samples for film property measurement thus produced were analyzed to examine the relationship between the composition ratio of the Si (silicon) atoms to the C (carbon) atoms and the band gap, the results obtained being the same as those of FIG. 7.

Also, regarding the i-type Si layer, a sample for band gap measurement was prepared by forming an i-type Si layer to a thickness of 1 μm on a barium boro-silicate glass substrate under the same conditions as in the case of Example 46. The band gap of this sample as measured by the above measurement method was 1.75 eV.

Next, the composition analysis in the thickness direction of the Si and C atoms was conducted on the i-type layers of the produced solar cells (SC Ex. 46) and (SC Comp. 46-1) through (SC Comp. 46-9).

From the relationship between the Si-atoms/C-atoms composition ratio and the band gap, the changes in band gap in the thickness direction in the i-type layer and i-type Si layer were obtained. In the solar cells (SC Ex. 46) and (SC Comp. 46-2) through (SC Comp. 46-9), the minimum band-gap position was offset toward the p/i interface from the center of the i-type layer, and, in the solar cell of (SC Comp. 46-1), the minimum band-gap position was offset toward the n/i interface from the center of the i-type layer.

It was found that the changes in band gap with respect to the thickness direction of the solar cells (SC Ex. 46) and (SC Comp. 46-1) through (SC Comp. 46-9) depended on the ratio of the gases fed into the deposition chamber, i.e., the gas containing Si ($SiH_4$ in this case) and the gas containing C ($CH_4$ in this case).

Next, composition analysis in the thickness direction of the P and B atoms in the i-type layer was performed on the solar cells (SC Ex. 46) and (SC Comp. 46-1) through (SC Comp. 46-9) by using a secondary ion mass spectrometer (IMS-3F, manufactured by CAMECA). The measurement results showed that the P and B atoms were uniformly distributed in the thickness direction, with the composition ratio being as follows:

| | | | | |
|---|---|---|---|---|
| (SC Ex. 46) | P/(Si + C) | not more than 3 ppm | B/(Si + C) | not more than 10 ppm |
| (SC Comp. 46-1) | P/(Si + C) | not more than 3 ppm | B/(Si + C) | not more than 10 ppm |
| (SC Comp. 46-2) | P/(Si + C) | N.D | B/(Si + C) | not more than 10 ppm |
| (SC Comp. 46-3) | P/(Si + C) | not more than 3 ppm | B/(Si + C) | N.D |
| (SC Comp. 46-4) | P/(Si + C) | not more than 4 ppm | B/(Si + C) | not more than 18 ppm |
| (SC Comp. 46-5) | P/(Si + C) | not more than 3 ppm | B/(Si + C) | not more than 10 ppm |
| (SC Comp. 46-6) | P/(Si + C) | not more than 4 ppm | B/(Si + C) | not more than 17 ppm |
| (SC Comp. 46-7) | P/(Si + C) | not more than 3 ppm | B/(Si + C) | not more than 10 ppm |
| (SC-Comp. 46-8) | P/(Si + C) | not more than 3 ppm | B/(Si + C) | not more than 10 ppm |
| (SC Comp. 46-9) | P/(Si + C) | not more than 3 ppm | B/(Si + C) | not more than 10 ppm |

"N.D." indicates "Not Detectable", a level below the detection limit.

COMPARATIVE EXAMPLE 46-10

Several non-monocrystal silicon-carbide solar cells were produced under the same conditions as in the case of Example 46 except that when forming the i-type layer, the μW power and RF power were varied.

It was found that the deposition rate did not depend on the RF power; when the μW power was 0.32 $W/cm^3$ or more, the deposition rate was constant, the raw material gases, i.e., the $SiH_4$ gas and the $CH_4$ gas, being completely decomposed with this level of power.

Further, measurement of the initial photoelectric conversion efficiency under the light irradiation condition of AM 1.5 (100 $mW/cm^2$) showed that a substantial improvement in initial photoelectric efficiency could be obtained when the μW power was not higher than a level at which it could completely decompose the $SiH_4$ and $CH_4$ gases (0.32 $W/cm^3$) and the RF power was larger than the μW power.

COMPARATIVE EXAMPLE 46-11

Several non-monocrystal silicon-carbide solar cells were formed under the same conditions as in the case of Example 46 except that when forming the i-type layer, the flow rates of the gases introduced into the deposition chamber 401 were changed to: $SiH_4$ gas: 50 sccm; and $CH_4$ gas: 10 sccm, and no $H_2$ gas was introduced, with the μW power and RF power being varied.

Investigation of the relationship between the deposition rate and the μW power and RF power showed that as in the case of Comparative Example 46-10, the deposition rate did not depend on the RF power and was constant when the μW power was 0.18 $W/cm^3$ or more, the raw material gases, i.e., the $SiH_4$ gas and the $CH_4$ gas, being completely decomposed with this level of μW power.

Measurement of the initial photoelectric conversion efficiency of the solar cells when irradiated with light of AM 1.5 showed results similar to those of FIG. 10. That is, it was found that a substantial improvement in initial photoelectric conversion efficiency could be obtained when the μW power was at a level not higher than the one at which it could completely decompose the $SiH_4$ gas and $CH_4$ gas (0.18 $W/cm^3$) and the RF power was larger than the μW power.

COMPARATIVE EXAMPLE 46-12

Several non-monocrystal silicon-carbide solar cells were produced under the same conditions as in the case of Example 46 except that when forming the i-type layer, the flow rates of the gases introduced into the deposition chamber 401 were changed to: $SiH_4$ gas: 200 sccm; $CH_4$ gas: 50 sccm; and $H_2$ gas: 500 sccm, with the μW power and RF power being varied and by setting the heater so as to provide a substrate temperature of 300° C. Investigation of the relationship between the deposition rate and the μW power and RF power showed that as in the case of Comparative Example 46-10, the deposition rate did not depend on the RF power and was constant at a level of 0.65 W/cm$^3$ or more, the raw material gases, i.e., the SiH$_4$ gas and the CH$_4$ gas, being completely decomposed with this level of power.

Measurement of the initial photoelectric conversion efficiency of the solar cells when irradiated with light of AM 1.5 showed results similar to those of FIG. 10. That is, it was found that a substantial improvement in initial photoelectric conversion efficiency could be obtained when the μW power was at a level not higher than the one at which it could completely decompose the SiH$_4$ gas (0.65 W/cm$^3$) and the RF power was larger than the μW power.

COMPARATIVE EXAMPLE 46-13

Several non-monocrystal silicon-carbide solar cells were produced under the same conditions as in the case of Example 46 except that when forming the i-type layer, the pressure inside the deposition chamber was varied from 3 mTorr to 200 mTorr. Measurement of the initial photoelectric conversion efficiency of the solar cells when irradiated with light of AM 1.5 showed that a substantial reduction in initial photoelectric conversion efficiency occurred at a pressure level not lower than 50 mTorr.

COMPARATIVE EXAMPLE 46-14

Several non-monocrystal silicon-carbide solar cells with different i-type-Si-layer deposition rates were produced under the same conditions as in the case of Example 46 except that when forming the i-type layer, the flow rates of the raw material gas, SiH$_4$ gas, and the RF power were varied.

Measurement of the initial photoelectric conversion efficiency of the solar cells when irradiated with light of AM 1.5 showed that a substantial reduction in initial photoelectric conversion efficiency occurred at a deposition rate of not lower than 2 nm/sec.

COMPARATIVE EXAMPLE 46-15

Several non-monocrystal silicon-carbide solar cells were produced under the same conditions as in the case of Example 46 except that when forming the i-type layer, the thickness of the i-type Si layers was varied. Measurement of the initial photoelectric conversion efficiency of the solar cells when irradiated with light of AM 1.5 showed that a substantial reduction in initial photoelectric conversion efficiency occurred with an i-type-Si-layer thickness of 30 nm or more.

Thus, as seen from [Comparative Example 46-1] through [Comparative Example 46-15], the solar cell of the present invention (SC Ex. 46) exhibited better characteristics than those of the solar cells for comparison, (SC Comp. 46-1) through (SC Comp. 46-9), demonstrating that at a pressure not lower than 50 mTorr, it is possible to obtain excellent characteristics without depending upon the conditions, such as the raw material gas flow rate and the substrate temperature.

EXAMPLE 47

Several solar cells were produced under the same conditions as in Example 46 except that the minimum band-gap (Eg) position in the thickness direction, the magnitude of the minimum value, and the pattern thereof were varied, and the initial photoelectric conversion efficiency and durability characteristic thereof were examined in the same way as in Example 46. The conditions were the same as in the case of Example 46 except for the pattern of change the SiH$_4$ gas flow rate and the CH$_4$ gas flow rate in the i-type layer. In this example, solar cells as shown in the band chart of FIG. 12 were produced by varying the pattern of change of the SiH$_4$ gas flow rate and the CH$_4$ gas flow rate.

Table 18 shows the results of examination of the initial photoelectric conversion efficiency and durability characteristic of these solar cells. In the table, the individual values are standardized using the values of (SC Ex. 47-1) as a reference.

As can be seen from the table, for the solar cells prepared in accordance with the present invention, the results did not depend upon the magnitude of the band-gap minimum value or the pattern of change in which the band gap of the i-type layer changed smoothly in the thickness direction, with the band-gap minimum value positon being offset toward the p/i interface from the center of the i-type layer, proved themselves superior to the comparative examples.

EXAMPLE 48

Several solar cells were produced under the same conditions as in Example 46 except that the concentration and type of the valence controlling agent of the i-type layer were varied, and the initial photoelectric conversion efficiency and durability characteristics thereof were examined in the same way as in Example 46.

EXAMPLE 48-1

A solar cell (SC Ex. 48-1) was produced at a 20% higher flow rate of the gas (B$_2$H$_6$/H$_2$ gas) for the valence controlling agent serving as the acceptor of the i-type layer, with the total H$_2$ flow rate being the same as in Example 46. It was found that as in the case of (SC Ex. 46), this solar cell had an initial photoelectric conversion efficiency and durability characteristic which were more satisfactory than those of the solar cells for comparison, (SC Comp. 46-1) through (SC Comp. 46-9).

EXAMPLE 48-2

A solar cell (SC Ex. 48-2) was produced at a 5 times higher flow rate of the gas (B$_2$H$_6$/H$_2$ gas) for the valence controlling agent serving as the acceptor of the i-type layer, with the total H$_2$ flow rate being the same as in Example 46. It was found that as in the case of (SC Ex. 46), this solar cell had an initial photoelectric conversion efficiency and durability characteristic which were more satisfactory than those of the solar cells for comparison, (SC Comp. 46-1) through (SC Comp. 46-9).

EXAMPLE 48-3

A solar cell (SC Ex. 48-3) was produced at a 20% higher flow rate of the gas (PH$_3$/H$_2$ gas) for the valence controlling agent serving as the donor of the i-type layer, with the total H$_2$ flow rate being the same as in Example 46. It was found that as in the case of (SC Ex. 46), this solar cell had an initial photoelectric conversion efficiency and durability characteristic which were more satisfactory than those of the solar cells for comparison, (SC Comp. 46-1) through (SC Comp. 46-9).

EXAMPLE 48-4

A solar cell (SC Ex. 48-4) was produced at a 5 times higher flow rate of the gas ($PH_3/H_2$ gas) for the valence controlling agent serving as the donor of the i-type layer, with the total $H_2$ flow rate being the same as in Example 46. It was found that as in the case of (SC Ex. 46), this solar cell had an initial photoelectric conversion efficiency and durability characteristic which were more satisfactory than those of the solar cells for comparison, (SC Comp. 46-1) through (SC Comp. 46-9).

EXAMPLE 48-5

A solar cell (SC Ex. 48-5) was produced by the same method and means as in the case of Example 46 except that TMA, which is liquid at room temperature and normal pressure, was used instead of the $B_2H_6/H_2$ gas, as the gas for the valence controlling agent serving as the acceptor of the i-type layer, by gasifying liquid TMA (purity: 99.99%) contained in a cylinder through bubbling by hydrogen gas and introducing it into the deposition chamber 401, with the flow rate of the $TMA/H_2$ gas being 10 sccm. It was found that as in the case of (SC Ex. 46), the produced solar cell (SC Ex. 48-5) had an initial photoelectric conversion efficiency and durability characteristic which were better than those of the solar cells for comparison, (SC Comp. 46-1) through (SC Comp. 46-9).

EXAMPLE 48-6

A solar cell (SC Ex. 48-6) was produced by the same method and means as in the case of Example 46 except that hydrogen sulfide gas ($H_2S$) was used instead of the $PH_3/H_2$ gas, as the gas for the valence controlling agent serving as the donor of the i-type layer, the $H_2S$ gas (purity: 99.999%) diluted with hydrogen ($H_2$) to 100 ppm (hereinafter abbreviated as "$H_2S/H_2$") being contained in a $H_2S$ gas cylinder instead of the gas cylinder of $NH_3/H_2$ in Example 46, with the flow rate of the $H_2S/H_2$ gas being 1 sccm. It was found that as in the case of (SC Ex. 46), the produced solar cell (SC Ex. 48-6) had an initial photoelectric conversion efficiency and durability characteristic which were better than those of the solar cells for comparison, (SC Comp. 46-1) through (SC Comp. 46-9).

EXAMPLE 49

A solar cell was produced in which the deposition order of the n-type layer and p-type layer was reversed. Table 19 shows the layer forming conditions for the p-type layer, i-type Si layer, i-type layer, and n-type layer. When forming the i-type layer, the flow rates of the $SiH_4$ gas and $CH_4$ gas were varied in accordance with the pattern of FIG. 6 so that the band-gap minimum value may be at a position relatively close to the p/i interface. The i-type Si layer was formed at a deposition rate of 0.1 nm/sec, and the n-type layer was formed in a laminate structure as in the case of Example 46, using $PH_3/H_2$ gas. The layers other than the semiconductor layers and the substrate were prepared under the same conditions and by the same method as in Example 46. It was found that as in the case of (SC Ex. 46), the produced solar cell (SC Ex. 49) had an initial photoelectric conversion efficiency and durability characteristic which were better than those of the solar cells for comparison, (SC Comp. 46-1) through (SC Comp. 46-9),

EXAMPLE 50

A non-monocrystal silicon-carbide solar cell in which the maximum band gap of the i-type layer was in the vicinity of the p/i interface and the thickness of that region was 20 nm was produced under the same conditions and by the same methods as in Example 46 except that the flow-rate varying pattern of the i-type layer was changed to the one as shown in FIG. 13A. Then, the composition of the solar cell was analyzed in the same way as in Example 46, and the changes in band gap in the thickness direction of the i-type layer were examined on the basis of FIG. 7, obtaining results as shown in FIG. 13B.

It was found that as in the case of (SC Ex. 46), the produced solar cell (SC Ex. 50) had an initial photoelectric conversion efficiency and durability characteristics which were better than those of the solar cells for comparison, (SC Comp. 46-1) through (SC Comp. 46-9).

COMPARATIVE EXAMPLE 50

Several non-monocrystal silicon-carbide solar cells having the maximum band gap on the side of the p/i interface were produced, while varying the thickness of that region. Except for the thickness of the region, they were prepared under the same conditions and by the same method as in the case of Example 50.

Measurement of the initial photoelectric conversion efficiency and durability characteristic of the produced solar cells showed that a photoelectric conversion efficiency and durability characteristic better than those of the solar cell of Example 46 (SC Ex. 46) could be obtained when the thickness of the region was not less than 1 nm and not more than 30 nm.

EXAMPLE 51

A solar cell having the maximum band gap of the i-type layer in the vicinity of the n/i interface and having a thickness of 15 nm in that region was produced under the same conditions and by the same method as in Example 46 except that the flow rate varying pattern of the i-type layer was changed to the flow rate pattern as shown in FIG. 13C. Then, the composition of the solar cell was analyzed in the same way as in Example 46, and the changes in band gap in the thickness direction of the i-type layer were examined on the basis of FIG. 7, obtaining results as shown in FIG. 13D.

It was found that as in the case of (SC Ex. 46), the produced solar cell (SC Ex. 51) had an initial photoelectric conversion efficiency and durability characteristic which were more satisfactory than those of the solar cells for comparison, (SC Comp. 46-1) through (SC Comp. 46-9).

COMPARATIVE EXAMPLE 51

Several non-monocrystal silicon-carbide solar cells having the maximum band gap in the vicinity of the n/i interface were produced, while varying the thickness of that region. Except for the thickness of the region, the solar cells were prepared under the same conditions and by the same method as in the case of Example 51.

Measurement of the initial photoelectric conversion efficiency and durability characteristic of the produced solar cells showed that a photoelectric conversion efficiency and durability characteristic better than those of the solar cell of Example 46 (SC Ex. 46) could be obtained when the thickness of the region was not less than 1 nm and not more than 30 nm.

EXAMPLE 52

A non-monocrystal silicon-carbide solar cell in which the valence controlling agent is distributed within the i-type layer was produced under the same conditions and by the same methods procedures as in Example 46 except that the flow rate varying patterns of the $PH_3/H_2$ gas and the $B_2H_6/H_2$ gas were changed to the flow rate pattern as shown in FIG. 19A.

It was found that as in the case of (SC Ex. 46), the produced solar cell (SC Ex. 52) had an initial photoelectric conversion efficiency and durability characteristic which were more satisfactory than those of the solar cells for comparison, (SC Comp. 46-1) through (SC Comp. 46-9).

Further, examination of the changes in the P and B atoms in the thickness direction by using SIMS (secondary ion mass spectrometer) showed that as shown in FIG. 19B, the P-atom and B-atom contents were minimum at the position where the band gap was minimum.

EXAMPLE 53

A non-monocrystal silicon carbide solar cell containing oxygen atoms in the i-type layer was produced under the same conditions and by the same method and procedures as in the case of Example 46 except that when forming the i-type layer, apart from the gases used in Example 46, $O_2/He$ gas was introduced into the deposition chamber 401 at a rate of 10 sccm. It was found that as in the case of (SC Ex. 46), the produced solar cell (SC Ex. 53) had an initial photoelectric conversion efficiency and durability characteristic which were more satisfactory than those of the solar cells for comparison, (SC Comp. 46-1) through (SC Comp. 46-9). Further, examination of the oxygen atom content in the i-type layer by means of SIMS showed that the solar cell contained oxygen atoms substantially uniformly at a density of $2 \times 10^{19}$ (atoms/cm$^3$).

EXAMPLE 54

A non-monocrystal silicon carbide solar cell containing nitrogen atoms in the i-type layer was produced under the same conditions and by the same method and procedures as in the case of Example 46 except that when forming the i-type layer, apart from the gases used in Example 46, $NH_3/H_2$ gas was introduced into the deposition chamber 401 at a rate of 5 sccm. It was found that as in the case of (SC Ex. 46), the produced solar cell (SC Ex. 54) had an initial photoelectric conversion efficiency and durability characteristic which were better than those of the solar cells for comparison, (SC Comp. 46-1) through (SC Comp. 46-9).

Further, examination of the nitrogen atom content in the i-type layer by SIMS showed that the solar cell contained nitrogen atoms substantially uniformly at a density of $3 \times 10$ (atoms/cm$^3$).

EXAMPLE 55

A non-monocrystal silicon carbide solar cell containing oxygen and nitrogen atoms in the i-type layer was produced under the same conditions and by the same methods procedures as in the case of Example 46 except that apart from the gases used in Example 46, $O_2/He$ gas and $NH_3/H_2$ gas were introduced into the deposition chamber 401 at a rate of 5 sccm. It was found that as in the case of (SC Ex. 46), the produced solar cell (SC Ex. 55) had an initial photoelectric conversion efficiency and durability characteristic which were better than those of the solar cells for comparison, (SC Comp. 46-1) through (SC Comp. 46-9). Further, examination of the oxygen atom and nitrogen atom contents in the i-type layer by means of SIMS showed that the solar cell contained oxygen and nitrogen atoms substantially uniformly at a density of $1 \times 10^{19}$ (atoms/cm$^3$) and $3 \times 10^{17}$ (atoms/cm$^3$), respectively.

EXAMPLE 56

Non-monocrystal silicon-carbide solar cells in which the hydrogen content in the i-type layer varied in correspondence with the silicon content were produced. The $O_2/He$ gas cylinder was replaced by an $SiF_4$-gas (purity: 99.999%) cylinder, the flow rates of the $SiH_4$ gas, $CH_4$ gas, and $SiF_4$ gas being varied in accordance with the flow rate patterns of FIG. 15A when forming the i-type layer.

Upon examination of the changes in band gap in the thickness direction of these solar cells (SC Ex. 56) by the same method as in Example 46, the results as shown in FIG. 15B were obtained.

Further, the hydrogen atom and silicon atom contents in the thickness direction were analyzed by using a secondary ion mass spectrometer. The analysis showed that the hydrogen atom content exhibited a distribution in the thickness direction in correspondence with the silicon atom content, as shown in FIG. 15C.

Measurement of the initial photoelectric conversion efficiency and durability characteristic of these solar cells (SC Ex. 56) showed that they had an initial photoelectric conversion efficiency and durability characteristic which were better than those of the solar cells for comparison, (SC Comp. 46-1) through (SC Comp. 46-9).

EXAMPLE 57

A non-monocrystal silicon-carbide solar cell (SC Ex. 57) was produced by means of a production apparatus based on the microwave plasma CVD method as shown in FIG. 4, by the same methods and procedures as in Example 46 except that when forming the semiconductor layer of the non-monocrystal silicon-carbide solar cell as shown in FIG. 1, the silicon atom containing gas ($SiH_4$ gas) and the carbon atom containing gas ($CH_4$ gas) were mixed with each other at a position 5 m away from the deposition chamber. It was found that the produced solar cell (SC Ex. 57) had an initial photoelectric conversion efficiency and durability characteristic which were better than those of the solar cell of (SC Ex. 46).

EXAMPLE 58

A tandem-type solar cell as shown in FIG. 16, having a non-monocrystal silicon-carbide semiconductor layer, was produced by means of the production apparatus of FIG. 4 which is based on the microwave plasma CVD method of the present invention.

First, the substrate was prepared. As in the case of Example 46, a stainless substrate having a size of $50 \times 50$ mm$^2$ was subjected to ultrasonic cleaning using acetone and isopropanol and then dried. A reflective layer of Ag (silver) was formed on the surface of this stainless substrate to a thickness of 0.3 μm by sputtering. The substrate temperature was set at 350° C., and a surface irregularity was imparted to the substrate surface (texturization). Then, while maintaining the substrate temperature at 350° C., a reflection increasing layer of ZnO (zinc oxide) was formed to a thickness of 1.0 μm.

Next, a first n-type layer was formed on the substrate by the same method and procedures as in Example 46. Then, a first i-type layer, first p-type layer, second n-type layer, second i-type layer, i-type Si layer, and second p-type layer were successively formed thereon. When forming the second i-type layer, the flow rates of the SiH$_4$ and CH$_4$ gases were varied in accordance with the flow rate change pattern as shown in FIG. 5. The deposition rate of the i-type Si layer was 0.15 nm/sec, and the second p-type layer was formed in a laminated structure as in Example 46.

Next, as in Example 46, an ITO (In$_2$O$_3$+SnO$_2$) layer having a thickness of 80 nm and serving as a transparent electrode, and a chromium (Cr) layer having a thickness of 10 μm and serving as a collecting electrode, were formed on the second p-type layer by a standard vacuum evaporation method.

In this way, the production of a tandem-type solar cell using the microwave plasma CVD method was completed. This solar cell is referred to as (SC Ex. 58). The production conditions for each semiconductor layer are given in Table 20.

COMPARATIVE EXAMPLE 58-1

A tandem-type solar cell was produced by the same method and procedures as in Example 58 except that when forming the second i-type layer 1606 of FIG. 16, the flow rates of the SiH$_4$ gas and the CH$_4$ gas were varied in accordance with the flow rate changing pattern of FIG. 6. This solar cell is referred to as (SC Comp. 58-1).

COMPARATIVE EXAMPLE 58-2

A tandem-type solar cell was produced by the same method and procedures as in Example 58 except that when forming the second i-type layer 1606 of FIG. 16, the PH$_3$/H$_2$ gas was not supplied. This solar cell is referred to as (SC Comp. 58-2).

COMPARATIVE EXAMPLE 58-3

A tandem-type solar cell was produced by the same method and procedures as in Example 58 except that when forming the second i-type layer 1606 of FIG. 16, the B$_2$H$_6$/H$_2$ gas was not supplied. This solar cell is referred to as (SC Comp. 58-3).

COMPARATIVE EXAMPLE 58-4

A tandem-type solar cell was produced by the same method and procedures as in Example 58 except that when forming the second i-type layer 1606 of FIG. 16, the μW power was set to 0.5 W/cm$^3$. This solar cell is referred to as (SC Comp. 58-4).

COMPARATIVE EXAMPLE 58-5

A tandem-type solar cell was produced by the same method and procedures as in Example 58 except that when forming the second i-type layer 1606 of FIG. 16, the RF power was set to 0.15 W/cm$^3$. This solar cell is referred to as (SC Comp. 58-5).

COMPARATIVE EXAMPLE 58-6

A tandem-type solar cell was produced by the same method and procedures as in Example 58 except that when forming the second i-type layer 1606 of FIG. 16, the μW power and the RF power were set to 0.5 W/cm$^3$ and 0.55 W/cm$^3$, respectively. This solar cell is referred to as (SC Comp. 58-6).

COMPARATIVE EXAMPLE 58-7

A tandem-type solar cell was produced by the same method and procedures as in Example 58 except that when forming the second i-type layer 1606 of FIG. 16, the pressure inside the deposition chamber 401 was set to 0.1 Torr. This solar cell is referred to as (SC Comp. 58-7).

COMPARATIVE EXAMPLE 58-8

A tandem-type solar cell was produced by the same method and procedures as in Example 58 except that when forming the second i-type layer 1607 of FIG. 16, the deposition rate was set to 3 nm/sec. This solar cell is referred to as (SC Comp. 58-8).

COMPARATIVE EXAMPLE 58-9

A tandem-type solar cell was produced by the same method and procedures as in Example 58 except that when forming the second i-type layer 1607 of FIG. 16, the layer thickness was set to 40 nm. This solar cell is referred to as (SC Comp. 58-9).

The initial photoelectric conversion efficiency and durability characteristic of each of these tandem-type solar cells were measured by the same method as in the case of Example 46, and it was found that the (SC Ex. 58) had a photoelectric conversion efficiency and durability characteristic better than those of the tandem-type solar cells for comparison (SC Comp. 58-1) through (SC Comp. 58-9).

EXAMPLE 59

A triple-type solar cell as shown in FIG. 17, having a non-monocrystal silicon-carbide semiconductor layer, was produced by means of the production apparatus of FIG. 4 based on the microwave plasma CVD method of the present invention.

First, the substrate was prepared. As in the case of Example 46, a stainless substrate having a size of 50×50 mm$^2$ was subjected to ultrasonic cleaning using acetone and isopropanol and then dried. A reflective layer of Ag (silver) was formed on the surface of this stainless substrate to a thickness of 0.3 μm by sputtering. The substrate temperature was set at 350° C., and a surface irregularity was imparted to the substrate surface (texturization). Then, while maintaining the substrate temperature at 350° C., a reflection increasing layer of ZnO (zinc oxide) was formed to a thickness of 1.0 μm.

Instead of the NH$_3$/H$_2$ gas cylinder, a GeH$_4$ gas (purity: 99.999%) cylinder was connected, thus completing the preparation for layer formation by the same method and procedures as in Example 46.

A first n-type layer was formed on the substrate by the same method and procedures as in Example 46. Then, a first i-type layer (which was formed by varying the GeH$_4$/SiH$_4$ ratio as: 0→0.4→0.4→0), first p-type layer, second n-type layer, second i-type layer, second p-type layer, third n-type layer, third i-type layer, i-type Si layer, and third p-type layer were successively formed thereon.

When forming the third i-type layer, the flow rates of the SiH$_4$ and CH$_4$ gases were varied in accordance with the flow rate change pattern as shown in FIG. 5. The deposition rate of the i-type Si layer was 0.15 nm/sec, and the second p-type layer and the third p-type layer were formed in a laminated structure as in Example 46.

Next, as in Example 46, an ITO (In$_2$O$_3$+SnO$_2$) layer having a thickness of 80 nm and serving as a transparent electrode, and a chromium (Cr) layer having a thickness of 10 μm and serving as a collecting electrode, were formed on the third p-type layer by a standard vacuum evaporation method.

In this way, the production of a triple-type solar cell using the microwave plasma CVD method was completed. This solar cell is referred to as (SC Ex. 59). The production conditions for each semiconductor layer are summarized in Table 21.

COMPARATIVE EXAMPLE 59-1

A triple-type solar cell was produced by the same method and procedures as in Example 59 except that when forming the third i-type layer 1709 of FIG. 17, the flow rates of the $SiH_4$ gas and the $CH_4$ gas were varied in accordance with the flow rate change pattern of FIG. 6. This solar cell is referred to as (SC Comp. 59-1).

COMPARATIVE EXAMPLE 59-2

A triple-type solar cell was produced by the same methods and procedures as in Example 59 except that when forming the third i-type layer 1709 of FIG. 17, the $PH_3/H_2$ gas was not supplied. This solar cell is referred to as (SC Comp. 59-2).

COMPARATIVE EXAMPLE 59-3

A triple-type solar cell was produced by the same methods and procedures as in Example 59 except that when forming the third i-type layer 1709 of FIG. 17, the $B_2H_6/H_2$ gas was not supplied. This solar cell is referred to as (SC Comp. 59-3).

COMPARATIVE EXAMPLE 59-4

A triple-type solar cell was produced by the same methods and procedures as in Example 59 except that when forming the third i-type layer 1709 of FIG. 17, the μW power was set to 0.5 $W/cm^3$. This solar cell is referred to as (SC Comp. 59-4).

COMPARATIVE EXAMPLE 59-5

A triple-type solar cell was produced by the same methods and procedures as in Example 59 except that when forming the third i-type layer 1709 of FIG. 17, the RF power was set to 0.15 $W/cm^3$. This solar cell is referred to as (SC Comp. 59-5).

COMPARATIVE EXAMPLE 59-6

A triple-type solar cell was produced by the same methods and procedures as in Example 59 except that when forming the third i-type layer 1709 of FIG. 17, the μW power and the RF power were set to 0.5 $W/cm^3$ and 0.55 $W/cm^3$, respectively This solar cell is referred to as (SC Comp. 59-6).

COMPARATIVE EXAMPLE 59-7

A triple-type solar cell was produced by the same methods and procedures as in Example 59 except that when forming the third i-type layer 1709 of FIG. 17, the pressure inside the deposition chamber 401 was set to 0.08 Torr. This solar cell is referred to as (SC Comp. 59-7).

COMPARATIVE EXAMPLE 59-8

A triple-type solar cell was produced by the same methods and procedures as in Example 59 except that when forming the third i-type layer 1710 of FIG. 17, the deposition rate was set to 3 nm/sec. This solar cell is referred to as (SC Comp. 59-8).

COMPARATIVE EXAMPLE 59-9

A triple-type solar cell was produced by the same methods and procedures as in Example 59 except that when forming the third i-type layer 1710 of FIG. 17, the layer thickness was set to 40 nm. This solar cell is referred to as (SC Comp. 59-9).

The initial photoelectric conversion efficiency and durability characteristic of each of these triple-type solar cells were measured by the same method as in the case of Example 46, and it was found that the (SC Ex. 59) had a photoelectric conversion efficiency and durability characteristic better than those of the triple-type solar cells for comparison (SC Comp. 59-1) through (SC Comp. 59-9).

EXAMPLE 60

Triple-type solar cells as shown in FIG. 17 were produced by means of the production apparatus of FIG. 4 using the microwave plasma CVD method of the present invention, modularized, and then applied to a power generation system.

Under the same conditions and by the same methods and procedures as in Example 59, sixty-five triple-type solar cells (SC Ex. 59) having a size of $50 \times 50$ $mm^2$ were produced. An adhesive sheet consisting of EVA (ethylene vinyl acetate) was placed on an aluminum plate having a thickness of 5.0 mm. Further, a nylon sheet was placed thereon. The solar cells were placed on this nylon sheet and connected in series and in parallel. Another EVA adhesive sheet was then placed on the solar cells. Further, a fluorine resin sheet was placed thereon and the assembly was vacuum-laminated to effect modularization.

The initial photoelectric conversion efficiency of the prepared module was measured by the same method as in Example 46. The prepared module was then connected to the power generation system of FIG. 18, and a street lamp to be lit at night was used as a load 1805. The entire system was operated by the power of storage battery 1804 and module 1801, with the latter being set at an angle enabling a maximum quantity of sunlight to be collected. The photoelectric conversion efficiency after one year was measured to obtain a photo-deterioration rate (photoelectric-conversion-efficiency-after-one-year/initial-photoelectric-conversion-efficiency). This module is referred to as (MJ Ex. 60).

COMPARATIVE EXAMPLE 60-1

Triple-type solar cells (SC Comp. 59-X) (X: 1–9) were produced in a quantity of sixty-five units each, and modularized as in Example 60. These modules are referred to as (MS Comp. 60-X).

The initial photoelectric efficiency and the photoelectric conversion efficiency after one year of these solar cells were measured under the same conditions and by the same method and procedures as in Example 60 to obtain the photo-deterioration ratio of each of the comparative examples (MJ Comp. 60-X) relative to that of (MJ Ex. 60):

| Module | Photo-deterioration ratio as compared with that of (MJ Ex. 60) |
| --- | --- |
| MJ Ex. 60 | 1.00 |
| MJ Comp. 60-1 | 0.74 |
| MJ Comp. 60-2 | 0.75 |
| MJ Comp. 60-3 | 0.73 |
| MJ Comp. 60-4 | 0.65 |

-continued

| Module | Photo-deterioration ratio as compared with that of (MJ Ex. 60) |
|---|---|
| MJ Comp. 60-5 | 0.80 |
| MJ Comp. 60-6 | 0.61 |
| MJ Comp. 60-7 | 0.69 | duce a photovoltaic device having the above advantages with a satisfactory yield.

In addition, a power generation system utilizing the photovoltaic device of the present invention exhibits an excellent power-supply capability even when the incident light is rather weak.

TABLE 1

| SOLAR CELL | LAY-ER | SiH$_4$ FLOW RATE sccm | CH$_4$ FLOW RATE sccm | H$_2$ FLOW RATE sccm | PH$_3$ H$_2$ FLOW RATE sccm | B$_2$H$_6$/H$_2$ FLOW RATE sccm | NH$_3$/H$_2$ FLOW RATE sccm | O$_2$/He FLOW RATE sccm | SUB-STRATE TEMP. °C. | PRESS. Torr | RF POW-ER W/cm$^3$ | μW POW-ER W/cm$^3$ | LAYER THICK-NESS nm |
|---|---|---|---|---|---|---|---|---|---|---|---|---|---|
| SC EX. 1 | n | 2 | | 100 | 20 | | | | 350 | 1.0 | 0.007 | | 20 |
| | i | X | Y | 300 | | | | | 350 | 0.01 | 0.40 | 0.20 | 300 |
| | i-Si | 2 | | 100 | | | | | 250 | 1.5 | 0.007 | | 20 |
| | p | 1 | 0.5 | 100 | | 100 | | | 200 | 2.0 | 0.20 | | 10 |

Note:
X and Y indicate that flow rates were varied when a layer was formed.
PH$_3$/H$_2$ CYLINDER 100 ppm
B$_2$H$_6$/H$_2$ CYLINDER 100 PPM
NH$_3$/H$_2$ CYLINDER 1%
O$_2$/He CYLINDER 1%

| MJ Comp. 60-8 | 0.74 |
|---|---|
| MJ Comp. 60-9 | 0.81 |

The above results showed that the solar cell module of the present invention had photo-deterioration characteristics better than those of the solar cell modules for comparison.

Thus, it was verified that the effects of the photovoltaic device of the present invention could be realized irrespective of the construction, material, and production conditions thereof.

As described above, the photovoltaic device of the present invention prevents recombination of photo-excitation carriers improves the open circuit voltage and hole carrier range, and helps to attain an improvement in photoelectric conversion efficiency.

Also, the conversion efficiency of the photovoltaic device of the present invention is improved when the incident light is rather weak. Further, the photoelectric conversion efficiency of the photovoltaic device of the present invention is not easily deteriorated even when annealing is performed under an oscillation of long duration.

Further, with the photovoltaic-device production method of the present invention, it is possible to produce a photovoltaic device having the above advantages with a satisfactory yield.

TABLE 2

| SAMPLES | SiH$_4$ FLOW RATE sccm | CH$_4$ FLOW RATE sccm | COMPOSITION RATIO C/(C + Si) | Eg (eV) |
|---|---|---|---|---|
| SP1-1 | 130 | 0 | 0.00 | 1.75 |
| SP1-2 | 120 | 10 | 0.07 | 1.87 |
| SP1-3 | 110 | 20 | 0.15 | 1.94 |
| SP1-4 | 105 | 25 | 0.18 | 2.02 |
| SP1-5 | 90 | 40 | 0.29 | 2.18 |
| SP1-6 | 70 | 60 | 0.44 | 2.29 |
| SP1-7 | 60 | 70 | 0.52 | 2.43 |

TABLE 3

| SOLAR CELL | INITIAL PHOTOELECTRIC CONVERSION EFFICIENCY | DURABILITY |
|---|---|---|
| SC EX. 2-1 | 1.0 | 1.0 |
| SC EX. 2-2 | 0.99 | 0.98 |
| SC EX. 2-3 | 0.99 | 0.98 |
| SC EX. 2-4 | 0.90 | 0.91 |
| SC EX. 2-5 | 0.89 | 0.90 |
| SC EX. 2-6 | 1.02 | 1.03 |
| SC EX. 2-7 | 1.03 | 1.04 |
| SC EX. 2-8 | 0.98 | 0.98 |
| SC EX. 2-9 | 0.98 | 0.98 |
| SC EX. 2-10 | 0.98 | 0.98 |

TABLE 4

| SOLAR CELL | LAY-ER | SiH$_4$ FLOW RATE sccm | CH$_4$ FLOW RATE sccm | H$_2$ FLOW RATE sccm | PH$_3$ H$_2$ FLOW RATE sccm | B$_2$H$_6$/H$_2$ FLOW RATE sccm | NH$_3$/H$_2$ FLOW RATE sccm | O$_2$/He FLOW RATE sccm | SUB-STRATE TEMP. °C. | PRESS. Torr | RF POW-ER W/cm$^3$ | μW POW-ER W/cm$^3$ | LAYER THICK-NESS nm |
|---|---|---|---|---|---|---|---|---|---|---|---|---|---|
| SC EX. 4 | 9 | 2 | | 100 | 20 | | | | 350 | 1.0 | 0.007 | | 20 |
| | i-Si | 2 | | 200 | | 0.5 | | | 300 | 1.5 | 0.007 | | 20 |
| | i | X | Y | 200 | | | | | 300 | 0.01 | 0.20 | 0.40 | 300 |
| | n | 1 | 0.51 | 100 | 100 | | | | 200 | 2.0 | 0.20 | | 10 |

Note:
X and Y indicate that flow rates were varied when a layer was formed.
PH$_3$/H$_2$ CYLINDER 100 ppm
B$_2$H$_6$/H$_2$ CYLINDER 100 PPM
NH$_3$/H$_2$ CYLINDER 1%
O$_2$/He CYLINDER 1%

TABLE 5

| SOLAR CELL | LAYER | SiH$_4$ FLOW RATE sccm | CH$_4$ FLOW RATE sccm | H$_2$ FLOW RATE sccm | PH$_3$/H$_2$ FLOW RATE sccm | B$_2$H$_6$/H$_2$ FLOW RATE sccm | NH$_3$/H$_2$ FLOW RATE sccm | μW POW-ER W/cm$^3$ | SUB-STRATE TEMP. °C. | PRESS. Torr | RF POW-ER W/cm$^3$ | LAYER THICK-NESS nm |
|---|---|---|---|---|---|---|---|---|---|---|---|---|
| SC EX. | 1ST n-TYPE LAYER | | | 300 | | | | | 380 | 0.50 | 0.01 | 20 |

TABLE 5-continued

| SOLAR CELL | LAYER | SiH4 FLOW RATE sccm | CH4 FLOW RATE sccm | H2 FLOW RATE sccm | PH3/H2 FLOW RATE sccm | B2H6/H2 FLOW RATE sccm | NH3/H2 FLOW RATE sccm | μW POWER W/cm³ | SUBSTRATE TEMP. °C | PRESS. Torr | RF POWER W/cm³ | LAYER THICKNESS nm |
|---|---|---|---|---|---|---|---|---|---|---|---|---|
| | 1ST i-TYPE LAYER | 200 | | | | | | 0.20 | 350 | 0.005 | 0.40 | 220 |
| | 1ST p-TYPE LAYER | 10 | 2 | | | 500 | | 0.40 | 350 | 0.02 | | 10 |
| | 2ND n-TYPE LAYER | 10 | | | 100 | | | | 300 | 0.50 | 0.01 | 20 |
| | 2ND i-TYPE LAYER | X | Y | | | | | 0.20 | 250 | 0.005 | 0.60 | 200 |
| | i-TYPE Si LAYER | 2 | | 100 | | | 0.1 | | 250 | 1.5 | 0.01 | 10 |
| | 2ND p-TYPE LAYER | 10 | 2 | | | 500 | | 0.40 | 200 | 0.02 | | 10 |

Note:
X and Y indicate that flow rates were varied when a layer was formed.
PH3/H2 CYLINDER 100 ppm
B2H6/H2 CYLINDER 100 PPM
NH3/H2 CYLINDER 1%
O2/He CYLINDER 1%

TABLE 6

| SOLAR CELL | LAYER | SiH4 FLOW RATE sccm | CH4 FLOW RATE sccm | H2 FLOW RATE sccm | PH3/H2 FLOW RATE sccm | B2H6/H2 FLOW RATE sccm | GeH4 FLOW RATE sccm | POWER W/cm³ | SUBSTRATE TEMP. °C. | PRESS. Torr | μW POWER W/cm³ | LAYER THICKNESS nm |
|---|---|---|---|---|---|---|---|---|---|---|---|---|
| SC EX. 14 | 1ST n-TYPE LAYER | 10 | | | 300 | | | | 380 | 0.50 | 0.01 | 10 |
| | 1ST i-TYPE LAYER | 150 | | | | | 50 | 0.20 | 350 | 0.01 | 0.40 | 200 |
| | 1ST p-TYPE LAYER | 10 | | | | 500 | | | 350 | 2.0 | 0.20 | 10 |
| | 2ND n-TYPE LAYER | 10 | | | 300 | | | | 330 | 0.50 | 0.01 | 10 |
| | 2ND i-TYPE LAYER | 200 | | | | | | 0.20 | 320 | 0.005 | 0.40 | 180 |
| | 2ND p-TYPE LAYER | 10 | 2 | | | 500 | | 0.40 | 320 | 0.02 | | 10 |
| | 3RD n-TYPE LAYER | 10 | | | 500 | | | | 300 | 0.50 | 0.01 | 10 |
| | 3RD i-TYPE LAYER | X | Y | 300 | | | | 0.20 | 250 | 0.005 | 0.60 | 150 |
| | i-TYPE Si LAYER | 2 | | 100 | | 0.5 | | | 250 | 1.5 | 0.01 | 10 |
| | 3RD p-TYPE LAYER | 10 | 3 | | | 500 | | 0.40 | 200 | 0.02 | | 10 |

Note:
X and Y indicate that flow rates were varied when a layer was formed.
PH3/H2 CYLINDER 100 ppm
B2H6/H2 CYLINDER 100 PPM
NH3/H2 CYLINDER 1%
O2/He CYLINDER 1%

TABLE 7

| SOLAR CELL | LAYER | SiH4 FLOW RATE sccm | CH4 FLOW RATE sccm | H2 FLOW RATE sccm | PH3/H2 FLOW RATE sccm | B2H6/H2 FLOW RATE sccm | NH3/H2 FLOW RATE sccm | O2/He FLOW RATE sccm | SUBSTRATE TEMP. °C. | PRESS. Torr | RF POWER W/cm³ | μW POWER W/cm³ | LAYER THICKNESS nm |
|---|---|---|---|---|---|---|---|---|---|---|---|---|---|
| SC EX. 16 | n | 2 | | 100 | 20 | | | | 350 | 1.0 | 0.007 | | 20 |
| | i | X | Y | 300 | | 2 | 5 | | 350 | 0.01 | 0.40 | 0.20 | 300 |
| | i-Si | 2 | | 100 | | | | | 250 | 1.5 | 0.007 | | 20 |
| | p | 1 | 0.5 | 100 | | 100 | | | 200 | 2.0 | 0.20 | | 10 |

Note:
X and Y indicate that flow rates were varied when a layer was formed.
PH3/H2 CYLINDER 100 ppm
B2H6/H2 CYLINDER 100 PPM
NH3/H2 CYLINDER 1%
O2/He CYLINDER 1%

TABLE 8

| SOLAR CELL | INITIAL PHOTOELECTRIC CONVERSION EFFICIENCY | DURABILITY |
|---|---|---|
| SC EX. 17-1 | 1.0 | 1.0 |
| SC EX. 17-2 | 0.99 | 0.98 |
| SC EX. 17-3 | 0.99 | 0.98 |
| SC EX. 17-4 | 0.84 | 0.83 |
| SC EX. 17-5 | 0.83 | 0.82 |

TABLE 8-continued

| SOLAR CELL | INITIAL PHOTOELECTRIC CONVERSION EFFICIENCY | DURABILITY |
|---|---|---|
| SC EX. 17-6 | 1.02 | 1.03 |
| SC EX. 17-7 | 1.03 | 1.04 |
| SC EX. 17-8 | 0.98 | 0.98 |
| SC EX. 17-9 | 0.98 | 0.98 |
| SC EX. 17-10 | 0.98 | 0.98 |

TABLE 9

| SOLAR CELL | LAYER | $SiH_4$ FLOW RATE sccm | $CH_4$ FLOW RATE sccm | $H_2$ FLOW RATE sccm | $PH_3/H_2$ FLOW RATE sccm | $B_2H_6/H_2$ FLOW RATE sccm | $NH_3/H_2$ FLOW RATE sccm | $O_2/He$ FLOW RATE sccm | SUBSTRATE TEMP. °C. | PRESS. Torr | RF POWER $W/cm^3$ | μW POWER $W/cm^3$ | LAYER THICKNESS nm |
|---|---|---|---|---|---|---|---|---|---|---|---|---|---|
| SC EX. 19 | p | 2 | | 100 | | 20 | | | 350 | 1.0 | 0.007 | | 20 |
| | i-Si | 2 | | 200 | | 0.5 | | | 300 | 1.5 | 0.007 | | 20 |
| | i | X | Y | 200 | 0.5 | 3 | | | 300 | 0.01 | 0.20 | 0.40 | 300 |
| | n | 1 | | 0.5 | 100 | 100 | | | 200 | 2.0 | 0.20 | | 10 |

Note:
X and Y indicate that flow rates were varied when a layer was formed.
$PH_3/H_2$ CYLINDER 100 ppm
$B_2H_6/H_2$ CYLINDER 100 ppm
$NH_3/H_2$ CYLINDER 1%
$O_2/He$ CYLINDER 1%

TABLE 10

| SOLAR CELL | LAYER | $SiH_4$ FLOW RATE sccm | $CH_4$ FLOW RATE sccm | $H_2$ FLOW RATE sccm | $PH_3/H_2$ FLOW RATE sccm | $B_2H_6/H_2$ FLOW RATE sccm | $NH_3/H_2$ FLOW RATE sccm | μW POWER $W/cm^3$ | SUBSTRATE TEMP. °C. | PRESS. Torr | RF POWER $W/cm^3$ | LAYER THICKNESS nm |
|---|---|---|---|---|---|---|---|---|---|---|---|---|
| SC EX. 28 | 1ST n-TYPE LAYER | 10 | | 300 | | | | | 380 | 0.50 | 0.01 | 20 |
| | 1ST i-TYPE LAYER | 200 | | | | | | 0.20 | 350 | 0.005 | 0.40 | 220 |
| | 1ST p-TYPE LAYER | 10 | 2 | | | 500 | | 0.40 | 350 | 0.02 | | 10 |
| | 2ND n-TYPE LAYER | 10 | | 100 | | | | | 300 | 0.50 | 0.01 | 20 |
| | 2ND i-TYPE LAYER | X | Y | | 0.5 | 10 | | 0.20 | 250 | 0.005 | 0.60 | 200 |
| | i-TYPE Si LAYER | 2 | | 100 | | 0.1 | | | 250 | 1.5 | 0.01 | 10 |
| | 2ND p-TYPE LAYER | 10 | 2 | | | 500 | | 0.40 | 200 | 0.02 | | 10 |

Note:
X and Y indicate that flow rates were varied when a layer was formed.
$PH_3/H_2$ CYLINDER 100 ppm
$B_2H_6/H_2$ CYLINDER 100 ppm
$NH_3/H_2$ CYLINDER 1%
$O_2/He$ CYLINDER 1%

TABLE 11

| SOLAR CELL | LAYER | $SiH_4$ FLOW RATE sccm | $CH_4$ FLOW RATE sccm | $H_2$ FLOW RATE sccm | $PH_3/H_2$ FLOW RATE sccm | $B_2H_6/H_2$ FLOW RATE sccm | $GeH_4$ FLOW RATE sccm | μW POWER $W/cm^3$ | SUBSTRATE TEMP. °C. | PRESS. Torr | RF POWER $W/cm^3$ | LAYER THICKNESS nm |
|---|---|---|---|---|---|---|---|---|---|---|---|---|
| SC EX. 29 | 1ST n-TYPE LAYER | 10 | | 300 | | | | | 380 | 0.50 | 0.01 | 10 |
| | 1ST i-TYPE LAYER | 150 | | | | | 50 | 0.20 | 350 | 0.01 | 0.40 | 200 |
| | 1ST p-TYPE LAYER | 10 | | | | 500 | | | 350 | 2.0 | 0.20 | 10 |
| | 2ND n-TYPE LAYER | 10 | | 300 | | | | | 330 | 0.50 | 0.01 | 10 |
| | 2ND i-TYPE LAYER | 200 | | | | | | 0.20 | 320 | 0.005 | 0.40 | 180 |
| | 2ND p-TYPE LAYER | 10 | 2 | | | 500 | | 0.40 | 320 | 0.02 | | 10 |
| | 3RD n-TYPE LAYER | 10 | | 500 | | | | | 300 | 0.50 | 0.01 | 10 |
| | 3RD i-TYPE LAYER | X | Y | | 0.5 | 10 | | 0.20 | 250 | 0.005 | 0.60 | 150 |
| | i-TYPE Si LAYER | 2 | | 100 | | 0.5 | | | 250 | 1.5 | 0.01 | 10 |
| | 3RD p-TYPE | 10 | 3 | | | 500 | | 0.40 | 200 | 0.02 | | 10 |

TABLE 11-continued

| SOLAR CELL | LAYER | SiH4 FLOW RATE sccm | CH4 FLOW RATE sccm | H2 FLOW RATE sccm | PH3/H2 FLOW RATE sccm | B2H6/H2 FLOW RATE sccm | GeH4 FLOW RATE sccm | μW POWER W/cm³ | SUB-STRATE TEMP. °C. | PRESS. Torr | RF POWER W/cm³ | LAYER THICK-NESS nm |
|---|---|---|---|---|---|---|---|---|---|---|---|---|
| | LAYER | | | | | | | | | | | |

Note:
X and Y indicate that flow rates were varied when a layer was formed.
PH3/H2 CYLINDER 100 ppm
B2H6/H2 CYLINDER 100 ppm
NH3/H2 CYLINDER 1%
O2/He CYLINDER 1%

TABLE 12

| SOLAR CELL | LAY-ER | SiH4 FLOW RATE sccm | CH4 FLOW RATE sccm | H2 FLOW RATE sccm | PH3/H2 FLOW RATE sccm | B2H6/H2 FLOW RATE sccm | NH3/H2 FLOW RATE sccm | O2/He FLOW RATE sccm | SUB-STRATE TEMP. °C. | PRESS. Torr | RF POWER W/cm³ | μW POWER W/cm³ | LAYER THICK-NESS nm |
|---|---|---|---|---|---|---|---|---|---|---|---|---|---|
| SC EX. 31 | n | 2 | | 100 | 20 | | | | 350 | 1.0 | 0.007 | | 20 |
| | i | X | Y | 300 | | | | | 350 | 0.01 | 0.40 | 0.20 | 300 |
| | i-Si | 2 | | 100 | | | | | 250 | 1.5 | 0.007 | | 20 |
| | p | | | | | | | | | | | | |
| | B | 10 | 5 | 300 | | 10 | | | 200 | 0.02 | 0.30 | | 10 |
| | A | | | | | | 1000 | | 200 | 0.02 | | 0.20 | |

Note:
X and Y indicate that flow rates were varied when a layer was formed.
PH3/H2 CYLINDER 100 ppm
B2H6/H2 CYLINDER 100 ppm
NH3/H2 CYLINDER 1%
O2/He CYLINDER 1%

TABLE 13

| SOLAR CELL | INITIAL PHOTOELECTRIC CONVERSION EFFICIENCY | DURABILITY |
|---|---|---|
| SC EX. 32-1 | 1.0 | 1.0 |
| SC EX. 32-2 | 0.99 | 0.98 |
| SC EX. 32-3 | 0.99 | 0.98 |
| SC EX. 32-4 | 0.81 | 0.80 |
| SC EX. 32-5 | 0.79 | 0.80 |
| SC EX. 32-6 | 1.02 | 1.03 |
| SC EX. 32-7 | 1.03 | 1.04 |
| SC EX. 32-8 | 0.98 | 0.98 |
| SC EX. 32-9 | 0.98 | 0.98 |
| SC EX. 32-10 | 0.98 | 0.98 |

TABLE 14

| SOLAR CELL | LAY-ER | SiH4 FLOW RATE sccm | CH4 FLOW RATE sccm | H2 FLOW RATE sccm | PH3/H2 FLOW RATE sccm | B2H6/H2 FLOW RATE sccm | NH3/H2 FLOW RATE sccm | O2/He FLOW RATE sccm | SUB-STRATE TEMP. °C. | PRESS. Torr | RF POWER W/cm³ | μW POWER W/cm³ | LAYER THICK-NESS nm |
|---|---|---|---|---|---|---|---|---|---|---|---|---|---|
| SC EX. 34 | p | 2 | | 100 | | 20 | | | 350 | 1.0 | 0.007 | | 20 |
| | i-Si | 2 | | 200 | | 0.5 | | | 300 | 1.5 | 0.007 | | 20 |
| | i | X | Y | 200 | | | | | 300 | 0.01 | 0.20 | 0.40 | 300 |
| | n | | | | | | | | | | | | |
| | B | 10 | 5 | 300 | 20 | | | | 200 | 0.02 | 0.35 | | 10 |
| | A | | | | | | 1000 | | 200 | 0.02 | | 0.25 | |

Note:
X and Y indicate that flow rates were varied when a layer was formed.
PH3/H2 CYLINDER 100 ppm
B2H6/H2 CYLINDER 100 ppm
NH3/H2 CYLINDER 1%
O2/He CYLINDER 1%

TABLE 15

| SOLAR CELL | LAYER | SiH4 FLOW RATE sccm | CH4 FLOW RATE sccm | H2 FLOW RATE sccm | PH3/H2 FLOW RATE sccm | B2H6/H2 FLOW RATE sccm | NH3/H2 FLOW RATE sccm | μW POWER W/cm³ | SUB-STRATE TEMP. °C. | PRESS. Torr | RF POWER W/cm³ | LAYER THICK-NESS nm |
|---|---|---|---|---|---|---|---|---|---|---|---|---|
| SC EX. 43 | 1ST n-TYPE LAYER | 10 | | 300 | | | | | 380 | 0.50 | 0.01 | 20 |
| | 1ST i-TYPE LAYER | 200 | | | | | | 0.20 | 350 | 0.005 | 0.40 | 220 |
| | 1st p-TYPE LAYER | 10 | 2 | | | 500 | | 0.40 | 350 | 0.02 | | 10 |
| | 2ND n-TYPE LAYER | 10 | | 100 | | | | | 300 | 0.50 | 0.01 | 20 |
| | 2ND i-TYPE LAYER | X | Y | | | | | 0.20 | 250 | 0.005 | 0.60 | 200 |

TABLE 15-continued

| SOLAR CELL | LAYER | SiH$_4$ FLOW RATE sccm | CH$_4$ FLOW RATE sccm | H$_2$ FLOW RATE sccm | PH$_3$/H$_2$ FLOW RATE sccm | B$_2$H$_6$/H$_2$ FLOW RATE sccm | NH$_3$/H$_2$ FLOW RATE sccm | μW POWER W/cm$^3$ | SUBSTRATE TEMP. °C. | PRESS. Torr | RF POWER W/cm$^3$ | LAYER THICKNESS nm |
|---|---|---|---|---|---|---|---|---|---|---|---|---|
| | i-TYPE Si LAYER | 2 | | 100 | | 0.1 | | | 250 | 1.5 | 0.01 | 15 |
| | 2ND p-TYPE LAYER | | | | | | | | | | | |
| | B | 10 | 2 | 500 | | 10 | | 0.40 | 200 | 0.02 | | 10 |
| | A | | | | | 500 | | 0.30 | 200 | 0.02 | | |

Note:
X and Y indicate that flow rates were varied when a layer was formed.
PH$_3$/H$_2$ CYLINDER 100 ppm
B$_2$H$_6$/H$_2$ CYLINDER 100 ppm
NH$_3$/H$_2$ CYLINDER 1%
O$_2$/He CYLINDER 1%

TABLE 16

| SOLAR CELL | LAYER | SiH$_4$ FLOW RATE sccm | CH$_4$ FLOW RATE sccm | H$_2$ FLOW RATE sccm | PH$_3$/H$_2$ FLOW RATE sccm | B$_2$H$_6$/H$_2$ FLOW RATE sccm | GeH$_4$ FLOW RATE sccm | μW POWER W/cm$^3$ | SUBSTRATE TEMP. °C. | PRESS. Torr | RF POWER W/cm$^3$ | LAYER THICKNESS nm |
|---|---|---|---|---|---|---|---|---|---|---|---|---|
| SC EX. 44 | 1ST n-TYPE LAYER | 10 | | 300 | | | | | 380 | 0.50 | 0.01 | 10 |
| | 1ST i-TYPE LAYER | 150 | | | | | 50 | 0.20 | 350 | 0.01 | 0.40 | 200 |
| | 1ST p-TYPE LAYER | 10 | | | 500 | | | | 350 | 2.0 | 0.20 | 10 |
| | 2ND n-TYPE LAYER | 10 | | 300 | | | | | 330 | 0.50 | 0.01 | 10 |
| | 2ND i-TYPE LAYER | 200 | | | | | | 0.20 | 320 | 0.005 | 0.40 | 180 |
| | 2ND p-TYPE LAYER | | | | | | | | | | | |
| | B1 | 10 | 2 | 500 | | 10 | | 0.40 | 320 | 0.02 | | 10 |
| | A1 | | | | | 1000 | | 0.30 | 320 | 0.02 | | |
| | 3RD n-TYPE LAYER | 10 | | 500 | | | | | 300 | 0.50 | 0.01 | 10 |
| | 3RD i-TYPE LAYER | X | Y | 300 | | | | 0.20 | 250 | 0.005 | 0.60 | 150 |
| | i-TYPE Si LAYER | 2 | | 100 | | 0.5 | | | 250 | 1.5 | 0.01 | 15 |
| | 3rd p-TYPE LAYER | | | | | | | | | | | |
| | B2 | 10 | 3 | 500 | | 20 | | 0.40 | 200 | 0.02 | | 10 |
| | A2 | | | | | 1000 | | 0.30 | 200 | 0.02 | | |

Note:
X and Y indicate that flow rates were varied when a layer was formed.
PH$_3$/H$_2$ CYLINDER 100 ppm
B$_2$H$_6$/H$_2$ CYLINDER 100 ppm
NH$_3$/H$_2$ CYLINDER 1%
O$_2$/He CYLINDER 1%

TABLE 17

| SOLAR CELL | LAYER | SiH$_4$ FLOW RATE sccm | CH$_4$ FLOW RATE sccm | H$_2$ FLOW RATE sccm | PH$_3$/H$_2$ FLOW RATE sccm | B$_2$H$_6$/H$_2$ FLOW RATE sccm | NH$_3$/H$_2$ FLOW RATE sccm | O$_2$/He FLOW RATE sccm | SUBSTRATE TEMP. °C. | PRESS. Torr | RF POWER W/cm$^3$ | μW POWER W/cm$^3$ | LAYER THICKNESS nm |
|---|---|---|---|---|---|---|---|---|---|---|---|---|---|
| SC EX. 46 | n | 2 | | 100 | 20 | | | | 350 | 1.0 | 0.007 | | 20 |
| | i | X | Y | 300 | | 2 | 5 | | 350 | 0.01 | 0.40 | 0.20 | 300 |
| | i-Si | 2 | | 100 | | | | | 250 | 1.5 | 0.007 | | 20 |
| | p | | | | | | | | | | | | |
| | B | 10 | 5 | 300 | | 10 | | | 200 | 0.02 | | 0.30 | 10 |
| | A | | | | | 1000 | | | 200 | 0.02 | | 0.20 | |

Note:
X and Y indicate that flow rates were varied when a layer was formed.
PH$_3$/H$_2$ CYLINDER 100 ppm
B$_2$H$_6$/H$_2$ CYLINDER 100 ppm
NH$_3$/H$_2$ CYLINDER 1%
O$_2$/He CYLINDER 1%

TABLE 18

| SOLAR CELL | INITIAL PHOTOELECTRIC CONVERSION EFFICIENCY | DURABILITY |
|---|---|---|
| SC EX. 47-1 | 1.0 | 1.0 |
| SC EX. 47-2 | 0.99 | 0.98 |
| SC EX. 47-3 | 0.99 | 0.98 |
| SC EX. 47-4 | 0.76 | 0.75 |
| SC EX. 47-5 | 0.74 | 0.76 |
| SC EX. 47-6 | 1.02 | 1.03 |
| SC EX. 47-7 | 1.03 | 1.04 |
| SC EX. 47-8 | 0.98 | 0.98 |
| SC EX. 47-9 | 0.98 | 0.98 |
| SC EX. 47-10 | 0.98 | 0.98 |

TABLE 19

| SOLAR CELL | LAYER | $SiH_4$ FLOW RATE sccm | $CH_4$ FLOW RATE sccm | $H_2$ FLOW RATE sccm | $PH_3/H_2$ FLOW RATE sccm | $B_2H_6/H_2$ FLOW RATE sccm | $NH_3/H_2$ FLOW RATE sccm | $O_2/He$ FLOW RATE sccm | SUBSTRATE TEMP. °C. | PRESS. Torr | RF POWER W/cm³ | μW POWER W/cm³ | LAYER THICKNESS nm |
|---|---|---|---|---|---|---|---|---|---|---|---|---|---|
| SC EX. 49 | p | 2 | | 100 | | 20 | | | 350 | 1.0 | 0.007 | | 20 |
| | i-Si | 2 | | 200 | | 0.5 | | | 300 | 1.5 | 0.007 | | 20 |
| | i | X | Y | 200 | 2 | 5 | | | 300 | 0.01 | 0.20 | 0.40 | 300 |
| | n | | | | | | | | | | | | |
| | B | 10 | 5 | 300 | 10 | | | | 200 | 0.02 | | 0.35 | 10 |
| | A | | | 1000 | | | | | 200 | 0.02 | | 0.25 | |

Note:
X and Y indicate that flow rates were varied when a layer was formed.
$PH_3/H_2$ CYLINDER 100 ppm
$B_2H_6/H_2$ CYLINDER 100 ppm
$NH_3/H_2$ CYLINDER 1%
$O_2/He$ CYLINDER 1%

TABLE 20

| SOLAR CELL | LAYER | $SiH_4$ FLOW RATE sccm | $CH_4$ FLOW RATE sccm | $H_2$ FLOW RATE sccm | $PH_3/H_2$ FLOW RATE sccm | $B_2H_6/H_2$ FLOW RATE sccm | $NH_3/H_2$ FLOW RATE sccm | μW POWER W/cm³ | SUBSTRATE TEMP. °C. | PRESS. Torr | RF POWER W/cm³ | LAYER THICKNESS nm |
|---|---|---|---|---|---|---|---|---|---|---|---|---|
| SC EX. 58 | 1ST n-TYPE LAYER | 10 | | | 300 | | | | 380 | 0.50 | 0.01 | 20 |
| | 1ST i-TYPE LAYER | 200 | | | | | | 0.20 | 350 | 0.005 | 0.40 | 220 |
| | 1ST p-TYPE LAYER | 10 | 2 | | | 500 | | 0.40 | 350 | 0.02 | | 10 |
| | 1ST n-TYPE LAYER | 10 | | | 100 | | | | 300 | 0.50 | 0.01 | 20 |
| | 2ND i-TYPE LAYER | X | Y | | 1 | 5 | | 0.20 | 250 | 0.005 | 0.60 | 200 |
| | i-TYPE Si LAYER | 2 | | 100 | | 0.1 | | | 250 | 1.5 | 0.01 | 15 |
| | 2ND p-TYPE LAYER | | | | | | | | | | | |
| | B | 10 2560 | 2 | 500 | | 10 | | 0.40 | 200 | 0.02 | | 10 |
| | A | | | | 500 | | | 0.30 | 200 | 0.02 | | |

Note:
X and Y indicate that flow rates were varied when a layer was formed.
$PH_3/H_2$ CYLINDER 100 ppm
$B_2H_6/H_2$ CYLINDER 100 ppm
$NH_3/H_2$ CYLINDER 1%
$O_2/He$ CYLINDER 1%

TABLE 21

| SOLAR CELL | LAYER | $SiH_4$ FLOW RATE sccm | $CH_4$ FLOW RATE sccm | $H_2$ FLOW RATE sccm | $PH_3/H_2$ FLOW RATE sccm | $B_2H_6/H_2$ FLOW RATE sccm | $GeH_4$ FLOW RATE sccm | μW POWER W/cm³ | SUBSTRATE TEMP. °C. | PRESS. Torr | RF POWER W/cm³ | LAYER THICKNESS nm |
|---|---|---|---|---|---|---|---|---|---|---|---|---|
| SC EX. 59 | 1ST n-TYPE LAYER | 10 | | | 300 | | | | 380 | 0.50 | 0.01 | 10 |
| | 1ST i-TYPE LAYER | 150 | | | | | 50 | 0.20 | 350 | 0.01 | 0.40 | 200 |
| | 1ST p-TYPE LAYER | 10 | | | | 500 | | | 350 | 2.0 | 0.20 | 10 |
| | 2ND n-TYPE LAYER | 10 | | | 300 | | | | 330 | 0.50 | 0.01 | 10 |
| | 2ND i-TYPE LAYER | 200 | | | | | | 0.20 | 320 | 0.005 | 0.40 | 180 |
| | 2ND p-TYPE LAYER | | | | | | | | | | | |

TABLE 21-continued

| SOLAR CELL | LAYER | SiH4 FLOW RATE sccm | CH4 FLOW RATE sccm | H2 FLOW RATE sccm | PH3/H2 FLOW RATE sccm | B2H6/H2 FLOW RATE sccm | GeH4 FLOW RATE sccm | μW POWER W/cm$^3$ | SUBSTRATE TEMP. °C. | PRESS. Torr | RF POWER W/cm$^3$ | LAYER THICKNESS nm |
|---|---|---|---|---|---|---|---|---|---|---|---|---|
| | B1 | 10 | 2 | 500 | | 10 | | 0.40 | 320 | 0.02 | | 10 |
| | A1 | | | | | 1000 | | 0.30 | 320 | 0.02 | | |
| | 3RD n-TYPE LAYER | 10 | | | 500 | | | | 300 | 0.50 | 0.01 | 10 |
| | 3RD i-TYPE LAYER | X | Y | 300 | 0.5 | | 3 | 0.20 | 250 | 0.005 | 0.60 | 150 |
| | i-TYPE Si LAYER | 2 | | 100 | | 0.5 | | | 250 | 1.5 | 0.01 | 15 |
| | 3RD p-TYPE LAYER | | | | | | | | | | | |
| | B2 | 10 | 3 | 500 | | 20 | | 0.40 | 200 | 0.02 | | 10 |
| | A2 | | | | | 1000 | | 0.30 | 200 | 0.02 | | |

Note:
X and Y indicate that flow rates were varied when a layer was formed.
PH$_3$/H$_2$ CYLINDER 100 ppm
B$_2$H$_6$/H$_2$ CYLINDER 100 ppm
NH$_3$/H$_2$ CYLINDER 1%
O$_2$/He CYLINDER 1%

What is claimed is:

1. A photovoltaic device comprising a p-type semiconductor region, an i-type non-single crystal semiconductor region, and an n-type semiconductor region, wherein said i-type non-single crystal semiconductor region comprises a first i-type semiconductor region containing silicon and carbon atoms on the side of said n-type semiconductor region, said first region having a minimum energy band gap between the center thereof and said p-type region, and a second i-type semiconductor region containing silicon atoms and having a thickness of 30 nm or less on the side of said p-region.

2. A photovoltaic device according to claim 1, wherein said first i-type region has a region with a maximum band gap between the center thereof and at least one of said p-type region and said n-type region, and the first i-type region with the maximum band gap has a thickness of 1 to 30 nm.

3. A photovoltaic device according to claim 1, wherein said first i-type region and/or said second i-type region contain(s) both a valence electron controlling agent as a donor and a valence electron controlling agent as an acceptor.

4. A photovoltaic device according to claim 3, wherein said valence electron controlling agent as a donor is an element in Group III of the Periodic Table, and said valence electron controlling agent as an acceptor is an element in Group V of the Periodic Table.

5. A photovoltaic device according to claim 3, wherein said valence electron controlling agents are distributed in a changing amount in said first i-type region and/or said second i-type region.

6. A photovoltaic device according to claim 1, wherein the content of hydrogen atoms contained in said first i-type region changes in accordance with the content of silicon atoms in said first i-type region.

7. A photovoltaic device according to claim 1, wherein said first i-type region and/or said second i-type region contains oxygen and/or nitrogen atoms.

8. A photovoltaic device according to claim 1, wherein at least one of said p-type region and said n-type region has a laminate structure comprising a layer containing, as a main component, at least one element in Group III and/or V of the Periodic Table, and a layer containing a valence electron controlling agent and silicon atoms as a main component.

9. A photovoltaic device comprising a laminate of at least a p-type layer comprising a silicon non-single crystal semiconductor, a photoactive layer comprising a plurality of i-type layers, and an n-type layer, wherein said photoactive layer has a laminate structure comprising at least a first i-type layer deposited on the side of said n-type layer by a microwave plasma CVD process, and a second i-type layer deposited on the side of said p-type layer by a RF plasma CVD process, said first i-type layer deposited by said microwave plasma CVD process contains at least silicon and carbon atoms, and has a minimum band gap between the center thereof and said p-type layer, and said second i-type layer deposited by said RF plasma CVD process contains at least silicon atoms and has a thickness of 30 nm or less.

10. A photovoltaic device according to claim 9, wherein said first i-type layer deposited by said microwave plasma CVD process has a region with a maximum band gap between the center thereof and at least one of said p-type layer and said n-type layer, and the region with the maximum band gap has a thickness of 1 to 30 nm.

11. A photovoltaic device according to claim 9, wherein said first i-type layer deposited by said microwave plasma CVD process and/or said second i-type layer deposited by said RF plasma CVD process contains both a valence electron controlling agent as a donor and a valence electron controlling agent as an acceptor.

12. A photovoltaic device according to claim 11, wherein said valence electron controlling agent as a donor is an element in Group III of the Periodic Table, and said valence electron controlling agent as an acceptor is an element in Group V of the Periodic Table.

13. A photovoltaic device according to claim 11, wherein said valence electron controlling agents are distributed in a changing amount in said first i-type layer deposited by said microwave plasma CVD process and/or said second i-type layer deposited by said RF plasma CVD process.

14. A photovoltaic device according to claim 9, wherein the content of hydrogen atoms contained in said first i-type layer deposited by said microwave CVD process changes in accordance with the content of silicon atoms.

15. A photovoltaic device according to claim 9, wherein said first i-type layer deposited by said microwave plasma CVD process and/or said second i-type layer deposited by said RF plasma CVD process contains oxygen and/or nitrogen atoms.

16. A photovoltaic device according to claim 9, wherein at least one of said p-type layer and said n-type layer has a laminate structure comprising a layer containing, as a main component, at least one element in Group III and/or V of the Periodic Table, and a layer containing a valence electron controlling agent and silicon atoms as a main component.

17. A method of producing a photovoltaic device comprising a p-type layer comprising, in the recited order, at least a silicon non-single crystal semiconductor, a photoactive layer comprising a plurality of i-type layers, and an n-type layer, said method comprising:

depositing a first i-type layer of said photoactive layer on the side of said of said n-type layer by a microwave plasma CVD process in which microwave energy less than that required for 100% decomposition of raw material gases containing at least a silicon-containing gas and a carbon-containing gas, and RF energy greater than the microwave energy are simultaneously applied to said raw material gases under a pressure of 50 mTorr or less while varying the ratio of flow rates of said raw material gases so that a minimum band gap is formed at a position between the center of said first i-type layer and said p-type layer; and depositing a second i-type layer to a thickness of 30 nm or less on the side of said p-type layer by a RF plasma CVD process using raw material gases containing at least a silicon-containing gas at a deposition rate of 2 nm/sec or less.

18. A method of producing a photovoltaic device according to claim 17, wherein in said microwave plasma CVD process, the silicon-containing gas and carbon-containing gas are mixed at a distance of 5 m or less from the chamber where deposition occurs.

19. A generating system comprising:

a photovoltaic device comprising a p-type semiconductor region, an i-type non-single crystal semiconductor region, and an n-type semiconductor region, wherein said i-type non-single crystal semiconductor region comprises a first i-type semiconductor region containing silicon and carbon atoms on the side of said n-type region, said first region having a minimum energy band gap between the center thereof and said p-type region, and a second i-type semiconductor region containing at least silicon atoms and having a thickness of 30 nm or less;

a storage battery for storing electric power supplied from said photovoltaic device and/or supplying electric power to an external load; and a control system for monitoring the voltage and/or current of said photovoltaic device to control the electric power supplied to said storage battery and/or said external load from said photovoltaic device.

20. A generating system according to claim 19, wherein said first i-type region has a region with a maximum band gap between the center thereof and at least one of said p-type region and said n-type region, and the first i-type region with the maximum band gap has a thickness of 1 to 30 nm.

21. A generating system according to claim 19, wherein said first i-type region and/or said second i-type region contain(s) both a valence electron controlling agent as a donor and a valence electron controlling agent as an acceptor.

22. A generating system according to claim 21, wherein said valence electron controlling agent as a donor is an element in Group III of the Periodic Table, and said valence electron controlling agent as an acceptor is an element in Group V of the Periodic Table.

23. A generating system according to claim 21, wherein said valence electron controlling agents are distributed in a changing amount in said first i-type region and/or said second i-type region.

24. A generating system according to claim 19, wherein the content of hydrogen atoms contained in said first i-type region changes in accordance with the content of silicon atoms in said first i-type region.

25. A generating system according to claim 19, wherein said first i-type region and/or said second i-type region contains oxygen and/or nitrogen atoms.

26. A generating system according to claim 19, wherein at least one of said p-type region and said n-type region has a laminate structure comprising a layer containing, as a main component, at least one element in Group III and/or V of the Periodic Table, and a layer containing a valence electron controlling agent and silicon atoms as a main component.

27. A photovoltaic device comprising a p-type semiconductor region, an i-type non-single crystal semiconductor region, and an n-type semiconductor region, wherein said i-type non-single crystal semiconductor region comprises a first i-type semiconductor region containing silicon and carbon atoms on the side of said n-type semiconductor region, said first region having a minimum energy band gap between the center thereof and said p-type region, and a second i-type semiconductor region containing silicon atoms on the side of said p region.

28. A photovoltaic device according to claim 27, wherein said first i-type region is thicker than said second i-type region.

29. A photovoltaic device according to claim 27, wherein the content of hydrogen atoms contained in said first i-type region changes in accordance with the content of silicon atoms in said first i-type region.

30. A photovoltaic device according to claim 27, wherein said first i-type region and/or said second i-type region contains oxygen and/or-nitrogen atoms.

31. A photovoltaic device according to claim 27, wherein at least one of said p-type region and said n-type region has a laminate structure comprising a layer containing as a main component, at least one element in Group III and/or V of the Periodic Table, and a layer containing a valence electron controlling agent and silicon atoms as a main component.

32. A photovoltaic device according to claim 27, wherein said first i-type region has a region with a maximum band gap between the center thereof and at least one of said p-type region and said n-type region, and the first i-type region with the maximum band gap has a thickness of 1 to 30 nm.

33. A photovoltaic device according to claim 27, wherein said first i-type region and/or said second i-type region contain(s) both a valence electron controlling agent as a donor and a valence electron controlling agent as an acceptor.

34. A photovoltaic device according to claim 33, wherein said valence electron controlling agent as a donor is an element in Group III of the Periodic Table, and said valence electron controlling agent as an acceptor is an element in Group V of the Periodic Table.

35. A photovoltaic device according to claim 33, wherein said valence electron controlling agents are distributed in a changing amount in said first i-type region and/or said second i-type region.

36. A generating system comprising:
   a photovoltaic device comprising a p-type semiconductor region, an i-type non-single crystal semiconductor region, and an n-type semiconductor region, wherein said i-type non-single crystal semiconductor region comprises a first i-type semiconductor region containing silicon and carbon atoms on the side of said n-type region, said first region having a minimum energy band gap between the center thereof and said p-type region, and a second i-type semiconductor region containing at least silicon atoms;
   a storage battery for storing electric power supplied from said photovoltaic device and/or supplying electric power to an external load; and
   a control system for monitoring the voltage and/or current of said photovoltaic device to control the electric power supplied to said storage battery and/or said external load from said photovoltaic device.

37. A generating system according to claim 36, wherein said first i-type region is thicker than said second i-type region.

38. A generating system according to claim 36, wherein said first i-type region has a region with a maximum band gap between the center thereof and at least one of said p-type region and said n-type region, and the first i-type region with the maximum band gap has a thickness of 1 to 30 nm.

39. A generating according to claim 36, wherein said first i-type region and/or said second i-type region contain(s) both valence electron controlling agent as a both donor and a valence electron controlling agent as an acceptor.

40. A generating system according to claim 39, wherein said valence electron controlling agent as a donor is an element in Group III of the Periodic Table, and said valence electron controlling agent as an acceptor is an element in Group V of the Periodic Table.

41. A generating system according to claim 39, wherein said valence electron controlling agents are distributed in a changing amount in said first i-type region and/or said second i-type region.

42. A generating system according to claim 36, wherein the content of hydrogen atoms contained in said first i-type region changes in accordance with the content of silicon atoms in said first i-type region.

43. A generating system according to claim 36, wherein said first i-type region and/or said second i-type region contains oxygen and/or nitrogen atoms.

44. A generating system according to claim 36, wherein at least one of said p-type region and said n-type region has a laminate structure comprising a layer containing, as a main component, at least one element in Group III and/or V of the Periodic Table, and a layer containing a valence electron controlling agent and silicon atoms as a main component.

* * * * *

UNITED STATES PATENT AND TRADEMARK OFFICE
CERTIFICATE OF CORRECTION

PATENT NO. : 5,439,533
DATED : August 8, 1995
INVENTOR(S) : KEISHI SAITO, ET AL.

It is certified that error appears in the above-identified patent and that said Letters Patent is hereby corrected as shown below:

IN THE DRAWINGS

Sheet 7 of 16, FIG. 9: "(w/cm$^2$)" should read --(W/cm$^3$)--.
Sheet 7 of 16, FIG. 10: "(w/cm$^3$)" should read --(W/cm$^3$)--.
Sheet 12 of 16, FIG. 15A: "(scm)" should read --(sccm)--.

COLUMN 1

Line 6, "continuation-in-part" should read --continuation--.
Line 14, "devices," should read --device,--.
Line 26, "ing," should read --ing--.

COLUMN 2

Line 19, "strained" should be deleted.
Line 27, "to-provide" should read --to provide--.
Line 38, "*the" should read --the--.

COLUMN 3

Line 17, "-the" should read --the--.

COLUMN 5

Line 59, "the-interface" should read --the interface--.

COLUMN 7

Line 65, "side-is" should read --side is--.

COLUMN 9

Line 2, "Side." should read --side.--.

UNITED STATES PATENT AND TRADEMARK OFFICE
CERTIFICATE OF CORRECTION

PATENT NO. : 5,439,533

DATED : August 8, 1995

INVENTOR(S) : KEISHI SAITO, ET AL.

It is certified that error appears in the above-identified patent and that said Letters Patent is hereby corrected as shown below:

COLUMN 12

Line 13, "bombs" should be deleted.

COLUMN 15

Line 16, "INCl$_3$;" should read --InCl$_3$;--.

COLUMN 16

Line 29, "INCl$_3$;" should read --InCl$_3$;--.

COLUMN 18

Line 52, "$_{50}$ nm to $_{10}$ µm." should read --50 nm to 10 µm.--.
Line 61, "µc-))" should read --µc-)--.

COLUMN 19

Line 16, "Wide" should read --wide--.
Line 20, "atoms" should read --atom--.
Line 21, ".atoms" should read --atoms--.
Line 24, "doping." should read --doping--.
Line 35, "a-portion" should read --a portion--.

COLUMN 20

Line 12, "INCl$_3$;" should read --InCl$_3$;--.
Line 21, "ASH$_3$;" should read --AsH$_3$;--.

UNITED STATES PATENT AND TRADEMARK OFFICE
CERTIFICATE OF CORRECTION

PATENT NO. : 5,439,533
DATED : August 8, 1995
INVENTOR(S) : KEISHI SAITO, ET AL.

It is certified that error appears in the above-identified patent and that said Letters Patent is hereby corrected as shown below:

COLUMN 21

Line 8, "change" should read --charge--.

COLUMN 25

Line 31, ".into" should read --into--.

COLUMN 28

Line 65, ".under" should read --under--.

COLUMN 31

Line 10, "materials" should read --material--.
   Line 37, "materials" should read --material--.

COLUMN 34

Line 23, "result out" should read --resultant--.
   Line 47, "format ion" should read --formation--.

COLUMN 39

Line 1, "14-4" should read --14-5--.

COLUMN 41

Line 5, "was" should read --thereon--.
   Line 6, "thereon" should read --was--.
   Line 11, "at" should be deleted.
   Line 49, "closed;" should read --closed,--.

UNITED STATES PATENT AND TRADEMARK OFFICE
CERTIFICATE OF CORRECTION

PATENT NO. : 5,439,533
DATED : August 8, 1995
INVENTOR(S) : KEISHI SAITO, ET AL.

Page 4 of 9

It is certified that error appears in the above-identified patent and that said Letters Patent is hereby corrected as shown below:

COLUMN 43

Line 29, "in,to" should read --into--.

COLUMN 44

Line 18, "16-4." should read --16-4. ¶ COMPARATIVE EXAMPLE 16-5--.

COLUMN 45

Line 6, "16) and (SC" should read --16 and SC--; and "16-1) to (SC" should read --16-1 to SC--.
Line 18, "16-1) to (SC" should read --16-1 to SC--.

COLUMN 46

Line 19, "16) and (SC" should read --16 and SC--.
Line 20, "16-2) to (SC" should read --16-2 to SC--.
Line 26, "16) and (SC" should read --16 and SC-- and "16-1) to (SC" should read --16-1 to SC--.
Line 33, "16) and (SC" should read --16 and SC-- and "16-1) to (SC" should read --16-1 to SC--.

COLUMN 53

Line 3, "carboncontaining" should read --carbon-containing--.

COLUMN 54

Line 55, "Similar" should read --similar--.
Line 62, "surface Then" should read --surface. Then--.

UNITED STATES PATENT AND TRADEMARK OFFICE
CERTIFICATE OF CORRECTION

PATENT NO. : 5,439,533
DATED : August 8, 1995
INVENTOR(S) : KEISHI SAITO, ET AL.

It is certified that error appears in the above-identified patent and that said Letters Patent is hereby corrected as shown below:

COLUMN 57

Line 47, "gasses" should read --gases--.

COLUMN 65

Line 19, "bad" should read --had--.

COLUMN 68

Line 26, "the-solar" should read --the solar--.
Line 41, "$SiF_4$-gas" should read --$SiF_4$ gas--.

COLUMN 69

Line 67, "will" should read --is--.
Line 68, "be" should be deleted.

COLUMN 70

Line 22, "Tort." should read --Torr.--.
Line 44, "43-1) through (SC" should read --43-1 through SC--.
Line 60, "imparted-to" should read --imparted to--.
Line 65, "$GeH_4$-" should read --$GeH_4$--.

COLUMN 71

Line 45, "be" should be deleted.

UNITED STATES PATENT AND TRADEMARK OFFICE
CERTIFICATE OF CORRECTION

PATENT NO. : 5,439,533
DATED : August 8, 1995
INVENTOR(S) : KEISHI SAITO, ET AL.

It is certified that error appears in the above-identified patent and that said Letters Patent is hereby corrected as shown below:

COLUMN 72

Line 53, "produced" should read --produced and--.
Line 54, "45-X)," should read --45-X).--.

COLUMN 76

Line 26, "t" should read --at--.

COLUMN 77

Line 45, "be" should be deleted.

COLUMN 78

Line 23, "46)" should read --46--.
Line 24, "and (SC" should read --and SC-- and "46-1) through (SC" should read --46-1 through SC--.
Line 35, "tics," should read --tics.--.

COLUMN 82

Line 5, "change" should read --change of--.

COLUMN 85

Line 62, "methods" should read --methods and--.

COLUMN 89

Line 15, ".and" should read --and--.

UNITED STATES PATENT AND TRADEMARK OFFICE
CERTIFICATE OF CORRECTION

PATENT NO. : 5,439,533
DATED : August 8, 1995
INVENTOR(S) : KEISHI SAITO, ET AL.

It is certified that error appears in the above-identified patent and that said Letters Patent is hereby corrected as shown below:

COLUMN 91

TABLE 1, " $PH_3/H_2$ " should read -- $PH_3/H_2$ -- and
"100 PPM" should read --100 ppm--.

TABLE 4, " $PH_3/H_2$ " should read -- $PH_3/H_2$ -- ;
"0.51" should read --0.5-- and
"100 PPM" should read --100 ppm--.

TABLE 5, "SC EX." should read --SC EX. 13--.

COLUMN 93

TABLE 5-continued, "100 PPM" should read --100 ppm--.
TABLE 6, "100 PPM" should read --100 ppm--.
TABLE 7, "100 PPM" should read --100 ppm--.

COLUMNS 101-102

TABLE 20,

"2ND p-
TYPE
LAYER
B        10   2   500        10        0.40   200   0.02   10
2560
A                    500         0.30   200   0.02     "

should read    [cont. on next page]

UNITED STATES PATENT AND TRADEMARK OFFICE
CERTIFICATE OF CORRECTION

PATENT NO. : 5,439,533
DATED : August 8, 1995
INVENTOR(S) : KEISHI SAITO, ET AL.

It is certified that error appears in the above-identified patent and that said Letters Patent is hereby corrected as shown below:

COLUMNS 101-102 [cont. from previous page]

TABLE 20,

--2ND p-TYPE LAYER

| | | | | | | | | |
|---|---|---|---|---|---|---|---|---|
| B | 10 | 2 | 500 | 10 | 0.40 | 200 | 0.02 | |
| A | | | 500 | | 0.30 | 200 | 0.02 | 10 --.

COLUMN 103

Line 61, "contains" should read --contain(s)--.

COLUMN 104

Line 32, "a" should read --an--.
Line 50, "tains" should read --tain(s)--.

COLUMN 105

Line 5, "tains" should read --tain(s)--.
Line 32, "a" should read --an--.

COLUMN 106

Line 21, "contains" should read --contain(s)--.
Line 38, "p" should read --p-type--.
Line 49, "contains" should read --contain(s)--.

UNITED STATES PATENT AND TRADEMARK OFFICE
CERTIFICATE OF CORRECTION

PATENT NO. : 5,439,533
DATED : August 8, 1995
INVENTOR(S) : KEISHI SAITO, ET AL.

It is certified that error appears in the above-identified patent and that said Letters Patent is hereby corrected as shown below:

COLUMN 108

Line 5, "generating" should read --generating system--.
Line 25, "contains" should read --contain(s)--.

Signed and Sealed this

Fourteenth Day of May, 1996

Attest:

BRUCE LEHMAN

Attesting Officer    Commissioner of Patents and Trademarks